(12) United States Patent
Han et al.

(10) Patent No.: US 9,882,140 B2
(45) Date of Patent: Jan. 30, 2018

(54) ORGANIC LIGHT-EMITTING DEVICE

(71) Applicant: SAMSUNG DISPLAY CO., LTD., Yongin, Gyeonggi-Do (KR)

(72) Inventors: Kyul Han, Yongin (KR); Jimyoung Ye, Yongin (KR); Bumsuk Lee, Yongin (KR); Jihwan Yoon, Yongin (KR); Sangwoo Pyo, Yongin (KR)

(73) Assignee: Samsung Display Co., Ltd., Yongin, Gyeonggi-do (KR)

( * ) Notice: Subject to any disclaimer, the term of this patent is extended or adjusted under 35 U.S.C. 154(b) by 274 days.

(21) Appl. No.: 14/710,729

(22) Filed: May 13, 2015

(65) Prior Publication Data

US 2016/0155942 A1  Jun. 2, 2016

(30) Foreign Application Priority Data

Dec. 2, 2014  (KR) .................. 10-2014-0170823

(51) Int. Cl.
*H01L 51/00* (2006.01)
*C09K 11/06* (2006.01)
*H01L 51/50* (2006.01)

(52) U.S. Cl.
CPC .......... *H01L 51/0058* (2013.01); *C09K 11/06* (2013.01); *H01L 51/006* (2013.01);
(Continued)

(58) Field of Classification Search
CPC .................. H01L 51/0059; H01L 51/0052
See application file for complete search history.

(56) References Cited

U.S. PATENT DOCUMENTS 6,130,001 A    10/2000  Shi et al.
6,614,175 B2    9/2003  Aziz et al.
(Continued)

FOREIGN PATENT DOCUMENTS

EP    2 674 418 A1    12/2013
JP    2001-052870      2/2001
(Continued)

OTHER PUBLICATIONS

Anna B. Chwang et al., Graded mixed-layer organic light-emitting devices, Applied Physics Letters, vol. 80, No. 5, Feb. 4, 2002, pp. 725-727.

*Primary Examiner* — Kara Boyle
*Assistant Examiner* — Christina Wales
(74) *Attorney, Agent, or Firm* — Lee & Morse, P.C.

(57) ABSTRACT

Provided is an organic light-emitting device including a first electrode; a second electrode facing the first electrode; and an organic layer between the first electrode and the second electrode, the organic layer including an emission layer. The emission layer includes a first compound represented by Formula 1-1 or Formula 1-2 below, a second compound represented by Formula 2 below, and a third compound represented by Formula 3 below:

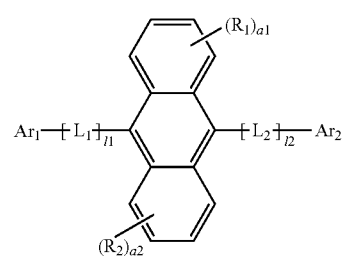

<Formula 1-1>

<Formula 1-2>

<Formula 2-1>

(Continued)

-continued

<Formula 3>

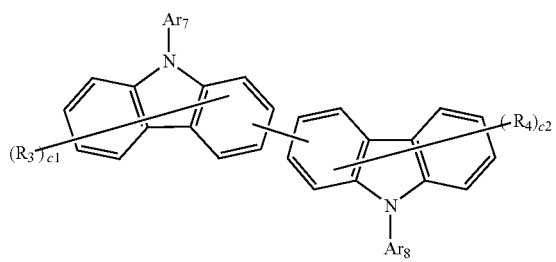

where Ar1 to Ar8, R1 to R3, A, L1, L2, a1, a2, b1, b2, c1, c2, l1, and l2 are as defined in the specification.

20 Claims, 1 Drawing Sheet

(52) U.S. Cl.
CPC ...... *H01L 51/0054* (2013.01); *H01L 51/0055* (2013.01); *H01L 51/0056* (2013.01); *H01L 51/0061* (2013.01); *H01L 51/0079* (2013.01); *H01L 51/0081* (2013.01); *H01L 51/5012* (2013.01); *H01L 51/5056* (2013.01); *H01L 51/5072* (2013.01)

(56) References Cited

U.S. PATENT DOCUMENTS

| | | | |
|---|---|---|---|
| 7,755,274 | B2 | 7/2010 | Tadokoro et al. |
| 2004/0137270 | A1* | 7/2004 | Seo .............. C09K 11/06 428/690 |
| 2006/0003184 | A1 | 1/2006 | Hatwar et al. |
| 2006/0051613 | A1 | 3/2006 | Tomita et al. |
| 2006/0093856 | A1 | 5/2006 | Helber et al. |
| 2008/0124572 | A1 | 5/2008 | Mizuki et al. |
| 2012/0138912 | A1 | 6/2012 | Inoue et al. |
| 2012/0223295 | A1* | 9/2012 | Inoue .............. C09K 11/06 257/40 |
| 2013/0234118 | A1* | 9/2013 | Kwon ............ H01L 51/006 257/40 |
| 2015/0318510 | A1* | 11/2015 | Ito ............... H01L 51/5072 257/40 |

FOREIGN PATENT DOCUMENTS

| | | |
|---|---|---|
| JP | 2013-107853 | 6/2013 |
| JP | 2014-40423 | 3/2014 |
| KR | 10-2007-0033390 | 3/2007 |
| KR | 10-2012-0135325 | 12/2012 |
| KR | 10-2013-0131793 A | 12/2013 |
| KR | 10-2014-0000259 | 1/2014 |
| WO | WO-2004/074399 A1 | 9/2004 |
| WO | WO-2013/146117 A1 | 10/2013 |

\* cited by examiner

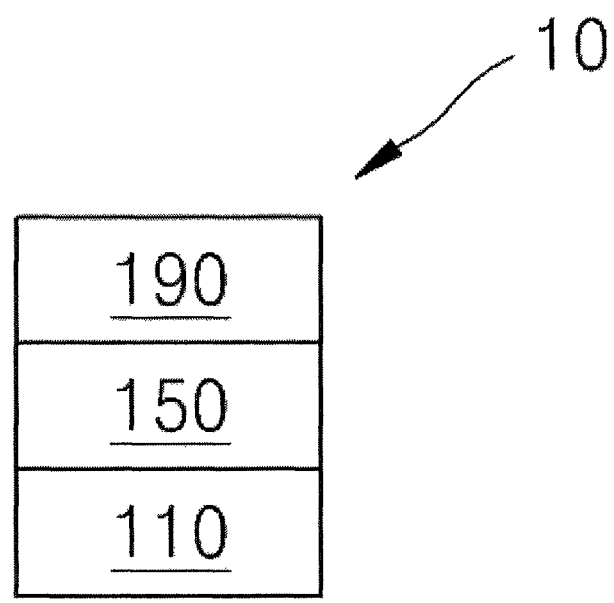

ORGANIC LIGHT-EMITTING DEVICE

CROSS-REFERENCE TO RELATED APPLICATION

Korean Patent Application No. 10-2014-0170823, filed on Dec. 2, 2014, in the Korean Intellectual Property Office, and entitled: "Organic Light-Emitting Device," is incorporated by reference herein in its entirety.

BACKGROUND

1. Field

Embodiments relate to an organic light-emitting device.

2. Description of the Related Art

Organic light emitting devices are self-emission devices that have wide viewing angles, high contrast ratios, short response times, and excellent luminance, driving voltage, and response speed characteristics, and produce full-color images.

The organic light-emitting device may include an anode, and a hole transport region, an emission layer, an electron transport region, and a cathode, which are sequentially disposed. Holes provided from the anode may move toward the emission layer through the hole transport region, and electrons provided from the cathode may move toward the emission layer through the electron transport region. Carriers, such as holes and electrons, are recombined in the emission layer to produce excitons. The excitors change from an excited state to a ground state, generating light.

SUMMARY

Embodiments are directed to an organic light-emitting device that includes a first electrode, a second electrode facing the first electrode, and an organic layer between the first electrode and the second electrode, the organic layer including an emission layer. The emission layer includes a first compound represented by Formula 1-1 or Formula 1-2 below, a second compound represented by Formula 2, and a third compound represented by Formula 3.

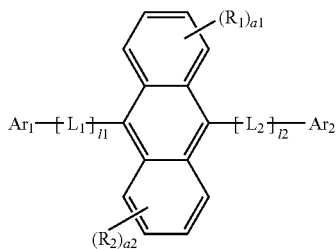

<Formula 1-1>

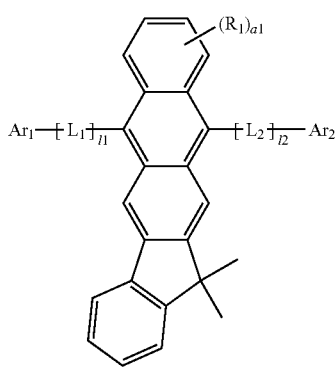

<Formula 1-2>

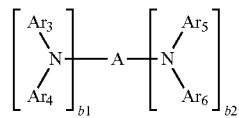

<Formula 2-1>

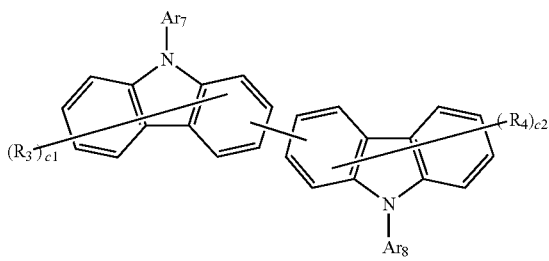

<Formula 3>

In the formulae above, $L_1$ and $L_2$ are each independently selected from a substituted or unsubstituted $C_6$-$C_{40}$ arylene group, A is a substituted or unsubstituted $C_6$-$C_{40}$ arylene group, a substituted or unsubstituted divalent $C_6$-$C_{40}$ non-aromatic hetero condensed polycyclic group, or a combination of these groups and a styrylene group, $Ar_1$ to $Ar_8$ may be each independently a substituted or unsubstituted $C_6$-$C_{40}$ aryl group, $R_1$ to $R_4$ may be each independently selected from a deuterium atom, a halogen atom, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a substituted or unsubstituted $C_1$-$C_{20}$ alkyl group, a substituted or unsubstituted $C_2$-$C_{20}$ alkenyl group, a substituted or unsubstituted $C_2$-$C_{20}$ alkynyl group, a substituted or unsubstituted $C_1$-$C_{20}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{40}$ aryl group, a substituted or unsubstituted $C_1$-$C_{40}$ heteroaryl group, a substituted or unsubstituted $C_5$-$C_{40}$ aryloxy group, a substituted or unsubstituted $C_5$-$C_{40}$ arylthio group, a substituted or unsubstituted monovalent $C_6$-$C_{40}$ non-aromatic condensed polycyclic group(non-aromatic condensed polycyclic group), a substituted or unsubstituted monovalent $C_6$-$C_{40}$ non-aromatic hetero condensed polycyclic group(non-aromatic hetero condensed polycyclic group), —N($Q_1$)($Q_2$), —P(=O)($Q_3$)($Q_4$), —Si($Q_5$)($Q_6$)($Q_7$), —Ge($Q_5$)($Q_6$)($Q_7$), and —B($Q_8$)($Q_9$)($Q_1$ to $Q_9$ are each independently a hydrogen atom, a $C_1$-$C_{20}$ alkyl group, or a $C_6$-$C_{40}$ aryl group);

at least one of substituents of the substituted $C_1$-$C_{20}$ alkyl group, substituted $C_2$-$C_{20}$ alkenyl group, substituted $C_2$-$C_{20}$ alkynyl group, substituted $C_1$-$C_{20}$ alkoxy group, substituted $C_3$-$C_{10}$ cycloalkyl group, substituted $C_1$-$C_{10}$ heterocycloalkyl group, substituted $C_3$-$C_{10}$ cycloalkenyl group, substituted $C_1$-$C_{10}$ heterocycloalkenyl group, substituted $C_6$-$C_{40}$ aryl group, substituted $C_1$-$C_{40}$ heteroaryl group, substituted $C_5$-$C_{40}$ aryloxy group, substituted $C_5$-$C_{40}$ arylthio group, substituted monovalent $C_6$-$C_{40}$ non-aromatic condensed polycyclic group, substituted monovalent $C_6$-$C_{40}$ non-aromatic hetero condensed polycyclic group, and substituted $C_6$-$C_{40}$ arylene group may be selected from:

a deuterium atom, a halogen atom, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_2$-$C_{20}$ alkenyl group, a $C_2$-$C_{20}$ alkynyl group, a $C_1$-$C_{20}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{40}$ aryl group, a $C_1$-$C_{40}$ heteroaryl group, a $C_5$-$C_{40}$ aryloxy group, a $C_5$-$C_{40}$ arylthio group, monovalent $C_6$-$C_{40}$ non-aromatic condensed polycyclic group, monovalent $C_6$-$C_{40}$ non-aromatic hetero condensed polycyclic group, —N$(Q_{11})(Q_{12})$, —Si$(Q_{13})(Q_{14})$$(Q_{15})$, —Ge$(Q_{13})(Q_{14})(Q_{15})$, and B$(Q_{16})(Q_{17})$ ($Q_{11}$ to $Q_{17}$ are each independently selected from a hydrogen atom, a $C_1$-$C_{20}$ alkyl group, and a $C_6$-$C_{40}$ aryl group), a1 and a2 are each independently an integer from 0 to 4;
b1 and b2 are each independently 1 or 2;
c1 and c2 are each independently an integer from 0 to 7; and
l1 and l2 are each independently an integer from 0 to 3.

BRIEF DESCRIPTION OF THE DRAWING

Features will become apparent to those of skill in the art by describing in detail exemplary embodiments with reference to the attached drawing in which:

FIG. 1 illustrates a schematic cross-sectional view of an organic light-emitting device according to an embodiment.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing FIGURES, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "between" two layers, it can be the only layer between the two layers, or one or more intervening layers may also be present. Like reference numerals refer to like elements throughout.

FIG. 1 illustrates a schematic cross-sectional view of an organic light-emitting device 10 according to an embodiment.

Referring to FIG. 1, the organic light-emitting device 10 includes a first electrode 110, an organic layer 150, and a second electrode 190.

A substrate may be additionally disposed under the first electrode 110 or above the second electrode 190. The substrate may be a substrate with excellent mechanical strength, thermal stability, transparency, surface smoothness, ease of handling, and waterproofness. For example, the substrate may be a glass substrate or a transparent plastic substrate.

The first electrode 110 may be formed by depositing or sputtering a material for forming the first electrode on the substrate. When the first electrode 110 is an anode, the material for the first electrode 110 may be selected from materials with a high work function such that holes be easily injected. The first electrode 110 may be a reflective electrode or a transmissive electrode. The material for the first electrode 110 may be a transparent and highly conductive material. Examples of such a material include indium tin oxide (ITO), indium zinc oxide (IZO), tin oxide (SnO$_2$), and zinc oxide (ZnO). When the first electrode 110 is a semi-transmissive electrode or a reflective electrode, at least one of magnesium (Mg), aluminum(Al), aluminum-lithium (Al—Li), calcium (Ca), magnesium-indium(Mg—In), magnesium-silver (Mg—Ag) may be used as a material for forming the first electrode 110, as examples. The first electrode 110 may have a single-layer structure, or a multi-layer structure including two or more layers. For example, the first electrode 110 may have a three-layered structure of ITO/Ag/ITO.

An organic layer 150 may be disposed on the first electrode 110. The organic layer 150 may include an emission layer. The organic layer 150 may include a hole transport region disposed between the first electrode 110 and the emission layer and an electron transport region disposed between the emission layer and the second electrode 190.

The hole transport region may include at least one selected from a hole injection layer (HIL), a hole transport layer (HTL), a buffer layer, and an electron blocking layer (EBL). The electron transport region may include at least one selected from a hole blocking layer (HBL), an electron transport layer (ETL), and an electron injection layer (EIL).

The hole transport region may have a single-layered structure formed of a single material, a single-layered structure formed of a plurality of different materials, or a multi-layered structure having a plurality of layers formed of a plurality of different materials.

For example, the hole transport region may have a single-layered structure formed of a plurality of different materials, or a structure of hole injection layer/hole transport layer, a structure of hole injection layer/hole transport layer/buffer layer, a structure of hole injection layer/buffer layer, a structure of hole transport layer/buffer layer, a structure of hole injection layer/hole transport layer/electron blocking layer, or a structure of a hole transport layer/electron blocking layer, wherein layers of each structure are sequentially stacked from the first electrode 110 in this stated order.

When the hole transport region includes a hole injection layer, the hole injection layer may be formed on the first electrode 110 by a suitable method, such as vacuum deposition, spin coating casting, a Langmuir-Blodgett (LB) method, ink-jet printing, laser-printing, or laser-induced thermal imaging.

When a hole injection layer is formed by vacuum deposition, for example, the vacuum deposition may be performed at a deposition temperature of about 100 to about 500° C., at a vacuum degree of about $10^{-8}$ to about $10^{-3}$ torr, and at a deposition rate of about 0.01 to about 100 Å/sec in consideration of a compound for a hole injection layer to be deposited, and the structure of a hole injection layer to be formed.

When a hole injection layer is formed by spin coating, the spin coating may be performed at a coating rate of about 2,000 rpm to about 5,000 rpm, and at a temperature of about 80° C. to 200° C. in consideration of a compound for a hole injection layer to be deposited, and the structure of a hole injection layer to be formed.

When the hole transport region includes a hole transport layer, the hole transport layer may be formed on either the first electrode 130 or the hole injection layer by using a suitable method, such as vacuum deposition, spin coating, casting, a LB method, ink-jet printing, laser-printing, or laser-induced thermal imaging. When the hole transport layer is formed by vacuum deposition or spin coating, deposition and coating conditions for the hole transport layer may be the same as the deposition and coating conditions for the hole injection layer.

The hole transport region may include at least one selected from 4,4',4"-tris(N-3-methylphenyl-N-phenylamino)triphenylamine (m-MTDATA), 4,4',4"-tris(N,N-diphenyl-amino)triphenylamine (TDATA), 4,4',4"-tris[2-naphthyl(phenyl)amino]triphenylamine(2-TNATA), N,N'-bis(naphthalen-1-yl)-N,N'-bis(phenyl)-benzidine (NPB), N,N'-bis(naphthalen-2-yl)-N,N'-bis(phenyl)-benzidine (β-NPB), N,N'-bis(naphthalen-1-yl)-N,N'-bis(phenyl)-2,2'-dimethylbenzidine (α-NPD), N,N'-bis(3-methylphenyl)-N,N'-bis(phenyl)-benzidine (TPD), Spiro-TPD, Spiro-NPB, di-[4-(N,N-ditolyl-amino)-phenyl]cyclohexane (TAPC), N,N,N',N'-tetrakis(3-methylphenyl)-3,3'-dimethylbenzidine (HMTPD), 4,4',4"-tris(N-carbazolyl)triphenylamine (TCTA), polyaniline/dodecylbenzenesulfonic acid (Pani/DBSA), poly(3,4-ethylenedioxythiophene)/poly(4-styrenesulfonate) (PEDOT/PSS), polyaniline/camphor sulfonic acid (Pani/CSA), (polyaniline)/poly(4-styrenesulfonate) (PANI/PSS), a compound represented by Formula 201, and a compound represented by Formula 202:

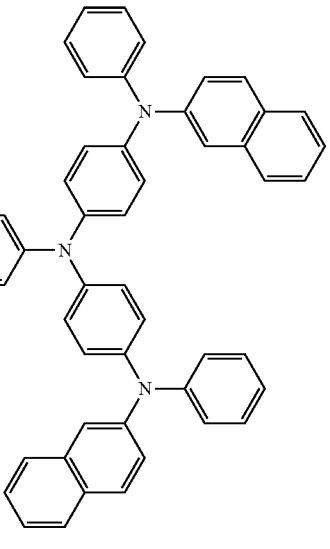

2T-NATA

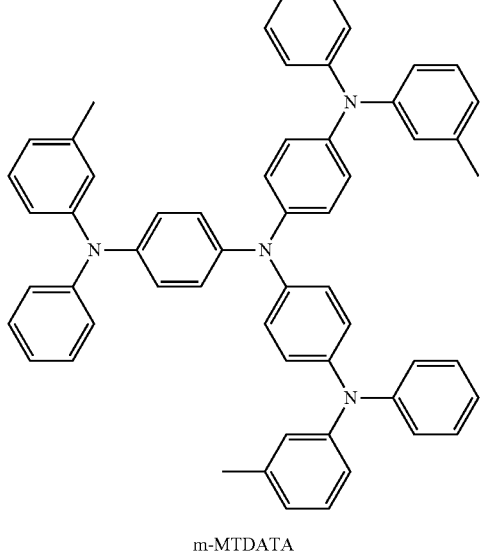

m-MTDATA

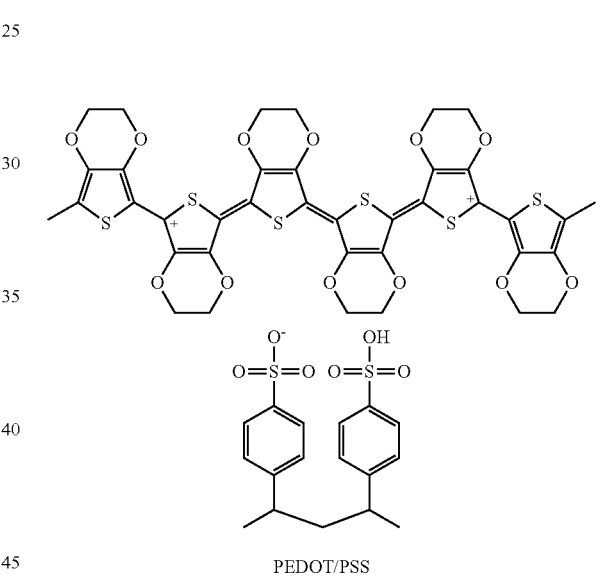

PEDOT/PSS

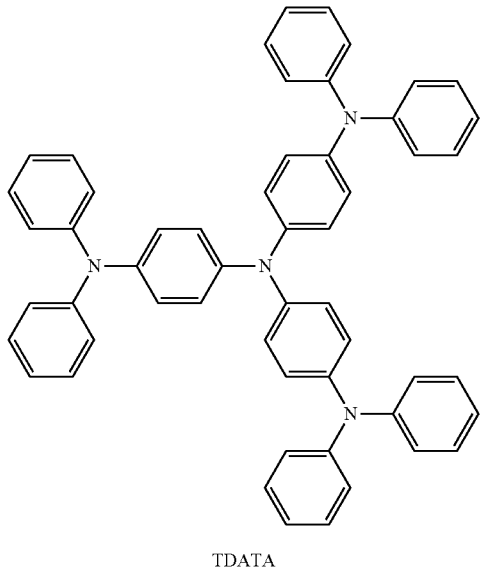

TDATA

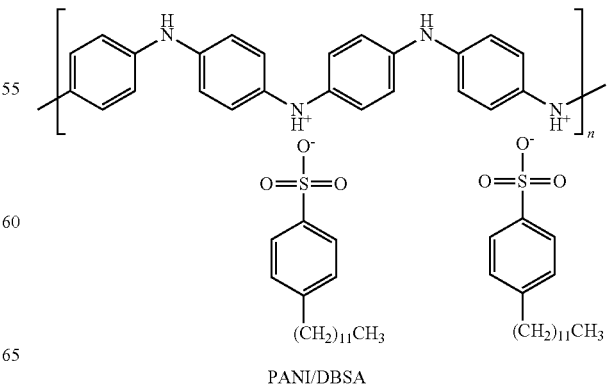

PANI/DBSA

-continued
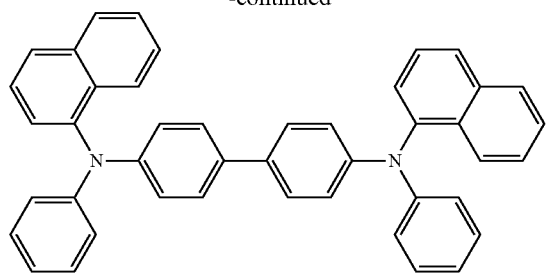
NPB
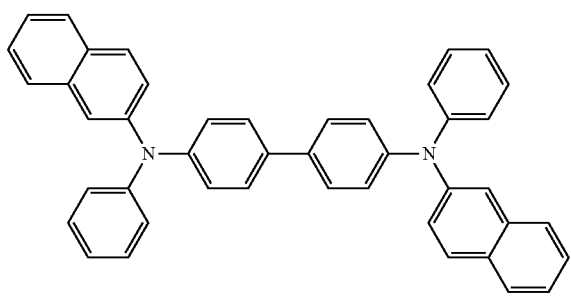
β-NPB
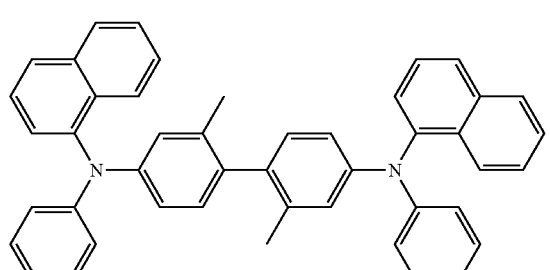
α-NPD
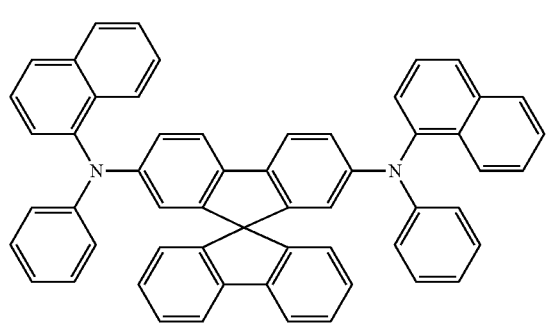
spiro-NPB
TPD
-continued
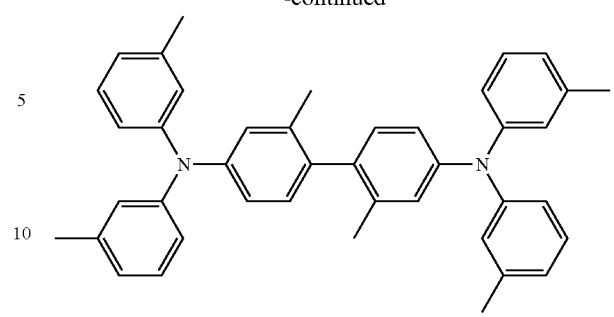
HMTPD
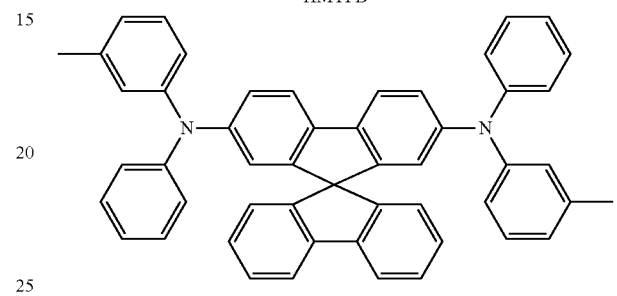
spiro-TPD
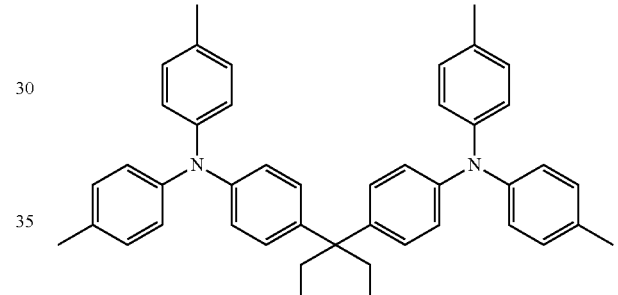
TAPC
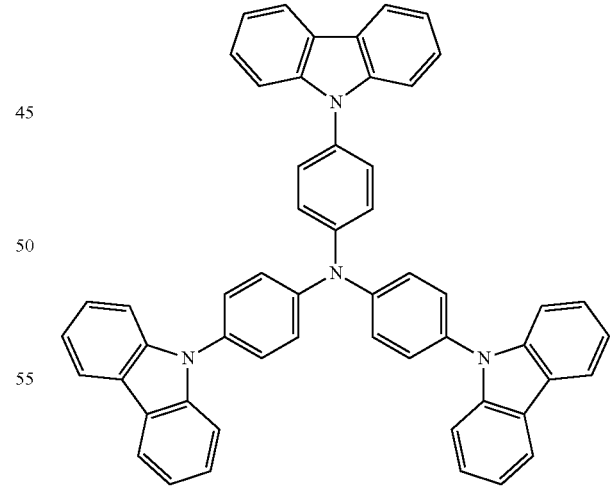
TCTA
<Formula 201>
$R_{201}-(L_{201})_{xa1}-N\begin{matrix}(L_{202})_{xa2}-R_{202}\\(L_{203})_{xa3}-R_{203}\end{matrix}$

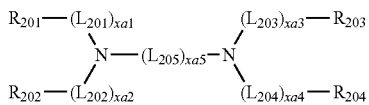

<Formula 202>

In Formulae 201 and 202, $L_{201}$ to $L_{205}$ may be each independently selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, at least one substituent of the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic condensed polycyclic group, and the substituted divalent non-aromatic condensed heteropolycyclic group may be selected from:

a deuterium atom, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from a deuterium atom, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{201}$)($Q_{202}$), —Si($Q_{203}$)($Q_{204}$)($Q_{205}$), and —B($Q_{206}$)($Q_{207}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group, each substituted with at least one selected from a deuterium atom. —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{211}$)($Q_{212}$), —Si($Q_{213}$)($Q_{214}$)($Q_{215}$), and —B($Q_{216}$)($Q_{217}$); and —N($Q_{221}$)($Q_{222}$), —Si($Q_{223}$)($Q_{224}$)($Q_{225}$), and —B($Q_{226}$)($Q_{227}$);

xa1 to xa4 may be each independently selected from 0, 1, 2, and 3;

xa5 may be selected from 1, 2, 3, 4, and 5; and $R_{201}$ to $R_{205}$ may each independently be selected from a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_6$ alkoxy group, each substituted with at least one selected from a deuterium atom, —F, —Cl, —Br, —I, a hydroxyl group, a cyano group, a nitro group, an amino group, an amidino group, a hydrazine group, a hydrazone group, a carboxylic acid or a salt thereof a sulfonic acid or a salt thereof, a phosphoric acid or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{231}$)($Q_{232}$), —Si($Q_{233}$)($Q_{234}$)($Q_{235}$), and —B($Q_{236}$)($Q_{237}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group; and a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from a deuterium atom, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{241}$)($Q_{242}$), —Si($Q_{243}$)($Q_{244}$)($Q_{245}$), and —B($Q_{246}$)($Q_{247}$); and $Q_{201}$ to $Q_{207}$, $Q_{211}$ to $Q_{217}$, $Q_{221}$ to $Q_{227}$, $Q_{231}$ to $Q_{237}$, and $Q_{241}$ to $Q_{247}$ may be each independently selected from a hydrogen atom, a deuterium atom. —F. —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from a deuterium atom, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group; and a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from a deuterium atom, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group.

In some embodiments, in Formulae 201 and 202, $L_{201}$ to $L_{205}$ may be each independently selected from a phenylene group, a naphthylene group, a fluorenylene group, a spiro-fluorenylene group, a benzofluorenylene group, a dibenzofluorenylene group, a phenanthrenylene group, anthrylene group, a pyrenylene group, a chrysenylene group, a pyridinylene group, a pyrazinylene group, a pyrimidinylene group, a pyridazinylene group, a quinolinylene group, an isoquinolinylene group, a quinoxalinylene group, a quinazolinylene group, a carbazolylene group, and a triazinylene group; and a phenylene group, a naphthylene group, a fluorenylene group, a spiro-fluorenylene group, a benzofluorenylene group, a dibenzofluorenylene group, a phenanthrenylene group, an anthrylene group, a pyrenylene group, a chrysenylene group, a pyridinylene group, a pyrazinylene group, a pyrimidinylene group, a pyridazinylene group, a quinolinylene group, an isoquinolinylene group, a quinoxalinylene group, a quinazolinylene group, a carbazolylene group, and a triazinylene group, each substituted with at least one selected from a deuterium atom, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthryl group, a pyrenyl group, a chrysenyl group, a pyridyl group, a pyrazinyl group, a pyrimidinyl group, a pyridazinyl group, an isoindolyl group, a quinolyl group, an isoquinolyl group, a quinoxalinyl group, a quinazolinyl group, a carbazolyl group, and a triazinyl group;

xa1 to xa4 may be each independently 0, 1, or 2; and xa5 may be 1, 2, or 3;

$R_{201}$ to $R_{205}$ may be each independently selected from a phenyl group, a naphthyl group, a fluorenyl group, a spiro-fluorenyl group, a benzofluorenyl group, a dibenzofluorenyl group, a phenanthrenyl group, an anthryl group, a pyrenyl group, a chrysenyl group, a pyridyl group, a pyrazinyl group, a pyrimidinyl group, a pyridazinyl group, a quinolyl group, an isoquinolyl group, a quinoxalinyl group, a quinazolinyl group, a carbazolyl group, and a triazinyl group; and a phenyl group, a naphthyl group, a fluorenyl group, a spiro-fluorenyl group, a benzofluorenyl group, a dibenzofluorenyl group, a phenanthrenyl group, an anthryl group, a pyrenyl group, a chrysenyl group, a pyridyl group, a pyrazinyl group, a pyrimidinyl group, a pyridazinyl group, a quinolyl group, an isoquinolyl group, a quinoxalinyl group, a quinazolinyl group, a carbazolyl group, and a triazinyl group, each substituted with at least one selected from a deuterium atom, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, an azulenyl group, a fluorenyl group, a spiro-fluorenyl group, a benzofluorenyl group, a dibenzofluorenyl group, a phenanthrenyl group, an anthryl group, a pyrenyl group, a chrysenyl group, a pyridyl group, a pyrazinyl group, a pyrimidinyl group, a pyridazinyl group, a quinolyl group, an isoquinolyl group, a quinoxalinyl group, a quinazolinyl group, a carbazolyl group, and a triazinyl group.

The compound represented by Formula 201 may be represented by Formula 201A below:

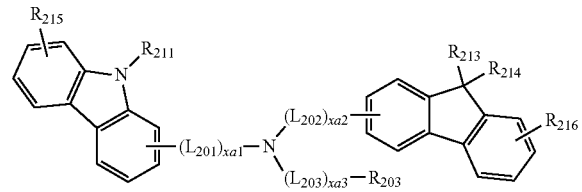

<Formula 201A>

For example, the compound represented by Formula 201 may be represented by Formula 201A-1 below:

<Formula 201A-1>

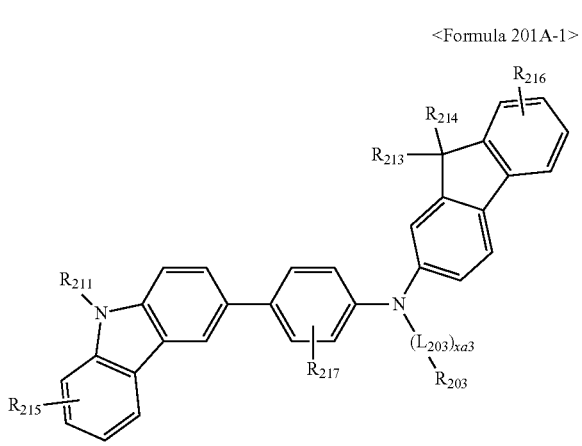

For example, the compound represented by Formula 202 may be represented by Formula 202A below:

<Formula 202A>

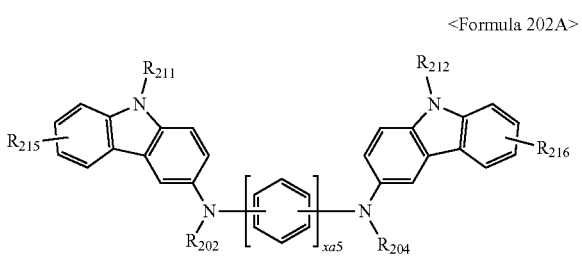

Descriptions of $L_{201}$ to $L_{203}$, xa1 to xa3, xa5, and $R_{202}$ to $R_{204}$ in Formulae 201A, 201A-1, and 202A are the same as described above, and descriptions of $R_{211}$ and $R_{212}$ are the same as the description of $R_{203}$, $R_{213}$ to $R_{217}$ may be each independently selected from a hydrogen atom, a deuterium atom, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group.

In some embodiments. $L_{201}$ to $L_{203}$ in Formulae 201A, 201A-1, and 202A may be each independently selected from a phenylene group, a naphthylene group, a fluorenylene group, a spiro-fluorenylene group, a benzofluorenylene group, a dibenzofluorenylene group, a phenanthrenylene group, anthrylene group, a pyrenylene group, a chrysenylene group, a pyridinylene group, a pyrazinylene group, a pyrimidinylene group, a pyridazinylene group, a quinolinylene group, an isoquinolinylene group, a quinoxalinylene group, a quinazolinylene group, a carbazolylene group, and a triazinylene group; and a phenylene group, a naphthylene group, a fluorenylene group, a spiro-fluorenylene group, a benzofluorenylene group, a benzofluorenylene group, a phenanthrenylene group, an anthrylene group, a pyrenylene group, a chryse-nylene group, a pyridinylene group, a pyrazinylene group, a pyrimidinylene group, a pyridazinylene group, a quinolinylene group, an isoquinolinylene group, a quinoxalinylene group, a quinazolinylene group, a carbazolylene group and a triazinylene group, each substituted with at least one selected from a deuterium atom, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthryl group, a pyrenyl group, a chrysenyl group, a pyridyl group, a pyrazinyl group, a pyrimidinyl group, a pyridazinyl group, a quinolyl group, an isoquinolyl group, a quinoxalinyl group, a quinazolinyl group, a carbazolyl group, and a triazinyl group;

xa1 to xa3 may be each independently 0 or 1;

$R_{203}$, $R_{211}$, and $R_{212}$ may be each independently selected from a phenyl group, a naphthyl group, a fluorenyl group, a spino-fluorenyl group, a benzofluorenyl group, a dibenzofluorenyl group, a phenanthrenyl group, an anthryl group, a pyrenyl group, a chrysenyl group, a pyridyl group, a pyrazinyl group, a pyrimidinyl group, a pyridazinyl group, a quinolyl group, an isoquinolyl group, a quinoxalinyl group, a quinazolinyl group, a carbazolyl group, and a triazinyl group; and a phenyl group, a naphthyl group, a fluorenyl group, a spiro-fluorenyl group, a benzofluorenyl group, a dibenzofluorenyl group, a phenanthrenyl group, an anthryl group, a pyrenyl group, a chrysenyl group, a pyridyl group, a pyrazinyl group, a pyrimidinyl group, a pyridazinyl group, a quinolyl group, an isoquinolyl group, a quinoxalinyl group, a quinazolinyl group, a carbazolyl group, and a triazinyl group, each substituted with at least one selected from a deuterium atom, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthryl group, a pyrenyl group, a chrysenyl group, a pyridyl group, a pyrazinyl group, a pyrimidinyl group, a pyridazinyl group, a quinolyl group, an isoquinolyl group, a quinoxalinyl group, a quinazolinyl group, a carbazolyl group, and a triazinyl group;

$R_{213}$ and $R_{214}$ may be each independently selected from a $C_1$-$C_{20}$ alkyl group and a $C_1$-$C_{20}$ alkoxy group;

a $C_1$-$C_{20}$ alkyl group and a $C_1$-$C_{20}$ alkoxy group, each substituted with at least one selected from a deuterium atom, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a phenyl group, a naphthyl group, a fluorenyl group, a spiro-fluorenyl group, a benzofluorenyl group, a dibenzofluorenyl group, a phenanthrenyl group, an anthryl group, a pyrenyl group, a chrysenyl group, a pyridyl group, a pyrazinyl group, a pyrimidinyl group, a pyridazinyl group, a quinolyl group, an isoquinolyl group, a quinoxalinyl group, a quinazolinyl group, a carbazolyl group, and a triazinyl group;

a phenyl group, a naphthyl group, a fluorenyl group, a spiro-fluorenyl group, a benzofluorenyl group, a dibenzofluorenyl group, a phenanthrenyl group, an anthryl group, a pyrenyl group, a chrysenyl group, a pyridyl group, a pyrazinyl group, a pyrimidinyl group, a pyridazinyl group, a quinolyl group, an isoquinolyl group, a quinoxalinyl group, a quinazolinyl group, a carbazolyl group, and a triazinyl group; and a phenyl group, a naphthyl group, a fluorenyl group, a spiro-fluorenyl group, a benzofluorenyl group, a dibenzofluorenyl group, a phenanthrenyl group, an anthryl group, a pyrenyl group, a chrysenyl group, a pyridyl group, a pyrazinyl group, a pyrimidinyl group, a pyridazinyl group, a quinolyl group, an isoquinolyl group, a quinoxalinyl group, a quinazolinyl group, a carbazolyl group, and a triazinyl group, each substituted with at least one selected from a deuterium atom, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthryl group, a pyrenyl group, a chrysenyl group, a pyridyl group, a pyrazinyl group, a pyrimidinyl group, a pyridazinyl group, a quinolyl group, an isoquinolyl group, a quinoxalinyl group, a quinazolinyl group, a carbazolyl group, and a triazinyl group;

$R_{215}$ and $R_{217}$ may be each independently selected from a hydrogen atom, a deuterium atom, —F, —Br, —I, a hydroxyl group, a cyano group, a nitro group, an amino group, an amidino group, a hydrazine group, a hydrazone group, a carboxylic acid or a salt thereof, a sulfonic acid or a salt thereof, and a phosphoric acid or a salt thereof, a $C_1$-$C_{20}$ alkyl group and a $C_1$-$C_{20}$ alkoxy group;

a $C_1$-$C_{20}$ alkyl group and a $C_1$-$C_{20}$ alkoxy group, each substituted with at least one selected from a deuterium atom, —F, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a phenyl group, a naphthyl group, a fluorenyl group, a Spiro-fluorenyl group, a benzofluorenyl group, a dibenzofluorenyl group, a phenanthrenyl group, an anthryl group, a pyrenyl group, a chrysenyl group, a pyridyl group, a pyrazinyl group, a pyrimidinyl group, a pyridazinyl group, a quinolyl group, an isoquinolyl group, a quinoxalinyl group, a quinazolinyl group, a carbazolyl group, and a triazinyl group;

a phenyl group, a naphthyl group, a fluorenyl group, a spiro-fluorenyl group, a benzofluorenyl group, a dibenzofluorenyl group, a phenanthrenyl group, an anthryl group, a pyrenyl group, a chrysenyl group, a pyridyl group, a pyrazinyl group, a pyrimidinyl group, a pyridazinyl group, a quinolyl group, an isoquinolyl group, a quinoxalinyl group, a quinazolinyl group, and a triazinyl group; and a phenyl group, a naphthyl group, a fluorenyl group, a spiro-fluorenyl group, a benzofluorenyl group, a dibenzofluorenyl group, a phenanthrenyl group, an anthryl group, a pyrenyl group, a chrysenyl group, a pyridyl group, a pyrazinyl group, a pyrimidinyl group, a pyridazinyl group, a quinolyl group, an isoquinolyl group, a quinoxalinyl group, a quinazolinyl group, a carbazolyl group, and a triazinyl group, each substituted with at least one selected from a deuterium atom, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthryl group, a pyrenyl group, a chrysenyl group, a pyridyl group, a pyrazinyl group, a pyrimidinyl group, a pyridazinyl group, a quinolyl group, an isoquinolyl group, a quinoxalinyl group, a quinazolinyl group, and a triazinyl group; and xa5 is 1 or 2.

$R_{213}$ and $R_{214}$ in Formulae 201A, and 201A-1 may bind to each other to form a saturated or unsaturated ring.

The compound represented by Formula 201, and the compound represented by Formula 202 may each include compounds HT1 to HT20 illustrated below.

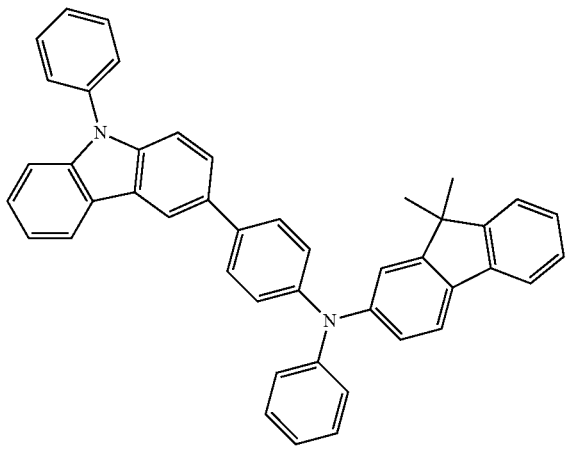

HT1

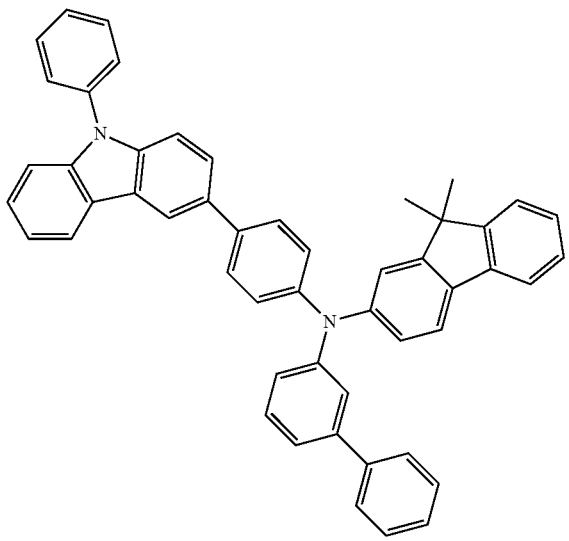

HT2

-continued
HT3
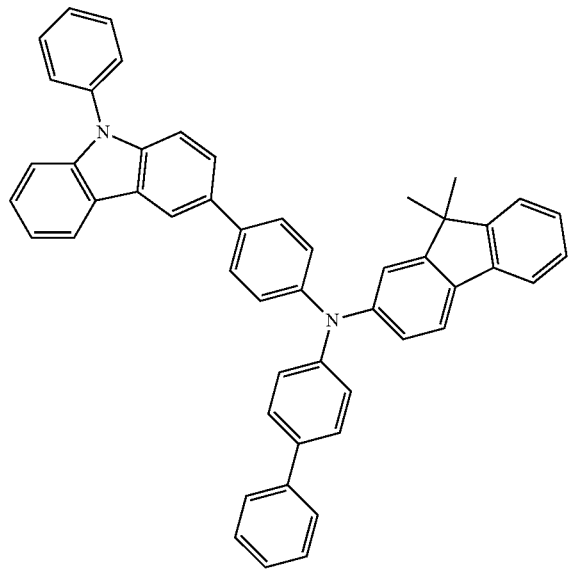
HT5
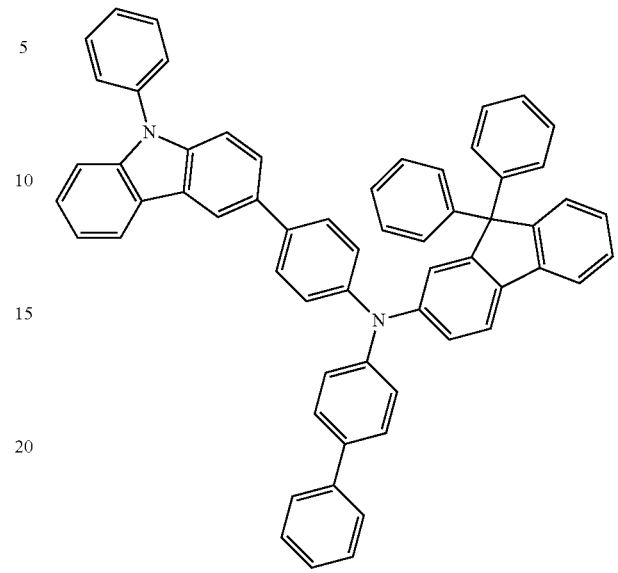
HT4
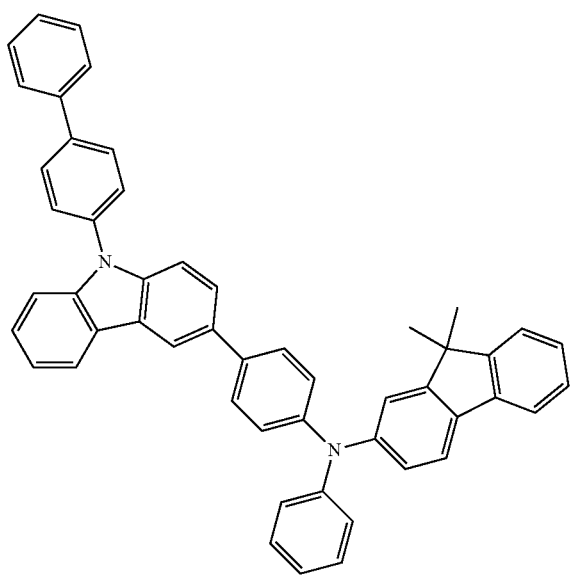
HT6
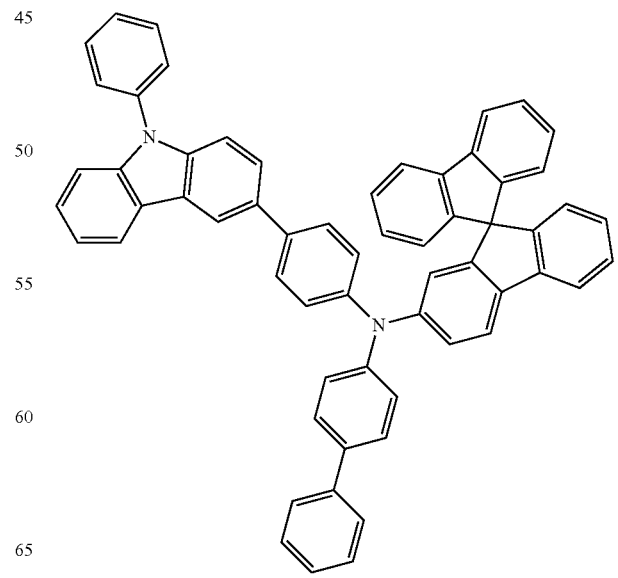

HT7
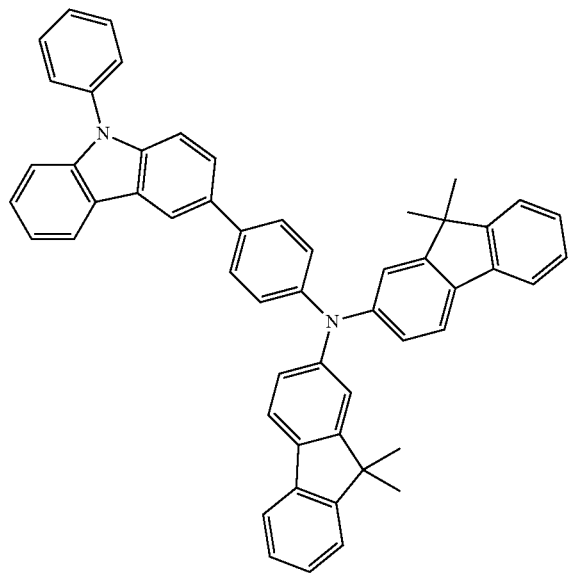
HT8
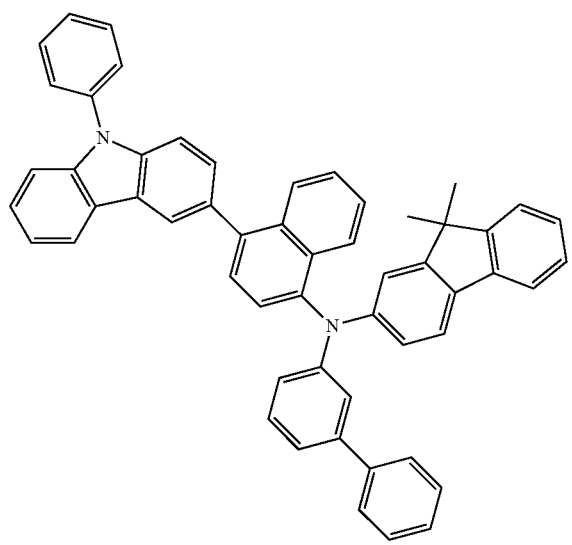
HT9
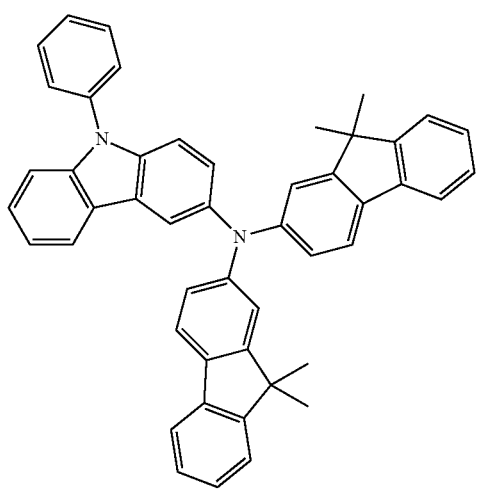
HT10
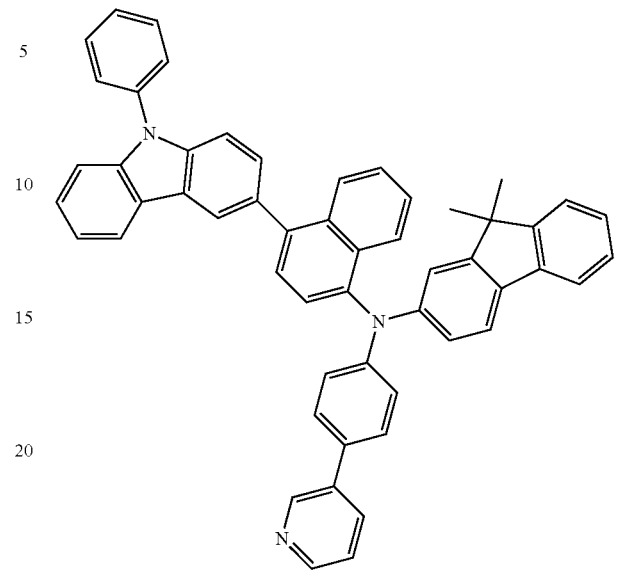
HT11
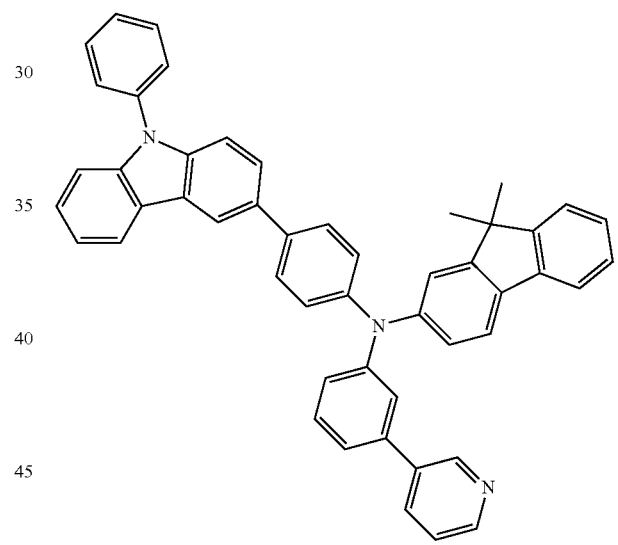
HT12
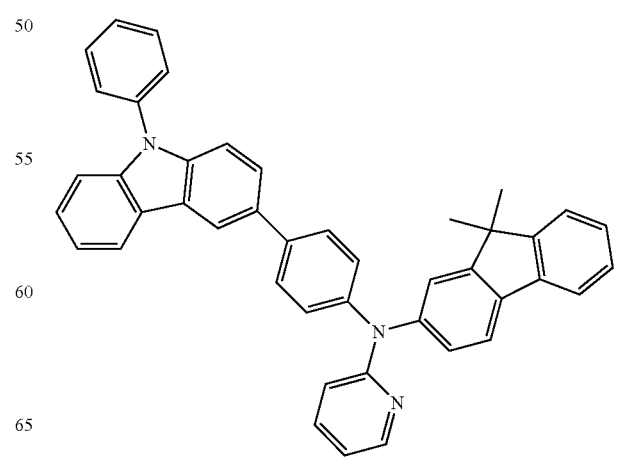

HT13
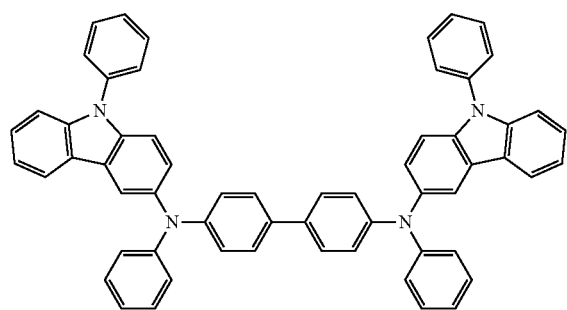
HT14
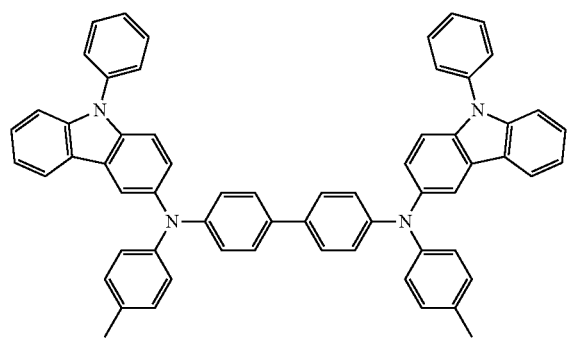
HT15
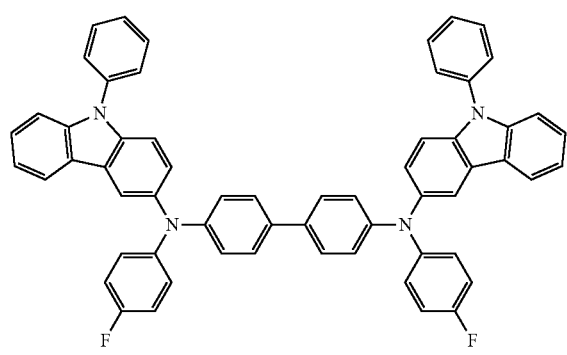
HT16
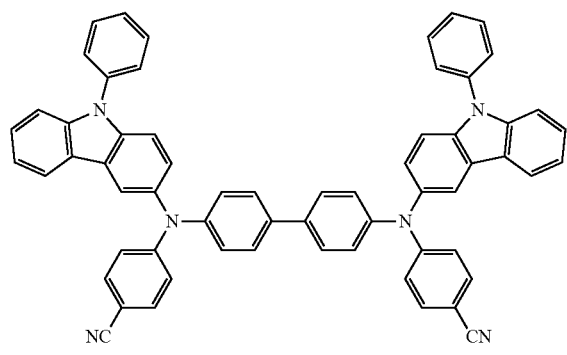
HT17
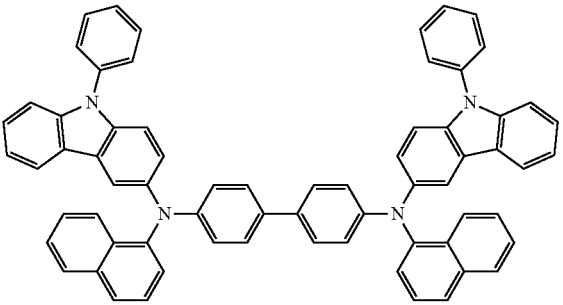
HT18
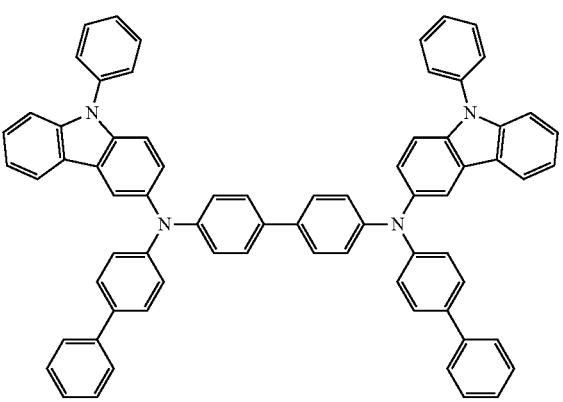
HT19
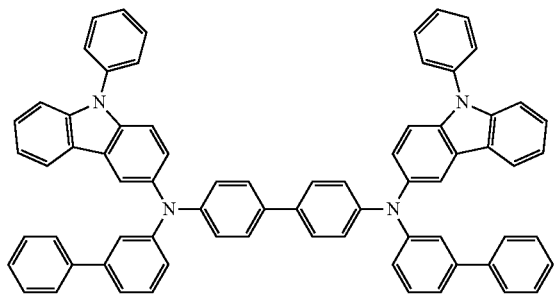
HT20
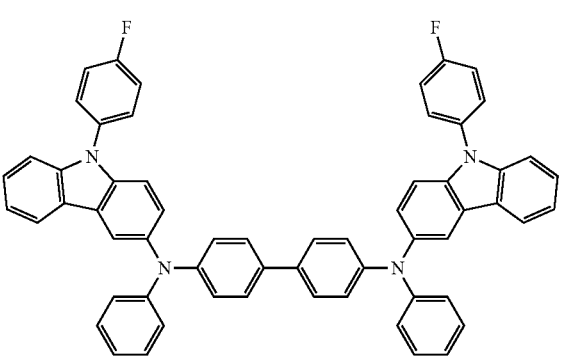
A thickness of the hole transport region may be in a range of about 100 Å to about 10,000 Å, for example, about 100 Å to about 1,000 Å. When the hole transport region includes both a hole injection layer and a hole transport layer, a thickness of the hole injection layer may be in a range of about 100 Å to about 10,000 Å, for example, about 100 Å to about 1,000 Å, and a thickness of the hole transport layer may be in a range of about 50 Å to about 2,000 Å, for example about 100 Å to about 1,500 Å. When the thicknesses of the hole transport region, the hole injection layer, and the hole transport layer are within these ranges, satisfactory hole transporting characteristics may be obtained without a substantial increase in driving voltage.

The hole transport region may further include, in addition to these materials, a charge-generation material for the improvement of conductive properties. The charge-generation material may be homogeneously or non-homogeneously dispersed in the hole transport region.

The charge-generation material may be, for example, a p-dopant. Examples of the p-dopant are a quinone derivative, such as tetracyanoquinodimethane (TCNQ) and tetrafluorotetracyanoquinodimethane (F4-TCNQ); a metal oxide, such as a tungsten oxide and a molybdenum oxide; and 1,4,5,8,9,11-hexaazatriphenylene-hexacarbonitrile (HATCN) illustrated below.

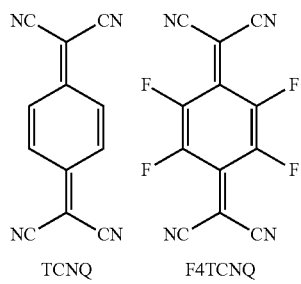

TCNQ    F4TCNQ

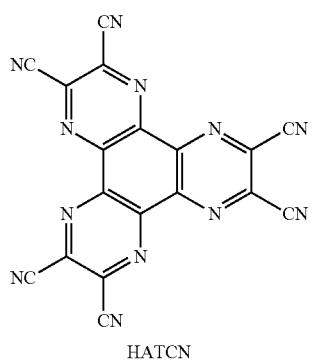

HATCN

The hole transport region may further include, in addition to the hole injection layer, and the hole transport layer, at least one layer selected from a buffer layer and an electron blocking layer. The buffer layer may compensate for an optical resonance distance according to a wavelength of light emitted from the emission layer. Accordingly, light-emission efficiency of a formed organic light-emitting device may be improved. For use as a material included in the buffer layer, materials that are included in the hole transport region may be used. The electron blocking layer may help prevent injection of electrons from the electron transport region. For example, a material for the electron blocking layer may be mCP.

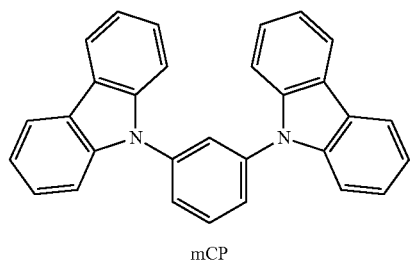 [SMILES: c1cc(-n2c3ccccc3c3ccccc32)cc(-n2c3ccccc3c3ccccc32)c1]

mCP

An emission layer may be formed on the first electrode 110 or the hole transport region by using a suitable, such as vacuum deposition, spin coating, casting, a LB method, ink-jet printing, laser-printing, or laser-induced thermal imaging. When an emission layer is formed by vacuum deposition or spin coating, deposition and coating conditions for the emission may be the same as those for the hole injection layer.

The emission layer may include a first compound represented by Formula 1-1 or Formula 1-2 below, a second compound represented by Formula 2, and a third compound represented by Formula 3. The first compound may be a host, the second compound may be a dopant, and the third compound may be a hole transport material.

The emission layer may emit blue light.

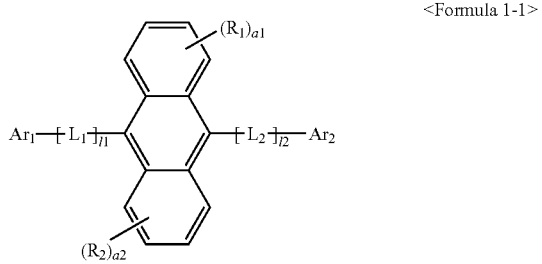

<Formula 1-1>

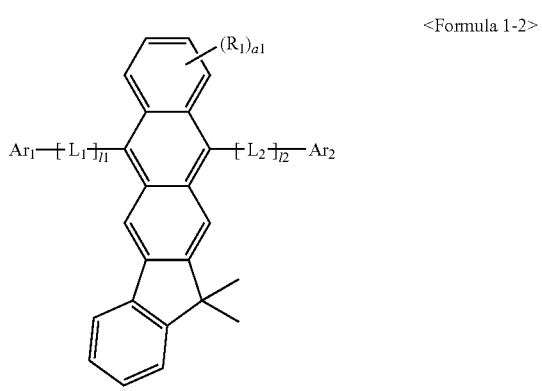

<Formula 1-2>

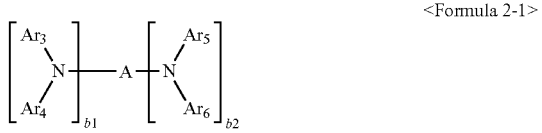

<Formula 2-1>

<Formula 3>

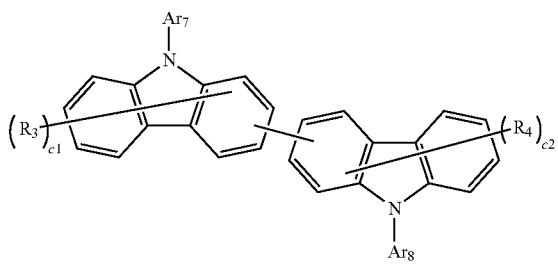

In Formulae 1-1, 1-2, 2, and 3, $L_1$ and $L_2$ may each be independently selected from a substituted or unsubstituted $C_6$-$C_{40}$ arylene group, A may be a substituted or unsubstituted $C_6$-$C_{40}$ arylene group, a substituted or unsubstituted divalent $C_6$-$C_{40}$ non-aromatic hetero condensed polycyclic group, or a combination of these groups and a styrylene group, $Ar_1$ to $Ar_8$ may be each independently a substituted or unsubstituted $C_6$-$C_{40}$ aryl group, $R_1$ to $R_4$ may be each independently selected from a deuterium atom, a halogen atom, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a substituted or unsubstituted $C_1$-$C_{20}$ alkyl group, a substituted or unsubstituted $C_2$-$C_{20}$ alkenyl group, a substituted or unsubstituted $C_2$-$C_{20}$ alkynyl group, a substituted or unsubstituted $C_1$-$C_{20}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{40}$ aryl group, a substituted or unsubstituted $C_1$-$C_{40}$ heteroaryl group, a substituted or unsubstituted $C_5$-$C_{40}$ aryloxy group, a substituted or unsubstituted $C_5$-$C_{40}$ arylthio group, a substituted or unsubstituted monovalent $C_6$-$C_{40}$ non-aromatic condensed polycyclic group(non-aromatic condensed polycyclic group), a substituted or unsubstituted monovalent $C_6$-$C_{40}$ non-aromatic hetero condensed polycyclic group(non-aromatic hetero condensed polycyclic group), —N($Q_1$)($Q_2$), —P(=O)($Q_3$)($Q_4$), —Si($Q_5$)($Q_6$)($Q_7$), —Ge($Q_5$)($Q_6$)($Q_7$), and —B($Q_8$)($Q_9$)($Q_1$ to $Q_9$ are each independently a hydrogen atom, a $C_1$-$C_{20}$ alkyl group, or a $C_6$-$C_{40}$ aryl group);

at least one of substituents of the substituted $C_1$-$C_{20}$ alkyl group, substituted $C_2$-$C_{20}$ alkenyl group, substituted $C_2$-$C_{20}$ alkynyl group, substituted $C_1$-$C_{20}$ alkoxy group, substituted $C_3$-$C_{10}$ cycloalkyl group, substituted $C_1$-$C_{10}$ heterocycloalkyl group, substituted $C_3$-$C_{10}$ cycloalkenyl group, substituted $C_1$-$C_{10}$ heterocycloalkenyl group, substituted $C_6$-$C_{40}$ aryl group, substituted $C_1$-$C_{40}$ heteroaryl group, substituted $C_5$-$C_{40}$ aryloxy group, substituted $C_5$-$C_{40}$ arylthio group, substituted monovalent $C_6$-$C_{40}$ non-aromatic condensed polycyclic group, substituted monovalent $C_6$-$C_{40}$ non-aromatic hetero condensed polycyclic group, and substituted $C_6$-$C_{40}$ arylene group may be selected from:

a deuterium atom, a halogen atom, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_2$-$C_{20}$ alkenyl group, a $C_2$-$C_{20}$ alkynyl group, a $C_1$-$C_{20}$ alkoxy group, a $C_3$-$C_{10}$ cycloalkyl group, a $C_1$-$C_{10}$ hetero cycloalkyl group, a $C_3$-$C_{10}$ cycloalkenyl group, a $C_1$-$C_{10}$ heterocycloalkenyl group, a $C_6$-$C_{40}$ aryl group, a $C_1$-$C_{40}$ heteroaryl group, a $C_5$-$C_{40}$ aryloxy group, a $C_5$-$C_{40}$ arylthio group, monovalent $C_6$-$C_{40}$ non-aromatic condensed polycyclic group, monovalent $C_6$-$C_{40}$ non-aromatic hetero condensed polycyclic group, —N($Q_{11}$)($Q_{12}$), —Si($Q_{13}$)($Q_{14}$)($Q_{15}$), —Ge($Q_{13}$)($Q_{14}$)($Q_{15}$), and B($Q_{16}$)($Q_{17}$) ($Q_{11}$ to $Q_{17}$ are each independently selected from a hydrogen atom, a $C_1$-$C_{20}$ alkyl group, and a $C_6$-$C_{40}$ aryl group), a1 and a2 are each independently an integer from 0 to 4;

b1 and b2 are each independently 1 or 2;

a1 and a2 are each independently an integer from 0 to 7; and l1 and l2 are each independently an integer from 0 to 3.

A may be selected from the following substituents:

(1) a chrysenylene group, a pyrenylene group, a perylenylene group, a fluorenylene group, a spiro-fluorenylene group;

(2) a chrysenylene group, a pyrenylene group, a perylenylene group, a fluorenylene group, each substituted with at least one selected from a deuterium atom, a halogen atom, a hydroxyl group, a cyano group, a nitro group, an amino group, an amidino group, a hydrazine group, a hydrazone group, a styryl group, a carboxylic acid or a salt thereof, a sulfonic acid or a salt thereof, a phosphoric acid or a salt thereof, a $C_1$-$C_{20}$ alkyl group, a $C_2$-$C_{20}$ alkenyl group, a $C_2$-$C_{20}$ alkynyl group, a $C_1$-$C_{20}$ alkoxy group, a $C_6$-$C_{40}$ aryl group, a $C_1$-$C_{40}$ heteroaryl group, a $C_5$-$C_{40}$ aryloxy group, a $C_5$-$C_{40}$ arylthio group, a monovalent $C_6$-$C_{40}$ non-aromatic condensed polycyclic group, a monovalent $C_6$-$C_{40}$ non-aromatic hetero condensed polycyclic group, —N($Q_{11}$)($Q_{12}$), —Si($Q_{13}$)($Q_{14}$)($Q_{15}$), —Ge($Q_{13}$)($Q_{14}$)($Q_{15}$), —B($Q_{16}$)($Q_{17}$) ($Q_{11}$ to $Q_{17}$ may be each independently selected from a hydrogen atom, a $C_1$-$C_{20}$ alkyl group, and a $C_6$-$C_{40}$ aryl group); and (3) a group made up of a at least one styryl group combined with at least one substituent of the substituents (1) and (2).

For example, A may be represented by any one of Formulae 4A to Formula 4F:

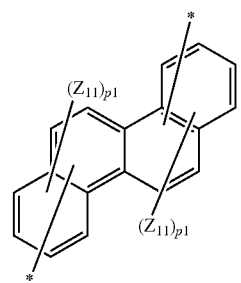

4A

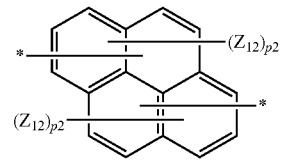

4B

-continued

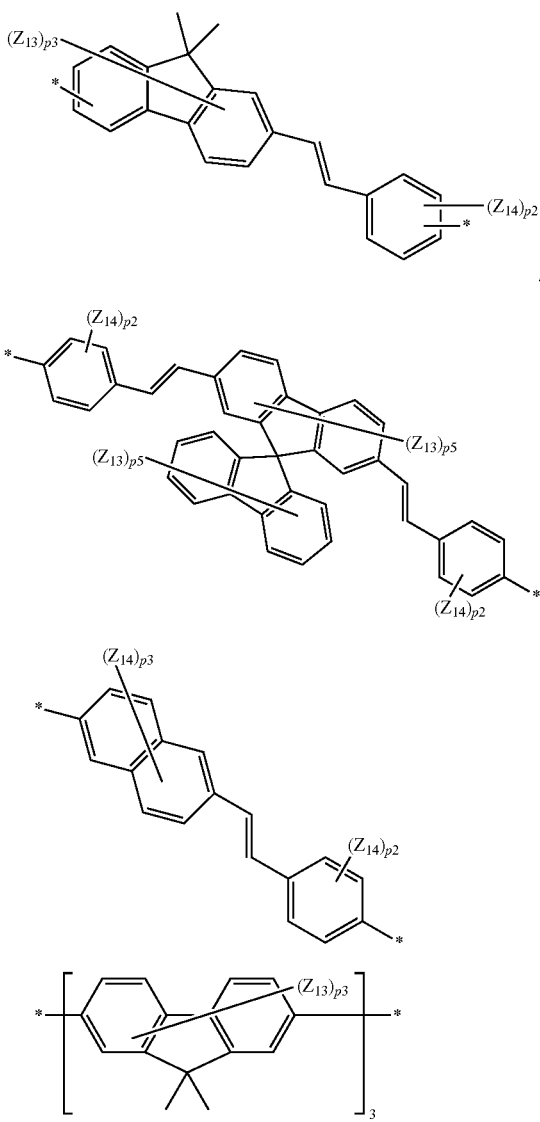

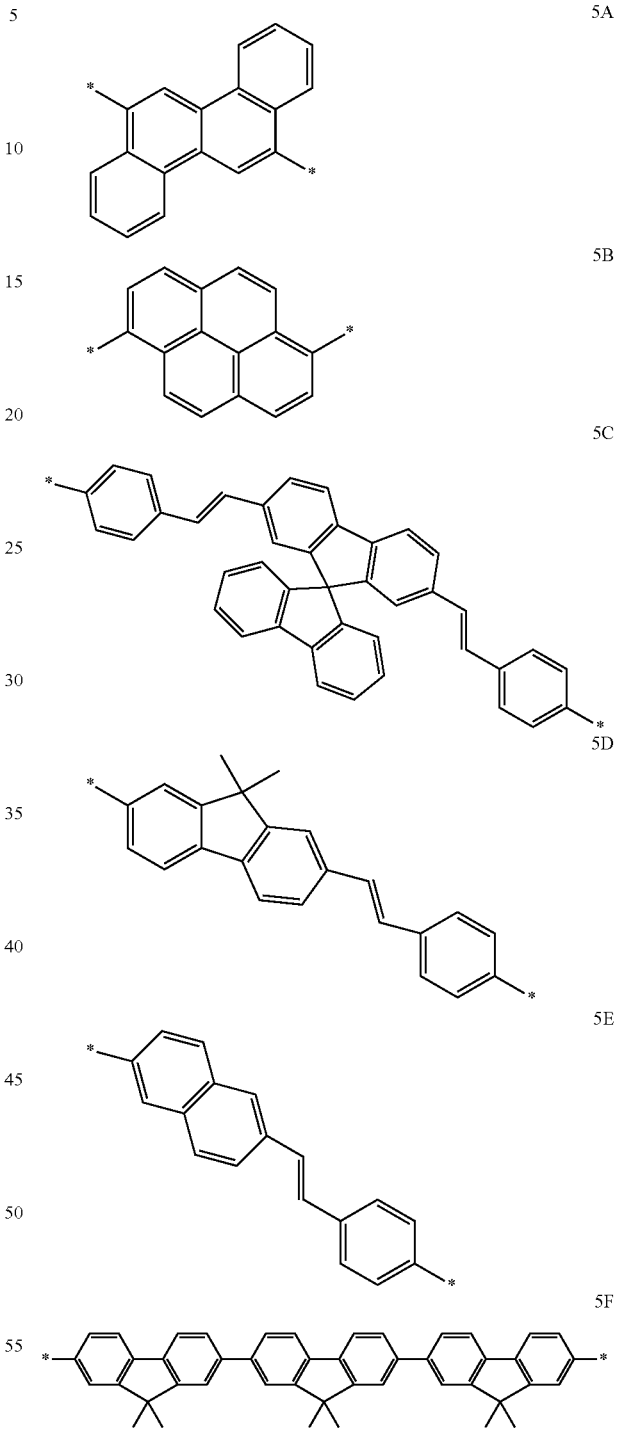

in Formulae 4A to 4F, $Z_{11}$ to $Z_{14}$ may be each independently selected from a deuterium atom, a halogen atom, a $C_1$-$C_{20}$ alkyl group, a $C_6$-$C_{40}$ aryl group, a monovalent $C_6$-$C_{40}$ non-aromatic condensed polycyclic group, —Si($Q_{13}$)($Q_{14}$)($Q_{15}$), and —Ge($Q_{13}$)($Q_{14}$)($Q_{15}$) ($Q_{13}$ to $Q_{15}$ may be each independently selected from a hydrogen atom, a $C_1$-$C_{20}$ alkyl group, and a $C_6$-$C_{40}$ aryl group);

a $C_1$-$C_{20}$ alkyl group, substituted with at least one selected from a deuterium atom and a halogen atom; and a $C_6$-$C_{40}$ aryl group and a monovalent $C_6$-$C_{40}$ non-aromatic condensed polycyclic group, each substituted with at least one selected from a deuterium atom, a halogen atom, a $C_1$-$C_{20}$ alkyl group, and a $C_6$-$C_{20}$ aryl group.

p1 is an integer from 0 to 5,
p2 is an integer from 0 to 4;
p3 is an integer from 0 to 6,
p4 is an integer from 0 to 3;
p5 is an integer from 0 to 8; and
* indicates a binding site.

For example, A may be represented by any one of Formulae 5A to Formula 5F:

$L_1$ and $L_2$ are each independently selected from
a phenylene group, a naphthylene group, a phenanthrenylene group, and an anthrylene group; and
a phenylene group, a naphthylene group, a phenanthrenylene group and an anthrylene group, each substituted with at least one selected from a deuterium atom, a halogen atom, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{10}$ alkyl group, a $C_1$-$C_{10}$ alkoxy group, a phenyl group, a naphthyl group, a phenanthrenyl group, an anthryl group, and —Si($Q_{13}$)($Q_{14}$)($Q_{15}$) ($Q_{13}$ to $Q_{15}$ may be each independently selected from a hydrogen atom, a $C_1$-$C_{20}$ alkyl group, and a $C_6$-$C_{40}$ aryl group).

$Ar_1$ to $Ar_8$ may be each independently selected from a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentacenyl group, a hexacenyl group, a rubicenyl group, a coronenyl group, and an ovalenyl group; and a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, and an ovalenyl group, each substituted with at least one selected from:

a deuterium atom, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a pentalenyl group, an indenyl group, a naphthyl group, an azulenyl group, a heptalenyl group, an indacenyl group, an acenaphthyl group, a fluorenyl group, a Spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, and —Si($Q_{13}$)($Q_{14}$)($Q_{15}$), wherein $Q_{13}$ to $Q_{15}$ may be each independently selected from a hydrogen atom, a $C_1$-$C_{10}$ alkyl group, a $C_1$-$C_{10}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, an isoxazolyl group, a pyridinyl group, a pyrazinyl group, a pyrimidinyl group, a pyridazinyl group, a quinolinyl group, an isoquinolinyl group, a benzoquinolinyl group, a quinoxalinyl group, a quinazolinyl group, a carbazolyl group, a phenanthrolinyl group, a benzoimidazolyl group, a benzofuranyl group, a benzothiophenyl group, an isobenzothiazolyl group, a benzoxazolyl group, an isobenzoxazolyl group, a triazolyl group, an oxadiazolyl group, a triazinyl group, a dibenzofuranyl group, a dibenzothiophenyl group, a benzocarbazolyl group, a dibenzocarbazolyl group, a dibenzosilolyl group, a thiadiazolyl group, an imidazopyridinyl group, and an imidazopyrimidinyl group.

$R_1$ to $R_4$ may be each independently selected from:

a deuterium atom, a halogen atom, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a methyl group, an ethyl group, an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a methoxy group, an ethoxy group, a propoxy group, a butoxy group, a pentoxy group, a phenyl group, a pentalenyl group, an indenyl group, a naphthyl group, an azulenyl group, a heptalenyl group, an indacenyl group, an acenaphthyl group, a fluorenyl group, a Spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentacenyl group, a hexacenyl group, a rubicenyl group, a coronenyl group, an ovalenyl group; and a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, and an ovalenyl group, each substituted with at least one selected from:

a deuterium atom, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridyl group, a pyrazinyl group, a pyrimidinyl group, a pyridazinyl group, an isoindolyl group, an indolyl group, an indazolyl group, a purinyl group, a quinolyl group, an isoquinolyl group, benzoquinolyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzofluorenyl group, a benzimidazolyl group, a benzofuranyl group, a benzothiophenyl group, a benzothiazolyl group, a benzoxazolyl group, an isobenzoxazolyl group, a triazolyl group, a tetrazolyl group, an oxadiazolyl group, a triazinyl group, a dibenzofluorenyl group, a dibenzofuranyl group, a dibenzothiophenyl group, a benzocarbazolyl group, a dibenzocarbazolyl group, a thiadiazolyl group, an imidazopyridyl group, an imidazopyrimidinyl group, N($Q_{11}$)($Q_{12}$), and —Si($Q_{13}$)($Q_{14}$)($Q_{15}$).

In this regard, $Q_{11}$ to $Q_{15}$ may be each independently selected from a hydrogen atom, a $C_1$-$C_{10}$ alkyl group, a $C_1$-$C_{10}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, a quinolinyl group, an isoquinolinyl group, a benzoquinolinyl group, a quinoxalinyl group, a quinazolinyl group, a carbazolyl group, a phenanthrolinyl group, a benzoimidazolyl group, a benzofuranyl group, a benzothiophenyl group, an isobenzothiazolyl group, a benzoxazolyl group, an isobenzoxazolyl group, a triazolyl group, an oxadiazolyl group, a triazinyl group, a dibenzofuranyl group, a dibenzothiophenyl group, a benzocarbazolyl group, a dibenzocarbazolyl group, a dibenzosilolyl group, a thiadiazolyl group, an imidazopyridinyl group, and an imidazopyrimidinyl group.

In detail, $R_1$ to $R_4$ may be each independently selected from:

a $C_1$-$C_{20}$ alkyl group, and Formulae 6A to 6G:

6A

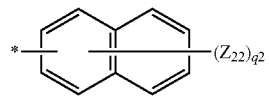

6B

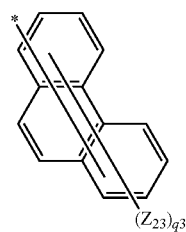

6C

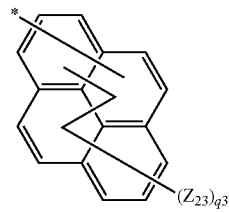

6D

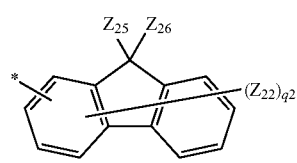

6E

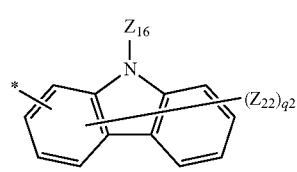

6F

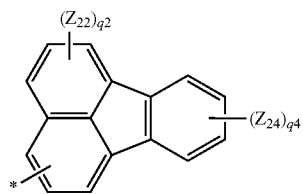

6G wherein in Formulae 6A to 6G, $Z_{21}$ to $Z_{26}$ may be each independently selected from a deuterium atom, a halogen atom, a $C_1$-$C_{20}$ alkyl group, a $C_6$-$C_{40}$ aryl group, a monovalent $C_6$-$C_{40}$ non-aromatic condensed polycyclic group, —$N(Q_{11})(Q_{12})$, —$Si(Q_{13})(Q_{14})(Q_{15})$, $Ge(Q_{13})(Q_{14})(Q_{15})$ ($Q_{11}$ to $Q_{15}$ may be each independently a hydrogen atom, a $C_1$-$C_{20}$ alkyl group, or a $C_6$-$C_{40}$ aryl group);

a $C_1$-$C_{20}$ alkyl group, substituted with at least one selected from a deuterium atom and a halogen atom; and a $C_6$-$C_{40}$ aryl group and a monovalent $C_6$-$C_{40}$ non-aromatic condensed polycyclic group, each substituted with at least one selected from a deuterium atom, a halogen atom, a $C_1$-$C_{20}$ alkyl group, and a $C_6$-$C_{20}$ aryl group.

q1 may be an integer from 0 to 5,
q2 may be an integer from 0 to 7,
q3 may be an integer from 0 to 9, and
q4 may be an integer from 0 to 3.

In some implementations, when q2 in Formula 6E is 2 or more, a plurality of $Z_{22}$ may be connected to be condensed to the fluorenyl group, thereby forming a condensed ring.

For example, $R_1$ to $R_4$ may be each independently selected from:

a methyl group, an ethyl group, an n-propyl group, an iso-propyl group, an n-butyl group, an iso-butyl group, a sec-butyl group, a tert-butyl group, and Formulae 7A to 7L:

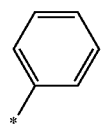

7A

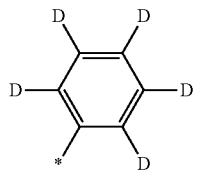

7B

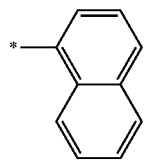

7C

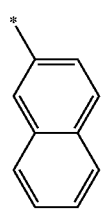

7D

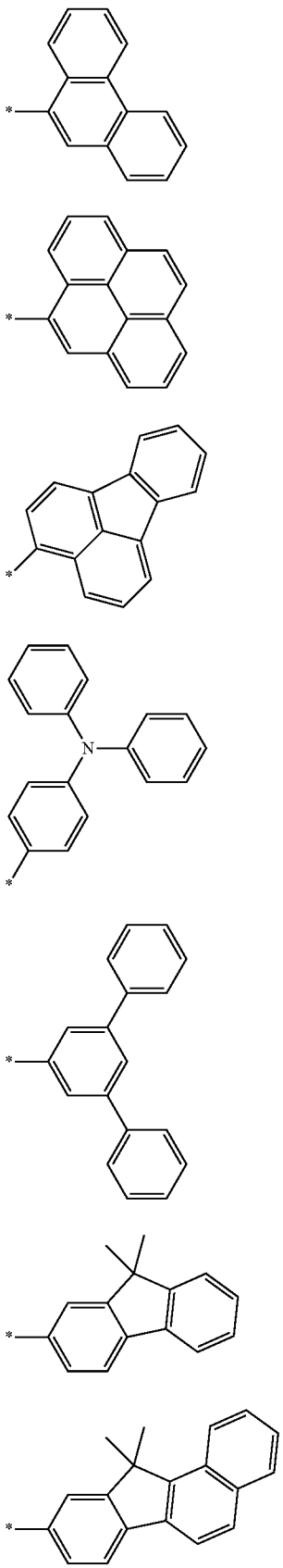

In some embodiments, in Formula 1-1 or Formula 1-2,
$L_1$ and $L_2$ may be each independently selected from a phenylene group and a naphthylene group, $Ar_1$ and $Ar_2$ may be each independently selected from a naphthyl group, a phenanthrenyl group, and a pyrenyl group, and $R_1$ and $R_2$ may be each independently selected from a phenyl group, a naphthyl group, a fluorenyl group, and a benzofluorenyl group; and a phenyl group, a naphthyl group, a fluorenyl group, and a benzofluorenyl group, each substituted with at least one selected from a deuterium atom, a halogen atom, a phenyl group, and a naphthyl group.

In this regard, a1 and a2 may be each independently 0 or 1.

l1 and l2 may be each independently an integer from 0 to 2.

In some embodiments, in Formula 2.

A may be selected from a chrysenylene group, a pyrenylene group, a perylenylene group, and a fluorenylene group; and a chrysenylene group, a pyrenylene group, a perylenylene group, and a fluorenylene group, each substituted with at least one selected from a deuterium atom, a halogen atom, a methyl group, an ethyl group, an n-propyl group, an iso-propyl group, an n-butyl group, an iso-butyl group, a sec-butyl group, a tert-butyl group, and a styryl group, $Ar_3$ to $Ar_6$ may be each independently selected from a phenyl group and a naphthyl group; and a phenyl group and a naphthyl group, each substituted with at least one selected from a deuterium atom, a halogen atom, a methyl group, an n-propyl group, and an iso-propyl group.

In this regard, b1 and b2 may be each independently 0 or 1.

For example, b1 and b2 may all be 1.

For example, b1 and b2 may all be 0. For example, when A is a perylenylene group, b1 and b2 may all be 0.

In some embodiments, in Formula 3, $R_3$ and $R_4$ may be each independently selected from:

a phenyl group, a naphthyl group, a fluorenyl group, a carbazolyl group, and a fluoranthenyl group; and a phenyl group, a naphthyl group, a fluorenyl group, a carbazolyl group, and a fluoranthenyl group, each substituted with at least one selected from a methyl group, a phenyl group, a pyridyl group, a pyrimidyl group, and —$N(Q_{11})(Q_{12})$ ($Q_{11}$ and $Q_{12}$ may be each independently a phenyl group or a naphthyl group), and $Ar_7$ and $Ar_8$ may be each independently selected from a phenyl group and a fluorenyl group;
a phenyl group and a fluorenyl group, each substituted with at least one selected from a methyl group and a phenyl group.

c1 and c2 may be each independently 0 to 1.

For example, the host compound represented by Formula 1-1 or Formula 1-2 may be one of Compounds H-1 to H-43 below:
H1
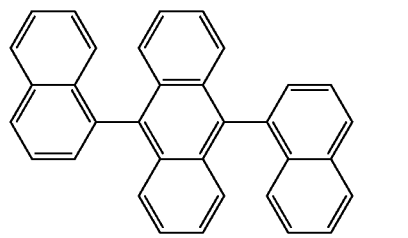
H2
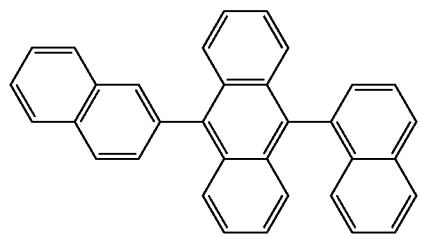
H3
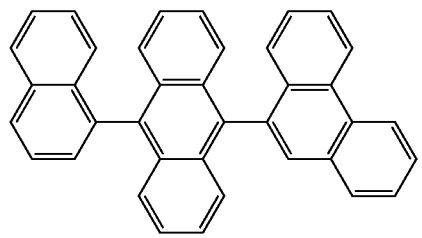
H4
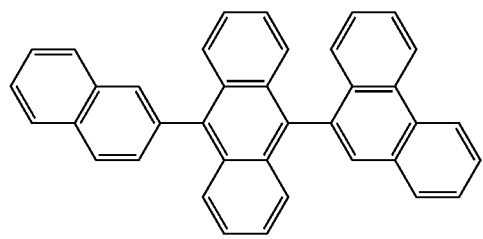
H5
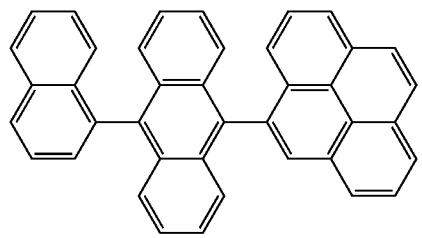
H6
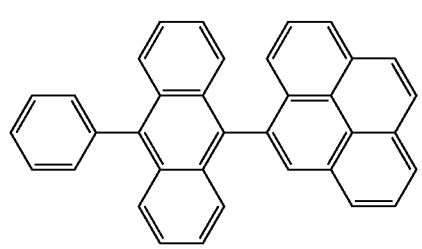
H7
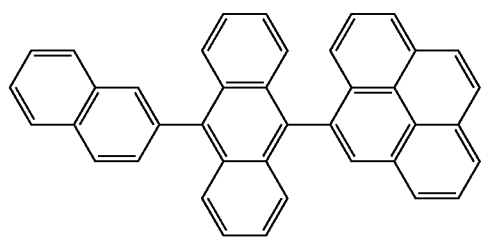
H8
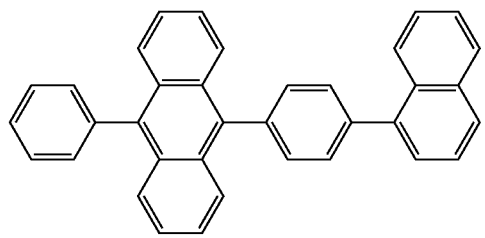
H9
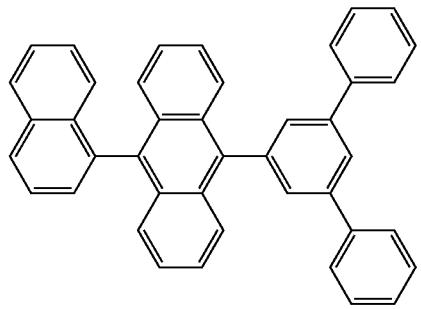
H10
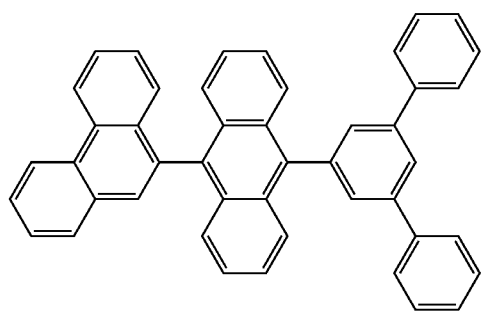
H11
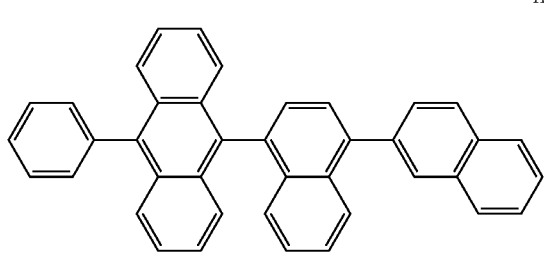
H12
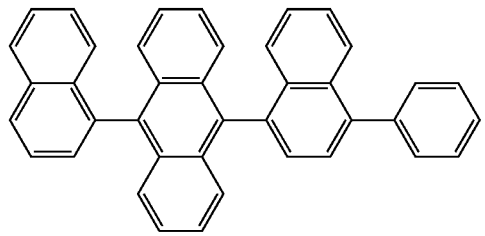

H13
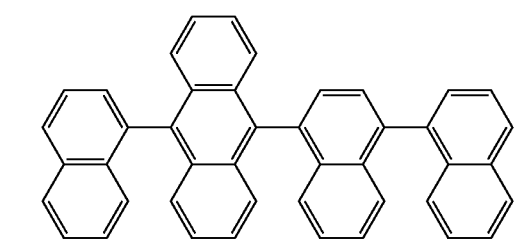
H14
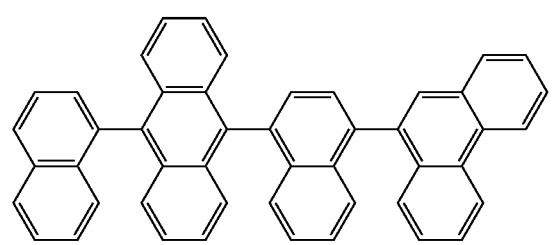
H15
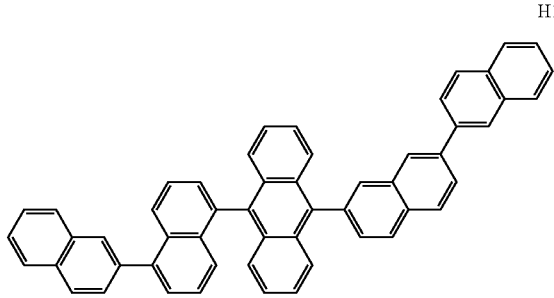
H16
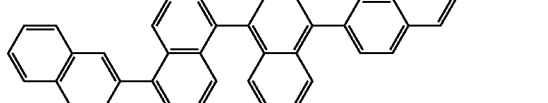
H17
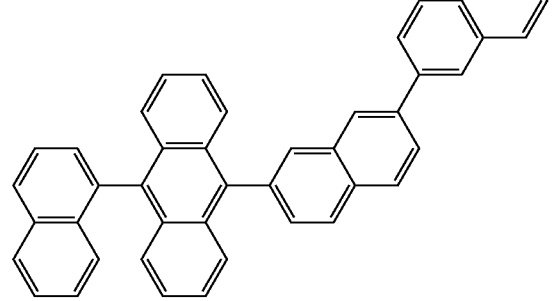
H18
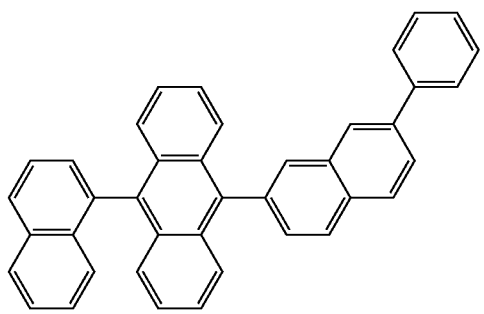
H19
H20
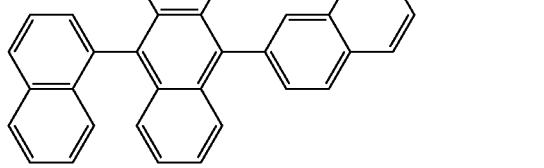
H21
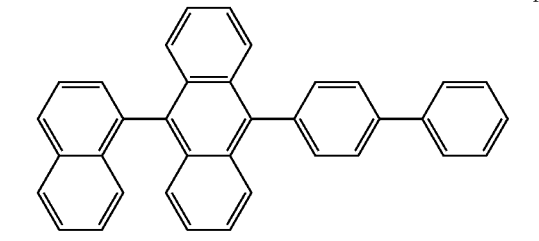
H22
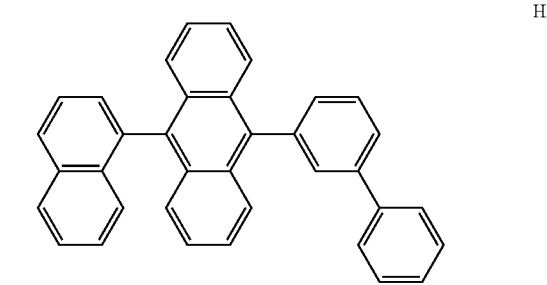

H23
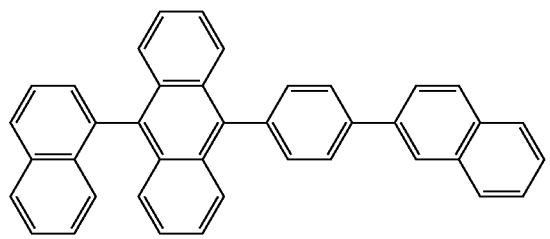
H24
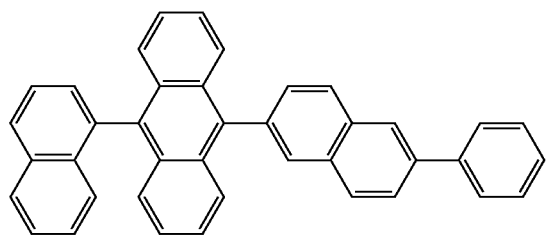
H25
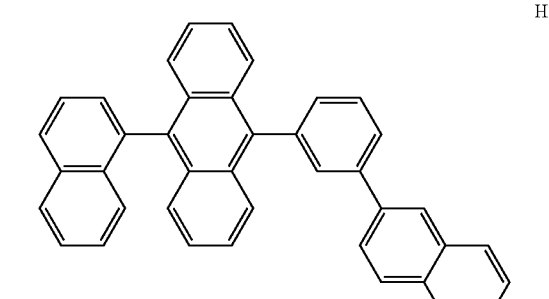
H26
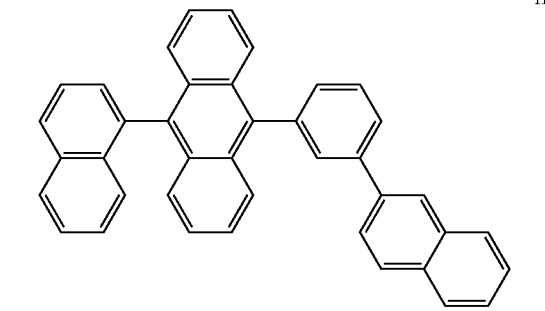
H27
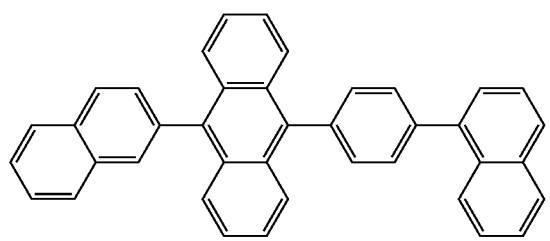
H28
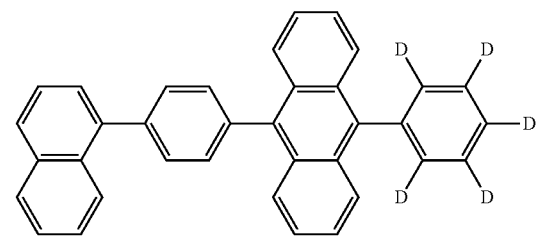
H29
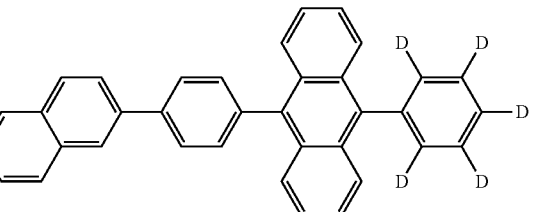
H30
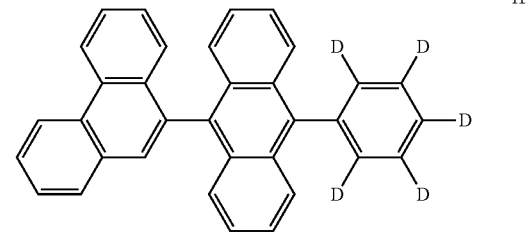
H31
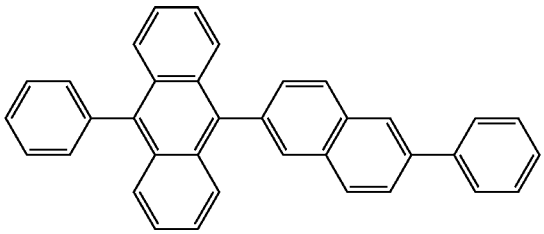
H32
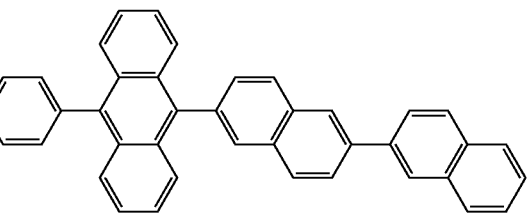
H33
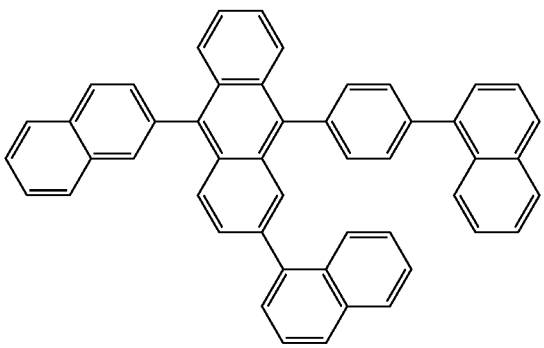

-continued
H34
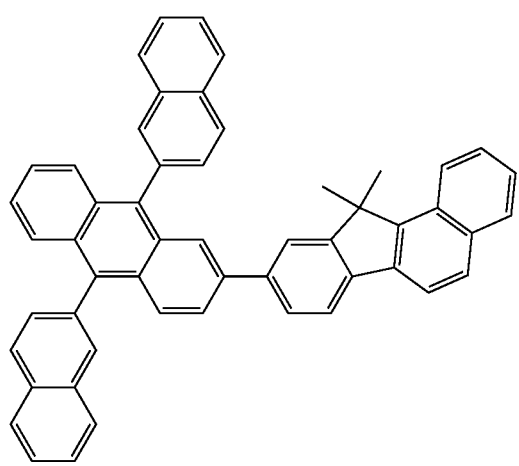
H35
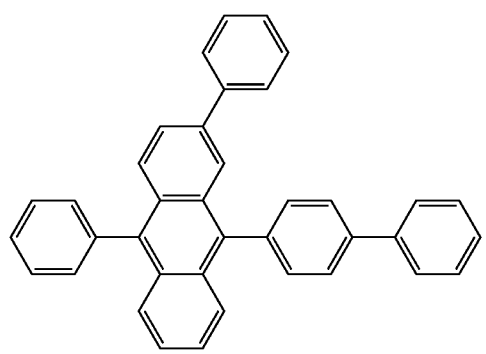
H36
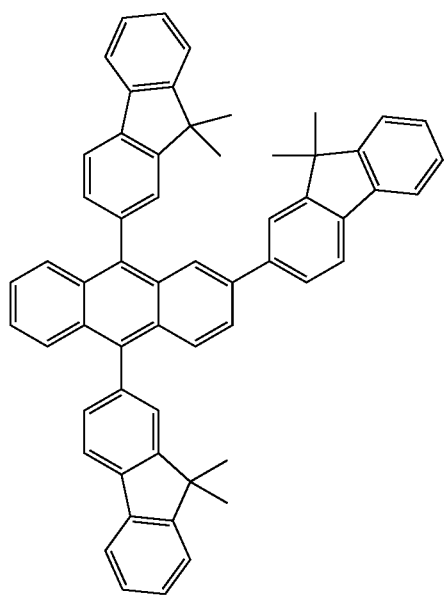
-continued
H37
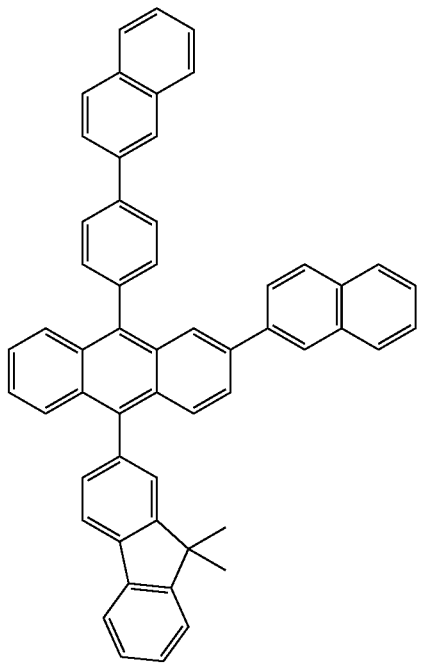
H38
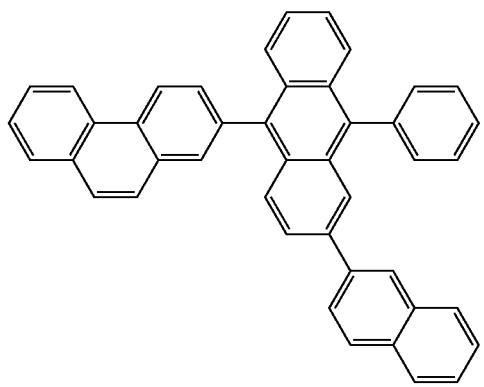
H39
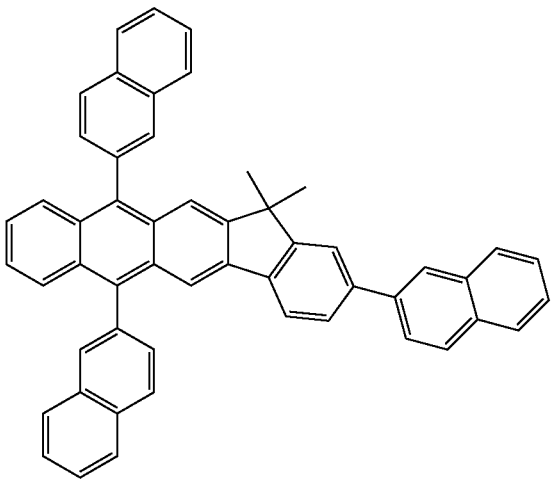

H40
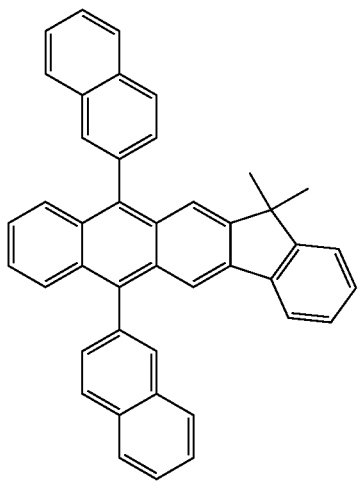
H41
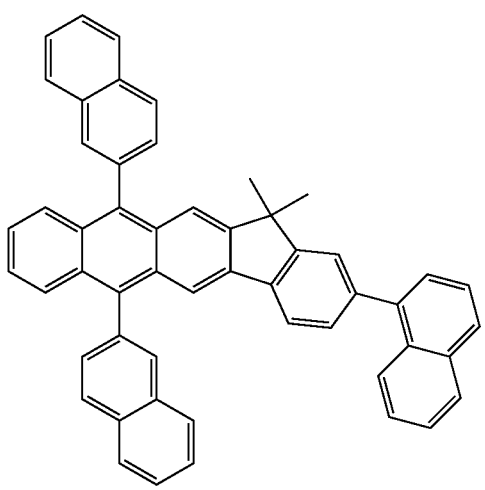
H42
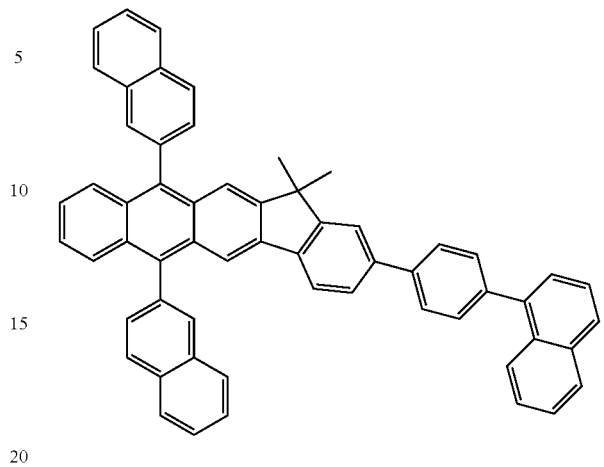
H43
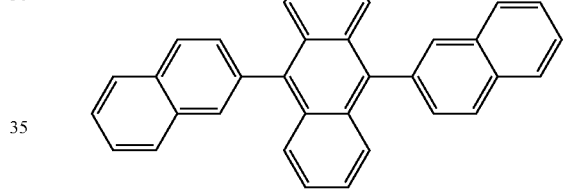
The dopant compound represented by Formula 2 may be one of Compounds D-1 to D-6 below:
D-1
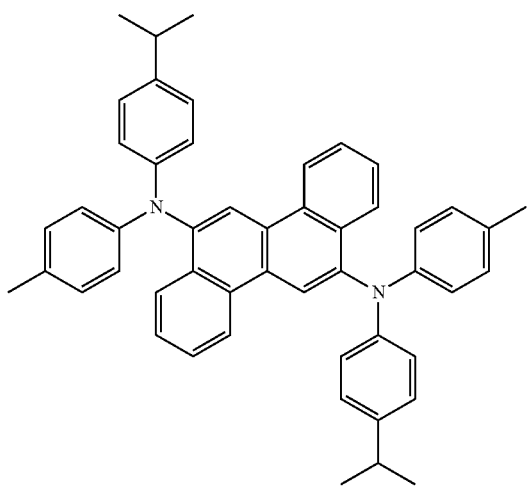
D-2
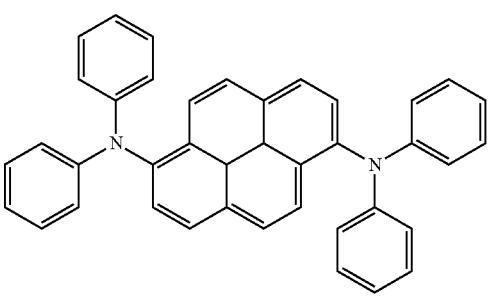

-continued
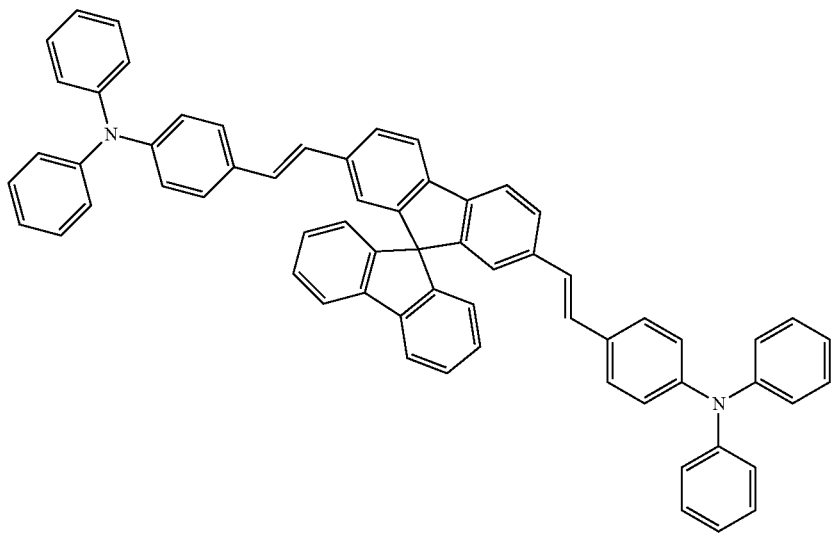
D-3
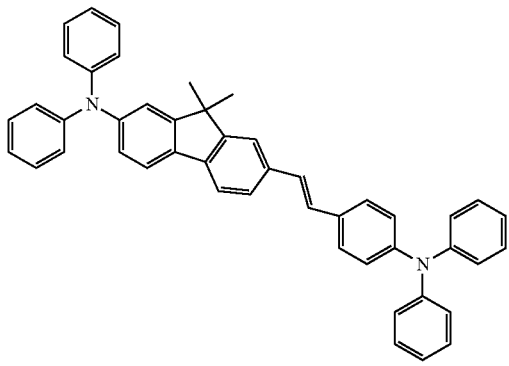
D-4
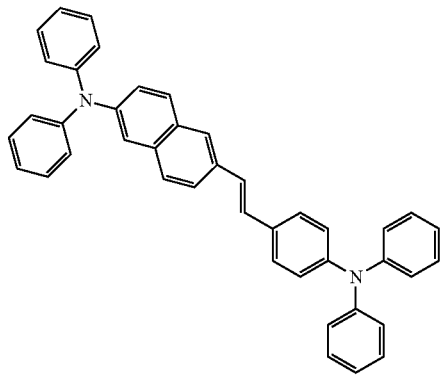
D-5
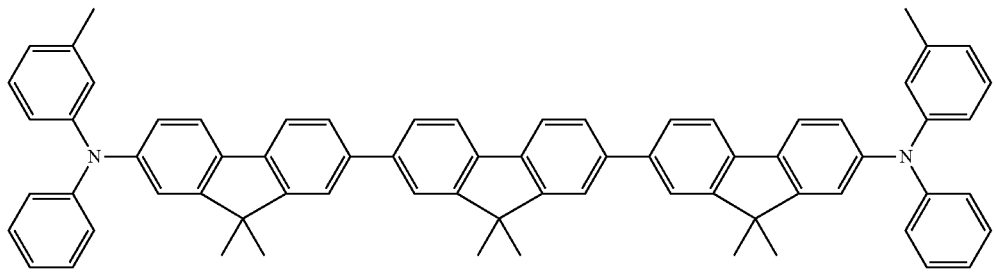
D-6
For example, the dopant compound represented by Formula 3 may be one of Compounds HT-1 to HT-14 below:

HT-1
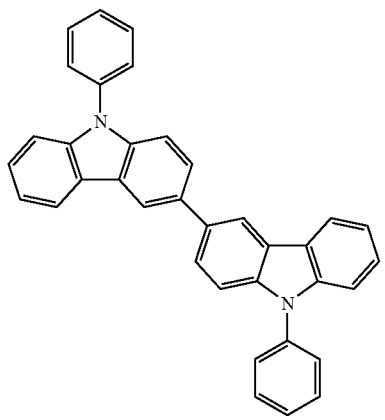
HT-2
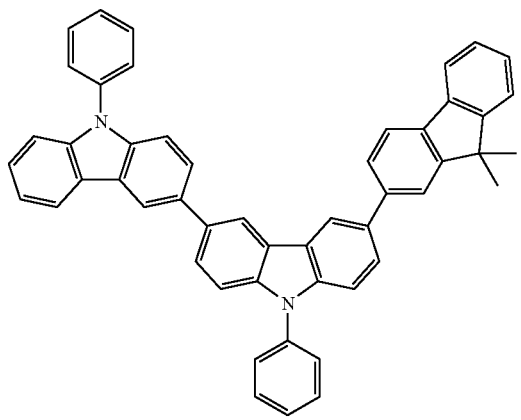
HT-3
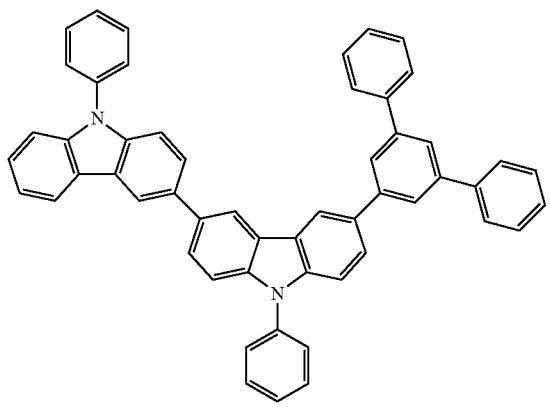
HT-4
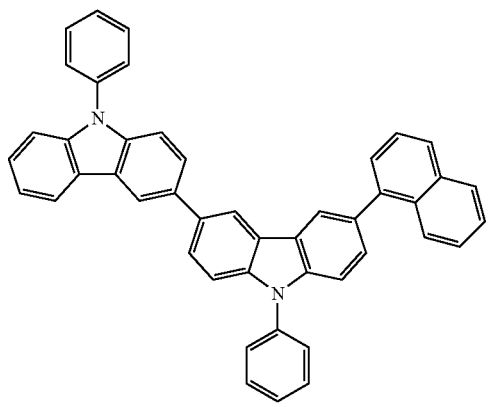
HT-5
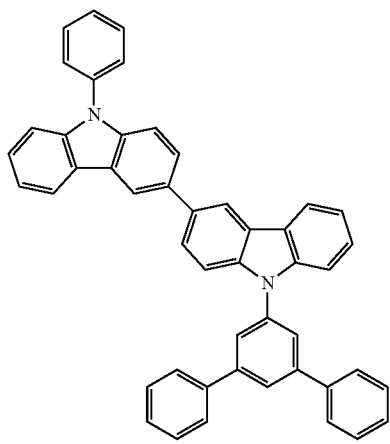
HT-6
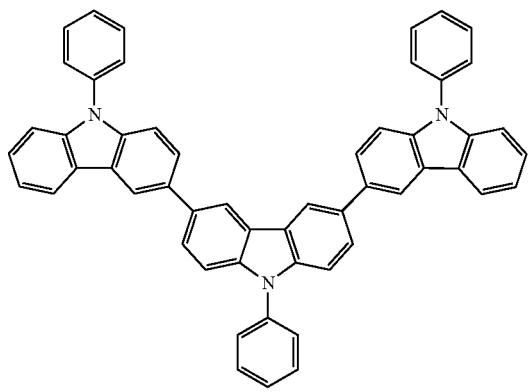

-continued
HT-7
HT-8
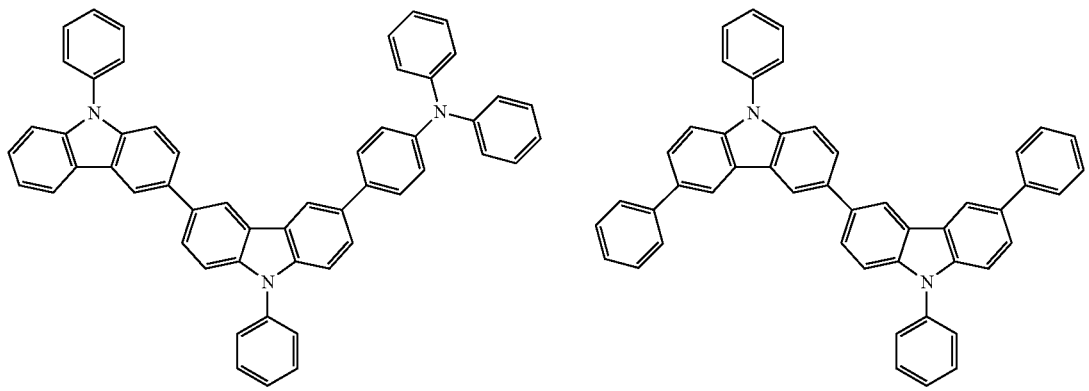
HT-9
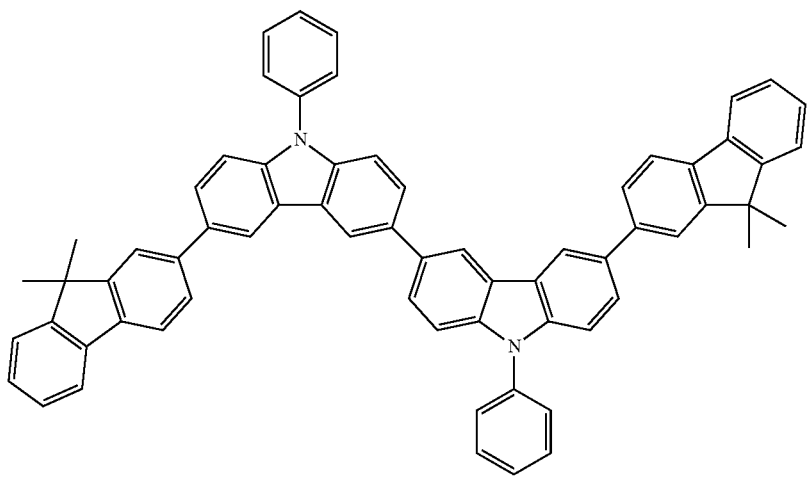
HT-10
HT-11
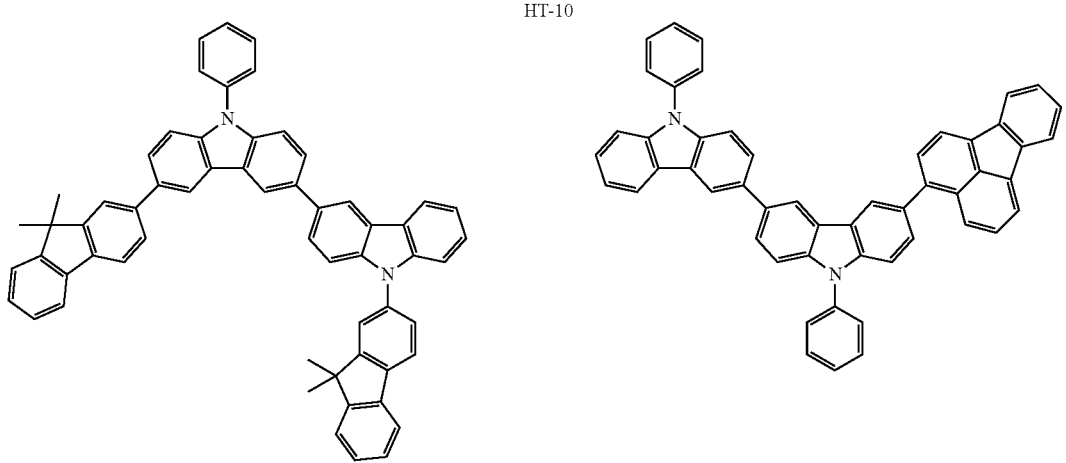

HT-12

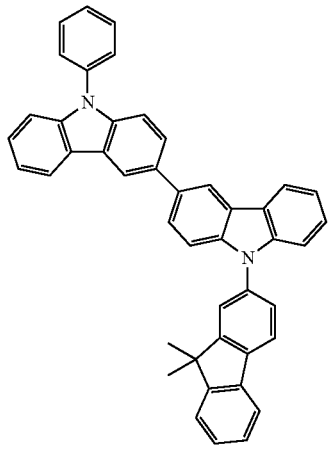

HT-13

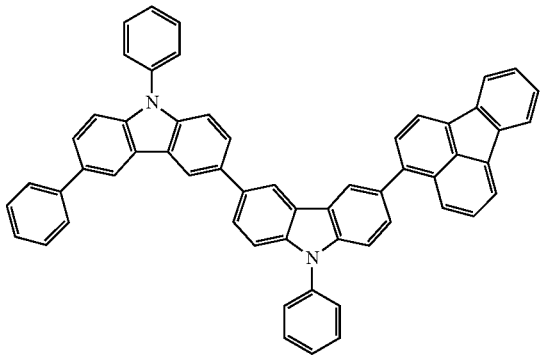

HT-14

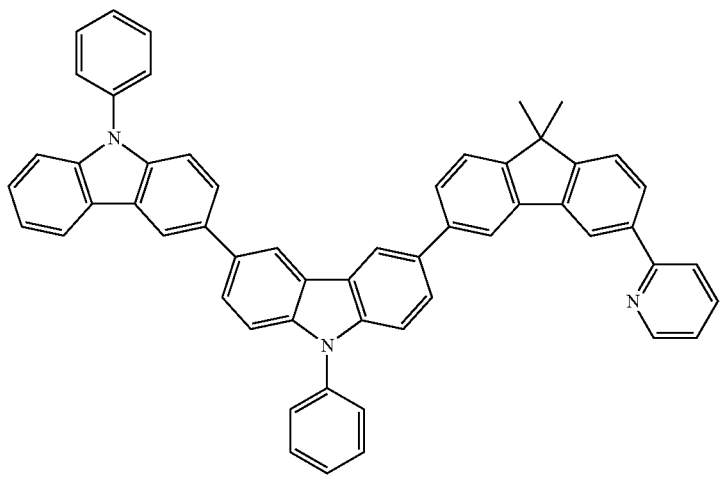

The emission layer may include an anthracene-based host represented by Formula 1-1 or Formula 1-2 and a hole transport compound represented by Formula 3. Accordingly, surplus holes existing in the emission layer may be removed, leading to an increase in both the lifespan and efficiency of a device.

An amount of the dopant may be in a range of about 0.01 to about 15 vol % based on a total volume of the emission layer, for example.

An amount of the hole transport material may be in a range of about 0.01 to about 15 vol % based on a total volume of the emission layer, for example.

A thickness of the emission layer may be in a range of about 100 Å to about 1,000 Å, or, for example, about 200 Å to about 600 Å. When the thickness of the emission layer is within this range, excellent light-emission characteristics may be obtained without a substantial increase in driving voltage.

When the organic light-emitting device 10 is a full color organic light-emitting device, the emission layer may be patterned into a red emission layer, a green emission layer, or a blue emission layer, according to a sub pixel. In some embodiments, the emission layer may have a stacked structure of a red emission layer, a green emission layer, and a blue emission layer, or may include a red-light emission material, a green-light emission material, and a blue-light emission material, which are mixed with each other in a single layer, to emit white light. When white light is emitted from the emission layer, the organic light-emitting device may further include a color conversion layer or a color filter. An emission layer as described above may be used as a blue emission layer.

The electron transport region may include at least one selected from a hole blocking layer (HBL), an electron transport layer (ETL), and an electron blocking layer (EBL), as examples.

For example, the electron transport region may have a structure of electron transport layer/electron injection layer or a structure of hole blocking layer/electron transport layer/electron injection layer, wherein layers of each structure are sequentially stacked from the emission layer in the stated order.

The electron transport region may include a hole blocking layer. The hole blocking layer may be formed to prevent diffusion of electrons from the emission layer to the electrode transport layer.

When the electron transport region includes a hole blocking layer, the hole blocking layer may be formed on the emission layer by a suitable method, such as vacuum deposition, spin coating casting, a LB method, ink-jet printing, laser-printing, or laser-induced thermal imaging. When the hole blocking layer is formed by vacuum deposition or spin coating, deposition and coating conditions for the hole blocking layer may be determined by referring to the deposition and coating conditions for the hole injection layer.

In some embodiments, the hole blocking layer may include at least one selected from BCP (bathocuproine), Bphen (4,7-diphenyl-1,10-phenanthroline), TmPyPB (3,3'-[5'-[3-(3-pyridinyl)phenyl][1,1':3',1''-terphenyl]-3,3''-diyl]bispyridine)).

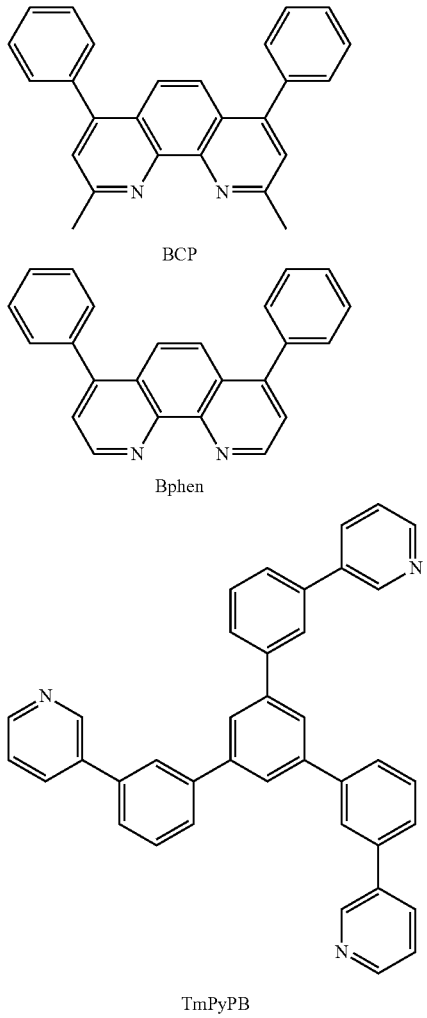

A thickness of the hole blocking layer may be in a range of about 20 Å to about 1,000 Å, or, for example, about 30 Å to about 300 Å. When the thickness of the hole blocking layer is within these ranges, the hole blocking layer may have excellent hole blocking characteristics without a substantial increase in driving voltage.

The electron transport region may include an electron transport layer. The electron transport layer may be formed on the emission layer or the hole blocking layer by a suitable method, such as vacuum deposition, spin coating casting, a LB method, ink-jet printing, laser-printing, or laser-induced thermal imaging. When an electron transport layer is formed by vacuum deposition or spin coating, deposition and coating conditions for the electron transport layer may be the same as the deposition and coating conditions for the hole injection layer.

In some embodiments, the electron transport layer may further include at least one selected from BCP, Bphen, Alq$_3$, bis(2-methyl-8-quinolinolato)(4-phenylphenolato)aluminum (III) (Balq), 3-(4-biphenylyl)-4-phenyl-5-(4-tert-butylphenyl)-1,2,4-triazole (TAZ), and 4-(naphthalen-1-yl)-3,5-diphenyl-4H-1,2,4-triazole (NTAZ).

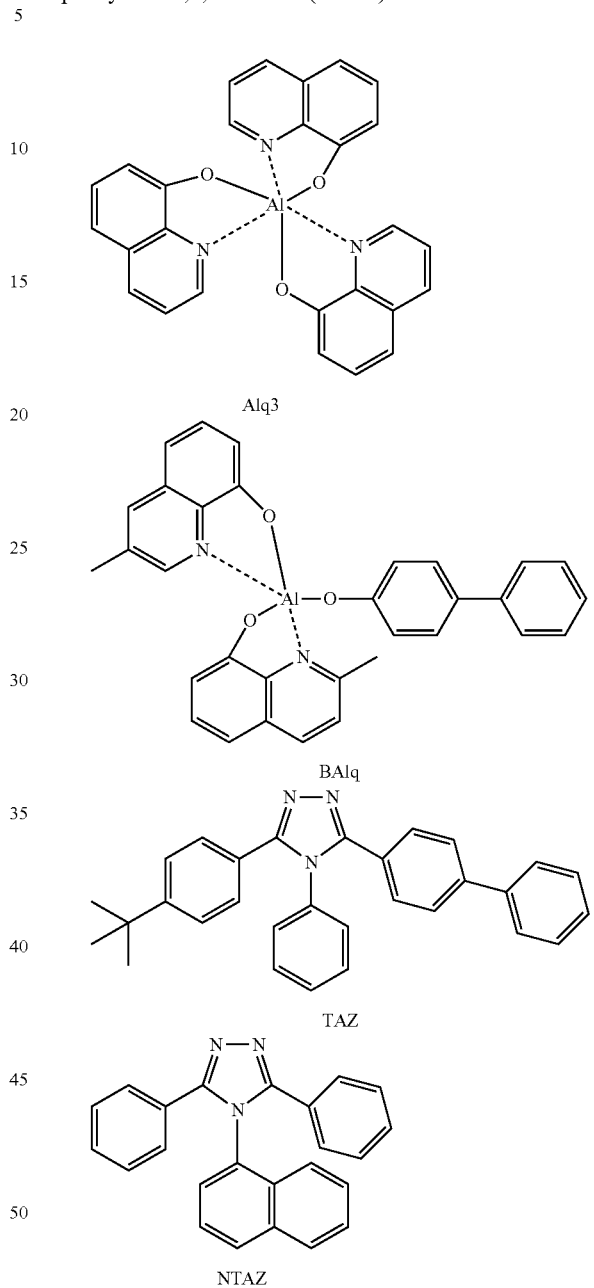

In some embodiments, the electron transport layer may further include at least one of compounds represented by Formula 601 below:

$$Ar_{601}\text{-}[(L_{601})_{xe1}\text{-}E_{601}]_{xe2} \qquad \text{<Formula 601>}$$

wherein in Formula 601, $Ar_{601}$ may be selected from a naphthalene, a heptalene, a fluorene, a spiro-fluorene, a benzofluorene, a dibenzofluorene, a phenalene, a phenanthrene, an anthracene, a fluoranthene, a triphenylene, a pyrene, a chrysene, a naphthacene, a picene, a perylene, a pentaphene, and an indenoanthracene; and a naphthalene, a heptalene, a fluorene, a spiro-fluorene, a benzofluorene, a dibenzofluorene, a phenalene, a phenanthrene, an anthracene, a fluoranthene, a triphenylene, a pyrene, a chrysene, a naphthacene, a picene, a perylene, a pentaphene, and an indenoanthracene, each substituted with at least one selected from a deuterium atom, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, a monovalent $C_2$-$C_{60}$ non-aromatic condensed polycyclic group, and —Si($Q_{301}$)($Q_{302}$)($Q_{303}$) ($Q_{301}$ to $Q_{303}$ are each independently selected from a hydrogen, a $C_1$-$C_{60}$ alkyl group, a $C_2$-$C_{60}$ alkenyl group, a $C_6$-$C_{60}$ aryl group, and a $C_2$-$C_{60}$ heteroaryl group);

a description of $L_{601}$ may be understood by referring to the description provided in connection with $L_{201}$;

$E_{601}$ may be selected from:

a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, carbazolyl, a phenanthridinyl group, an acridinyl group, a phenanthrolinyl group, a phenazinyl group, benzoimidazolyl, a benzofuranyl group, a benzothiophenyl group, isobenzothiazolyl, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, and a dibenzocarbazolyl group; and a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, and a dibenzocarbazolyl group, each substituted with at least one selected from a deuterium atom, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, and a dibenzocarbazolyl group;

xe1 may be selected from 0, 1, 2, and 3; and xe2 may be selected from 1, 2, 3, and 4.

In some embodiments, the electron transport layer may further include at least one of compounds represented by Formula 602 below:

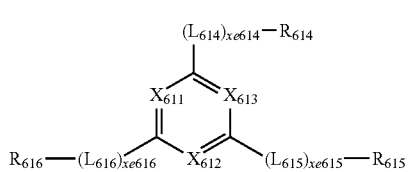

<Formula 602> wherein in Formula 602, $X_{611}$ may be N or C-($L_{611}$)$_{xe611}$-$R_{611}$, $X_{612}$ may be N or C-($L_{612}$)$_{xe612}$-$R_{612}$, $X_{613}$ may be N or C-($L_{613}$)$_{xe613}$-$R_{613}$, and at least one selected from $X_{611}$ to $X_{613}$ may be N;

$L_{611}$ to $L_{616}$ may be understood by referring to the description provided herein in connection with $L_{201}$;

$R_{611}$ and $R_{616}$ may be each independently selected from:

a phenyl group, a naphthyl group, a fluorenyl group, a Spiro-fluorenyl group, a benzofluorenyl group, a dibenzofluorenyl group, a phenanthrenyl group, an anthryl group, a pyrenyl group, a chrysenyl group, a pyridyl group, a pyrazinyl group, a pyrimidinyl group, a pyridazinyl group, a quinolyl group, an isoquinolyl group, a quinoxalinyl group, a quinazolinyl group, a carbazolyl group, and a triazinyl group; and a phenyl group, a naphthyl group, a fluorenyl group, a spiro-fluorenyl group, a benzofluorenyl group, a dibenzofluorenyl group, a phenanthrenyl group, an anthryl group, a pyrenyl group, a chrysenyl group, a pyridyl group, a pyrazinyl group, a pyrimidinyl group, a pyridazinyl group, a quinolyl group, an isoquinolyl group, a quinoxalinyl group, a quinazolinyl group, a carbazolyl group, and a triazinyl group, each substituted with at least one selected from a deuterium atom, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, an azulenyl group, a fluorenyl group, a spiro-fluorenyl group, a benzofluorenyl group, a dibenzofluorenyl group, a phenanthrenyl group, an anthryl group, a pyrenyl group, a chrysenyl group, a pyridyl group, a pyrazinyl group, a pyrimidinyl group, a pyridazinyl group, a quinolyl group, an isoquinolyl group, a quinoxalinyl group, a quinazolinyl group, a carbazolyl group, and a triazinyl group, xe611 to xe616 may be each independently selected from 0, 1, 2, and 3.

The compound represented by Formula 601 and the compound represented by Formula 602 may include at least one of Compounds ET1 to ET15 illustrated below.

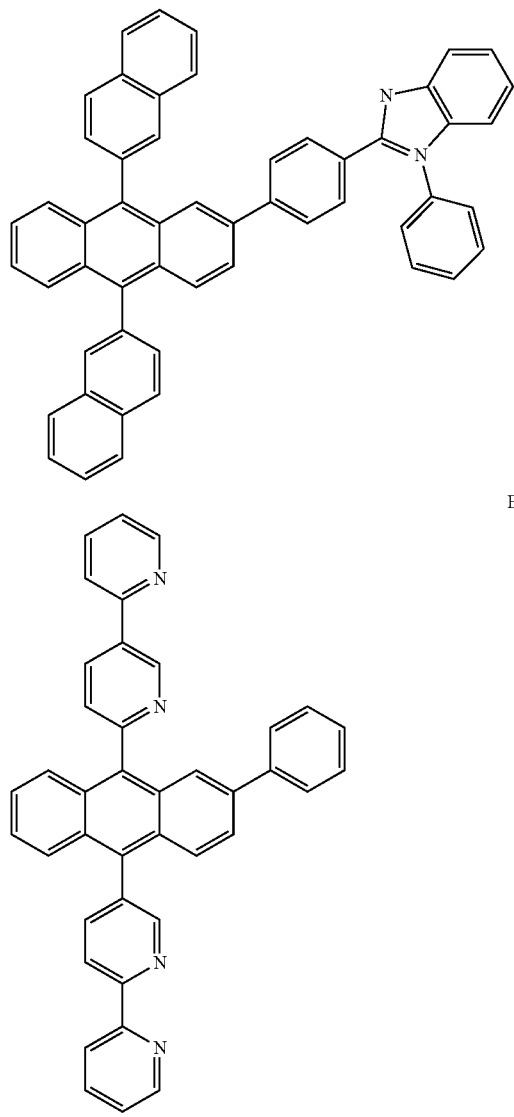

ET1

ET2

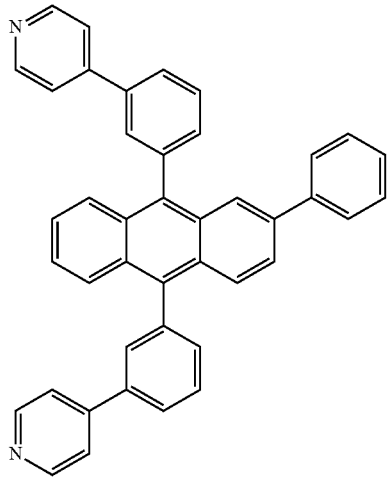

ET3

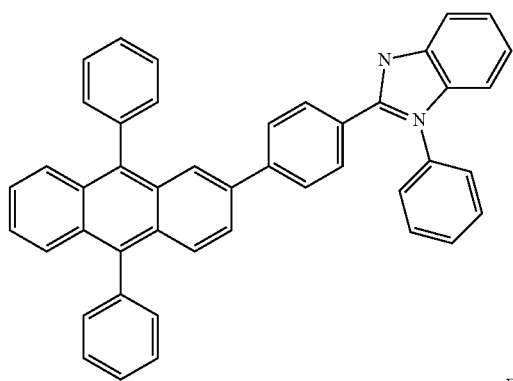

ET4

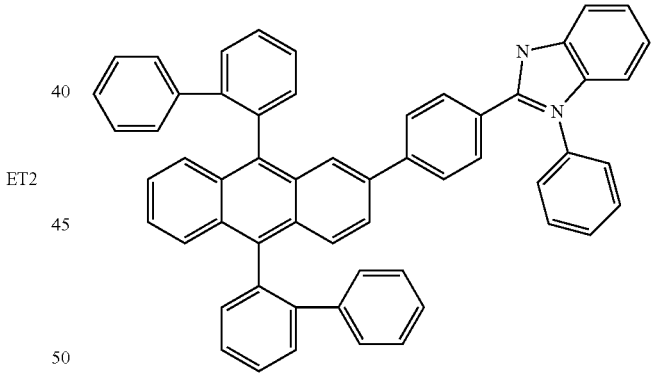

ET5

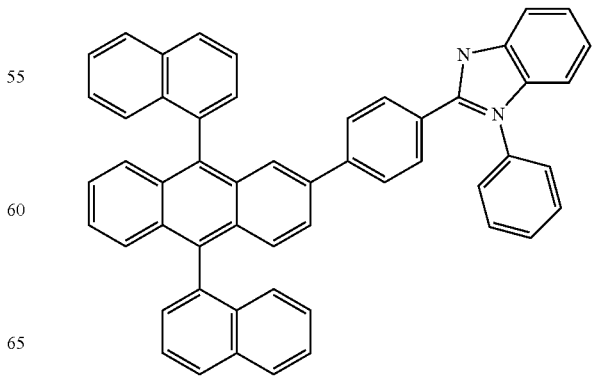

ET6

ET7
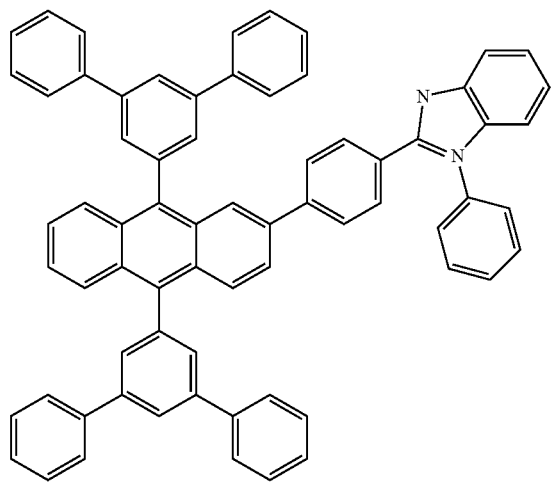
ET8
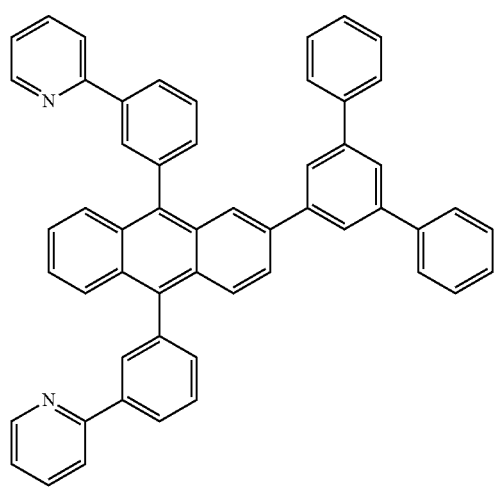
ET9
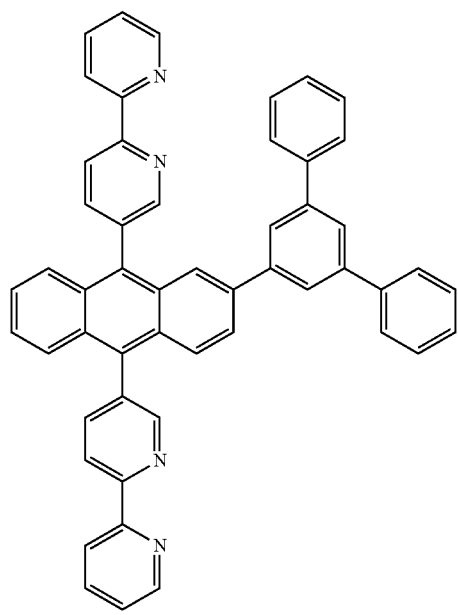
ET10
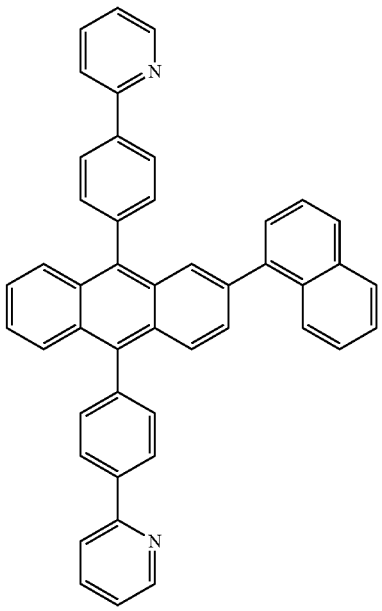
ET11
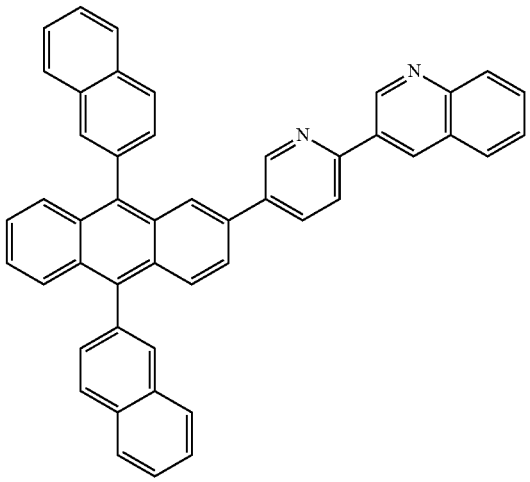
ET12
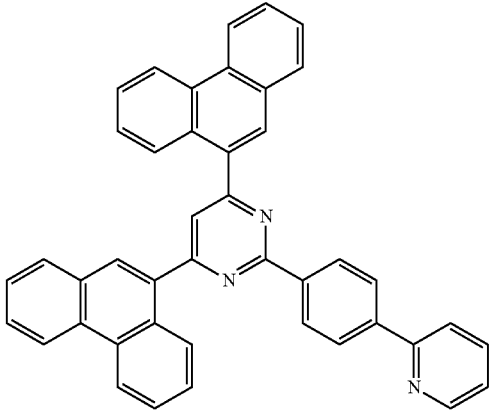

-continued

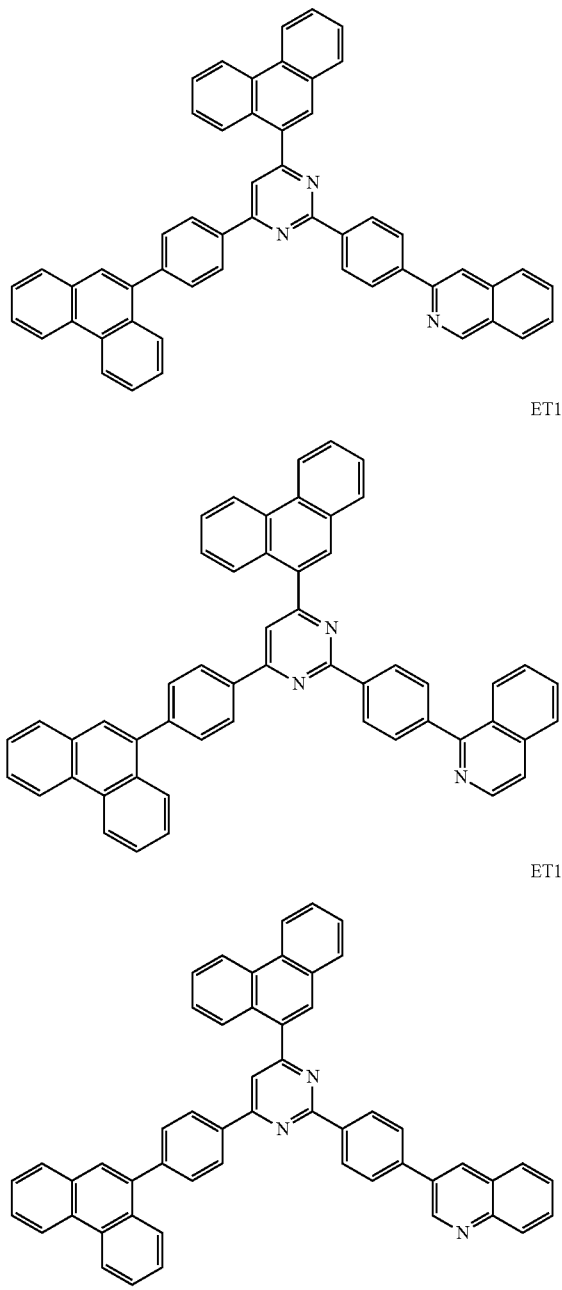

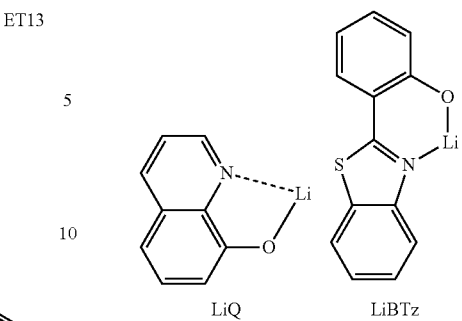

A thickness of the electron transport layer may be in a range of about 100 Å to about 1,000 Å, or, for example, about 150 Å to about 500 Å. When the thickness of the electron transport layer is within the range described above, the electron transport layer may have satisfactory electron transport characteristics without a substantial increase in driving voltage.

Also, the electron transport layer may include, in addition to an electron transport organic compound, a metal-containing material.

The metal-containing material may include a Li complex. The Li complex may include, for example, lithium quinolate (LiQ) or lithium[2-(2-hydroxyphenyl)benzothiazole] (LiBTz).

The electron transport region may include an electron injection layer (EIL) that allows electrons to be easily provided from a second electrode 190.

The electron injection layer may include, for example, at least one selected from, LiF. NaCl, CsF, $Li_2O$. BaO. and LiQ.

A thickness of the electron injection layer may be in a range of about 1 Å to about 100 Å, for example, about 3 Å to about 90 Å. When the thickness of the electron injection layer is within the range described above, the electron injection layer may have satisfactory electron injection characteristics without a substantial increase in driving voltage.

Layers or regions constituting the organic layer 150 may be formed by suitable methods, such as vacuum deposition, spin coating, casting, LB, ink-jet printing, laser printing, or laser-thermal transferring.

The second electrode 190 may be formed on the organic layer 150. The second electrode 190 may be a cathode. A material for forming the second electrode 190 may be a material having a relatively low work function. For example, the material for forming the second electrode 190 may be metal, an alloy, an electrically conductive compound, and a combination thereof, which. For example, lithium (Li), magnesium (Mg), aluminum (Al), aluminum-lithium (Al—Li), calcium (Ca), magnesium-indium (Mg—In), or magnesium-silver (Mg—Ag) may be formed as the material for forming the second electrode 190. To manufacture a top emission type light-emitting device, a transmissive electrode formed using ITO or IZO may be used as the second electrode 190.

Hereinbefore, the organic light-emitting device has been described with reference to FIG. 1, other implementations are possible.

The term "$C_1$-$C_{20}$ alkyl group" used herein refers to a linear or branched aliphatic hydrocarbon monovalent group having 1 to 20 carbon atoms. Detailed examples thereof include a methyl group, an ethyl group, an n-propyl group, an iso-propyl group, an n-butyl group, an iso-butyl group, a sec-butyl group, a tert-butyl group, a pentyl group, an iso-amyl group, and a hexyl group. The term "$C_1$-$C_{20}$ alkylene group" used herein refers to a divalent group having the same structure as the $C_1$-$C_{20}$ alkyl group.

The term "$C_1$-$C_{20}$ alkoxy group" used herein refers to a monovalent group represented by —$OA_{101}$ (wherein $A_{101}$ is the $C_1$-$C_{20}$ alkyl group). Detailed examples thereof include a methoxy group, an ethoxy group, and an isopropyloxy group.

The term "$C_2$-$C_{20}$ alkenyl group" used herein refers to a hydrocarbon group having at least one carbon double bond in the middle or at the terminal of the $C_1$-$C_{20}$ alkyl group. Detailed examples thereof include an ethenyl group, a propenyl group, and a butenyl group. The term "$C_2$-$C_{20}$ alkenylene group" used herein refers to a divalent group having the same structure as the $C_2$-$C_{20}$ alkenyl group.

The term "$C_2$-$C_{20}$ alkynyl group" used herein refers to a hydrocarbon group having at least one carbon trip bond in the middle or at the terminal of the $C_1$-$C_{20}$ alkyl group. Detailed examples thereof include an ethynyl group, and a propynyl group. The term "$C_2$-$C_{20}$ alkynylene group" used herein refers to a divalent group having the same structure as the $C_2$-$C_{20}$ alkynyl group.

The term "$C_3$-$C_{10}$ cycloalkyl group" used herein refers to a monovalent hydrocarbon monocyclic group having 3 to 10 carbon atoms. Detailed examples thereof include a cyclopropyl group, a cyclobutyl group, a cyclopentyl group, a cyclohexyl group, and a cycloheptyl group. The term "$C_3$-$C_{10}$ cycloalkylene group" used herein refers to a divalent group having the same structure as the $C_3$-$C_{10}$ cycloalkyl group.

The term "$C_1$-$C_{10}$ heterocycloalkyl group" used herein refers to a monovalent monocyclic group having at least one hetero atom selected from N, O, P, and S as a ring-forming atom and 1 to 10 carbon atoms. Detailed examples thereof include a tetrahydrofuranyl group, and a tetrahydrothiophenyl group. The term "$C_1$-$C_{10}$ heterocycloalkylene group" used herein refers to a divalent group having the same structure as the $C_1$-$C_{10}$ heterocycloalkyl group.

The term "$C_3$-$C_{10}$ cycloalkenyl group" used herein refers to a monovalent monocyclic group that has 3 to 10 carbon atoms and at least one double bond in the ring thereof and does not have aromaticity. Detailed examples thereof include a cyclopentenyl group, a cyclohexenyl group, and a cycloheptenyl group. The term "$C_3$-$C_{10}$ cycloalkenylene group" used herein refers to a divalent group having the same structure as the $C_3$-$C_{10}$ cycloalkenyl group.

The term "$C_1$-$C_{10}$ heterocycloalkenyl group" used herein refers to a monovalent monocyclic group that has at least one hetero atom selected from N, O, P, and S as a ring-forming atom, 1 to 10 carbon atoms, and at least one double bond in its ring. Detailed examples of the $C_1$-$C_{10}$ heterocycloalkenyl group include a 2,3-hydrofuranyl group and a 2,3-hydrothiophenyl group. The term "$C_1$-$C_{10}$ heterocycloalkenylene group" used herein refers to a divalent group having the same structure as the $C_1$-$C_{10}$ heterocycloalkenyl group.

The term "$C_6$-$C_{40}$ aryl group" used herein refers to a monovalent group having a carbocyclic aromatic system having 6 to 40 carbon atoms. The term "$C_6$-$C_{40}$ arylene group" used herein refers to a divalent group having a carbocyclic aromatic system having 6 to 40 carbon atoms. Detailed examples of the $C_6$-$C_{40}$ aryl group include a phenyl group, a naphthyl group, an anthryl group, a phenanthrenyl group, a pyrenyl group, and a chrysenyl group. When the $C_6$-$C_{40}$ aryl group and the $C_6$-$C_{40}$ arylene group each include two or more rings, the rings may be fused to each other.

The term "$C_1$-$C_{40}$ heteroaryl group" used herein refers to a monovalent group having a carbocyclic aromatic system that has at least one hetero atom selected from N, O, P, and S as a ring-forming atom, and 1 to 40 carbon atoms. The term "$C_1$-$C_{40}$ heteroarylene group" used herein refers to a divalent group having a carbocyclic aromatic system that has at least one hetero atom selected from N, O, P, and S as a ring-forming atom, and 1 to 40 carbon atoms. Examples of the $C_1$-$C_{40}$ heteroaryl group include a pyridyl group, a pyrimidinyl group, a pyrazinyl group, a pyridazinyl group, a triazinyl group, a quinolyl group, and an isoquinolyl group. When the $C_1$-$C_{40}$ heteroaryl group and the $C_1$-$C_{40}$ heteroarylene group each include two or more rings, the rings may be fused to each other.

The term "$C_6$-$C_{40}$ aryloxy group" used herein indicates —$OA_{102}$ (wherein $A_{102}$ is the $C_6$-$C_{40}$ aryl group), and the term "$C_6$-$C_{40}$ arylthio group" indicates —$SA_{103}$ (wherein $A_{103}$ is the $C_6$-$C_{40}$ aryl group).

The term "monovalent non-aromatic condensed polycyclic group" used herein refers to a monovalent group that has two or more rings condensed to each other, only carbon atoms as a ring forming atom, and non-aromaticity in the entire molecular structure. Detailed examples of the monovalent non-aromatic condensed polycyclic group include a fluorenyl group. The term "divalent non-aromatic condensed polycyclic group" used herein refers to a divalent group having the same structure as the monovalent non-aromatic condensed polycyclic group.

The term "monovalent non-aromatic condensed heteropolycyclic group" used herein refers to a monovalent group that has two or more rings condensed to each other, has a heteroatom selected from N, O P, and S, other than carbon atoms, as a ring forming atom, and has non-aromaticity in the entire molecular structure. Detailed examples of the monovalent non-aromatic condensed heteropolycyclic group include a carbazolyl group. The term "divalent non-aromatic condensed heteropolycyclic group" used herein refers to a divalent group having the same structure as the monovalent non-aromatic condensed heteropolycyclic group.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

The following compounds are mentioned in the formation of organic light-emitting device according to Examples and Comparative Examples.

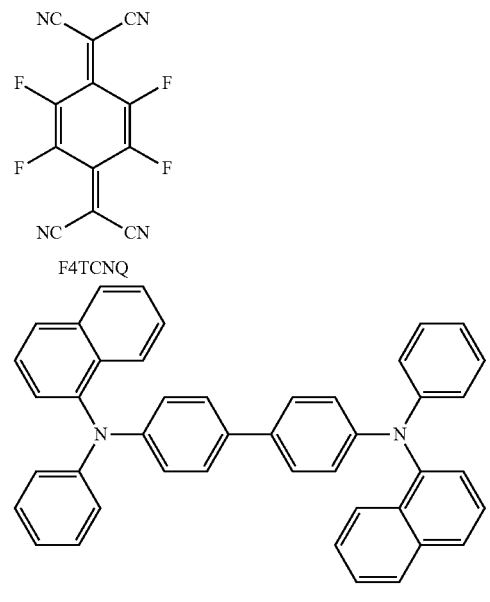

F4TCNQ

NPB

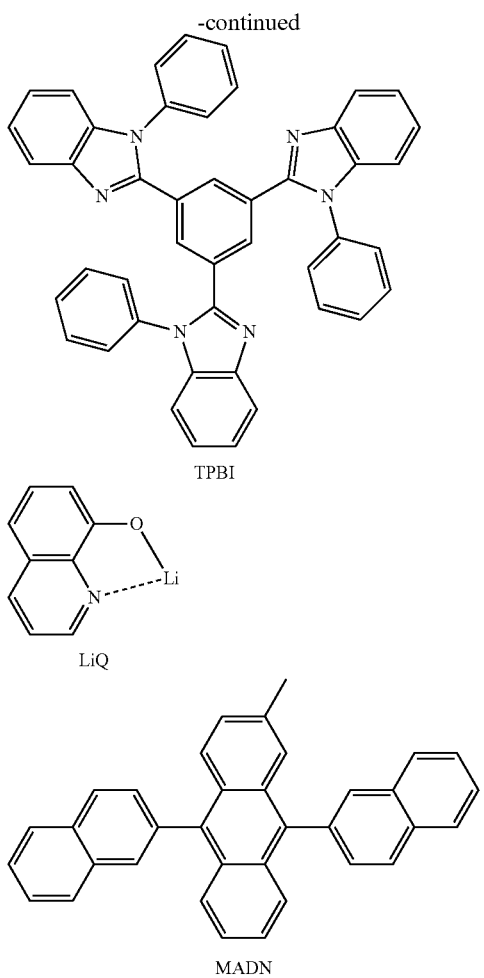

TPBI

LiQ

MADN

Examples 1-1 to 1-14

On an ITO anode (1,200 Å) disposed on a glass substrate, with an Ag lower reflective film thereunder, NPB:F4-TCNQ (1 vol %) was vacuum co-deposited to form a first hole transport layer that was doped with a p-type dopant and had a thickness of 100 Å. NPB was vacuum deposited on the first hole transport layer to form a second hole transport layer having a thickness of 1,200 Å.

MADN, Compound D-1, and one of the hole transport material shown in Table 1 were co-deposited on the second hole transport layer at a volume ratio of 94:3:3 to form an emission layer having a thickness of 250 Å.

TPBi and LiQ were co-deposited on the emission layer at a volume ratio of 50:50 to form an electron transport layer having a thickness of 350 Å. LiQ was deposited on the electron transport layer to form an electron injection layer having a thickness of 15 Å, and Mg:Ag were co-deposited at a volume ratio of 90:10 to form a cathode having a thickness of 100 Å to complete the manufacturing of an organic light-emitting device. Alq$_3$ was vacuum deposited on the cathode to form a capping layer having a thickness of 600 Å.

Comparative Examples 1-1 to 1-3

Organic light-emitting devices were manufactured in the same manner as in Example 1-1 to Example 1-14, except that in forming an emission layer, MADN, Compound D-1 and hole transport materials shown in Table 1 were co-deposited at a volume ratio of 94:3:3 (in the case of Comparative Example 1-1, MADN and Compound D-1 were co-deposited at a volume ratio of 94:3).

Examples 2-1 to 2-14

Organic light-emitting devices were manufactured in the same manner as in Example 1-1 to Example 1-14, except that in forming an emission layer, MADN, Compound D-2 and hole transport materials shown in Table 2 were co-deposited at a volume ratio of 94:3:3.

Comparative Examples 2-1 to 2-3

Organic light-emitting devices were manufactured in the same manner as in Example 2-1 to Example 2-14, except that in forming an emission layer, MADN, Compound D-2 and hole transport materials shown in Table 2 were co-deposited at a volume ratio of 94:3:3 (in the case of Comparative Example 2-1, MADN and Compound D-2 were co-deposited at a volume ratio of 94:3).

Examples 3-1 to 3-14

Organic light-emitting devices were manufactured in the same manner as in Example 1-1 to Example 1-14, except that in forming an emission layer, MADN, Compound D-3 and hole transport materials shown in Table 3 were co-deposited at a volume ratio of 94:3:3.

Comparative Examples 3-1 to 3-3

Organic light-emitting devices were manufactured in the same manner as in Example 3-1 to Example 3-14, except that in forming an emission layer, MADN, Compound D-3 and hole transport materials shown in Table 3 were co-deposited at a volume ratio of 94:3:3 (in the case of Comparative Example 3-1, MADN and Compound D-3 were co-deposited at a volume ratio of 94:3).

Examples 4-1 to 4-14

Organic light-emitting devices were manufactured in the same manner as in Example 1-1 to Example 1-14, except that in forming an emission layer, MADN, Compound D-4 and hole transport materials shown in Table 3 were co-deposited at a volume ratio of 94:3:3.

Comparative Examples 4-1 to 4-3

Organic light-emitting devices were manufactured in the same manner as in Example 4-1 to Example 4-14, except that in forming an emission layer, MADN, Compound D-4 and hole transport materials shown in Table 3 were co-deposited at a volume ratio of 94:3:3 (in the case of Comparative Example 4-1, MADN and Compound D-4 were co-deposited at a volume ratio of 94:3).

Examples 5-1 to 5-14

Organic light-emitting devices were manufactured in the same manner as in Example 1-1 to Example 1-14, except that in forming an emission layer, MADN, Compound D-5 and hole transport materials shown in Table 3 were co-deposited at a volume ratio of 94:3:3.

Comparative Examples 5-1 to 5-3

Organic light-emitting devices were manufactured in the same manner as in Example 5-1 to Example 5-14, except that in forming an emission layer, MADN, Compound D-5 and hole transport materials shown in Table 3 were co-deposited at a volume ratio of 94:3:3 (in the case of Comparative Example 5-1, MADN and Compound D-5 were co-deposited at a volume ratio of 94:3).

Examples 6-1 to 6-14

Organic light-emitting devices were manufactured in the same manner as in Example 1-1 to Example 1-14, except that in forming an emission layer, MADN, Compound D-6 and hole transport materials shown in Table 3 were co-deposited at a volume ratio of 94:3:3.

Comparative Examples 6-1 to 6-3

Organic light-emitting devices were manufactured in the same manner as in Example 6-1 to Example 6-14, except that in forming an emission layer, MADN, Compound D-6 and hole transport materials shown in Table 3 were co-deposited at a volume ratio of 94:3:3 (in the case of Comparative Example 6-1, MADN and Compound D-6 were co-deposited at a volume ratio of 94:3).

Measurement Data

The driving voltage, current efficiency, and lifespan ($T_{97}$) of the organic light-emitting devices of Examples 1-1 to 1-14, 2-1 to 2-14, 3-1 to 3-14, 4-1 to 4-14, 5-1 to 5-14, and 6-1 to 6-14, and Comparative Examples 1-1 to 1-3, 2-1 to 2-3, 3-1 to 3-3, 4-1 to 4-3, 5-1 to 5-3, and 6-1 to 6-3 were measured by using an IVL measurement device (PhotoResearch PR650, Keithley 238), and results thereof are shown in Tables 1 to 6 below. $T_{97}$ indicates the amount of time that elapsed until luminance was reduced to 97% of the initial luminance (100%) of a device when the device was driven at room temperature at 800 nit.

TABLE 1

| | Dopant | Host | Hole transport material | Driving voltage (V) | Current efficiency (cd/A) | Lifespan [h] |
|---|---|---|---|---|---|---|
| Example 1-1 | D-1 | MADN | HT-1 | 5.0 | 4.2 | 70 |
| Example 1-2 | D-1 | MADN | HT-2 | 4.9 | 4.3 | 75 |
| Example 1-3 | D-1 | MADN | HT-3 | 4.9 | 4.2 | 75 |
| Example 1-4 | D-1 | MADN | HT-4 | 5.0 | 4.2 | 65 |
| Example 1-5 | D-1 | MADN | HT-5 | 4.8 | 4.3 | 80 |
| Example 1-6 | D-1 | MADN | HT-6 | 4.9 | 4.3 | 75 |
| Example 1-7 | D-1 | MADN | HT-7 | 5.1 | 4.2 | 65 |
| Example 1-8 | D-1 | MADN | HT-8 | 4.9 | 4.2 | 70 |
| Example 1-9 | D-1 | MADN | HT-9 | 4.9 | 4.2 | 70 |
| Example 1-10 | D-1 | MADN | HT-10 | 4.9 | 4.2 | 75 |
| Example 1-11 | D-1 | MADN | HT-11 | 5.0 | 4.3 | 60 |
| Example 1-12 | D-1 | MADN | HT-12 | 4.8 | 4.4 | 80 |
| Example 1-13 | D-1 | MADN | HT-13 | 5.0 | 4.2 | 75 |
| Example 1-14 | D-1 | MADN | HT-14 | 5.1 | 4.2 | 70 |
| Comparative Example 1-1 | D-1 | MADN | — | 5.0 | 4.2 | 50 |
| Comparative Example 1-2 | D-1 | MADN | m-MTDATA | 5.3 | 3.8 | 55 |
| Comparative Example 1-3 | D-1 | MADN | NPB | 5.1 | 3.9 | 50 |

TABLE 2

| | Dopant | Host | Hole transport material | Driving voltage (V) | Current efficiency (cd/A) | Lifespan [h] |
|---|---|---|---|---|---|---|
| Example 2-1 | D-2 | MADN | HT-1 | 4.6 | 4.8 | 105 |
| Example 2-2 | D-2 | MADN | HT-2 | 4.5 | 4.9 | 110 |
| Example 2-3 | D-2 | MADN | HT-3 | 4.6 | 4.8 | 115 |
| Example 2-4 | D-2 | MADN | HT-4 | 4.7 | 4.8 | 100 |
| Example 2-5 | D-2 | MADN | HT-5 | 4.4 | 4.8 | 120 |
| Example 2-6 | D-2 | MADN | HT-6 | 4.5 | 4.9 | 110 |
| Example 2-7 | D-2 | MADN | HT-7 | 4.6 | 4.8 | 100 |
| Example 2-8 | D-2 | MADN | HT-8 | 4.6 | 4.8 | 105 |
| Example 2-9 | D-2 | MADN | HT-9 | 4.5 | 4.8 | 105 |
| Example 2-10 | D-2 | MADN | HT-10 | 4.6 | 4.8 | 110 |
| Example 2-11 | D-2 | MADN | HT-11 | 4.6 | 4.9 | 90 |
| Example 2-12 | D-2 | MADN | HT-12 | 4.5 | 5.0 | 115 |
| Example 2-13 | D-2 | MADN | HT-13 | 4.6 | 4.8 | 105 |
| Example 2-14 | D-2 | MADN | HT-14 | 4.5 | 4.8 | 105 |
| Comparative Example 2-1 | D-2 | MADN | — | 4.6 | 4.8 | 75 |
| Comparative Example 2-2 | D-2 | MADN | m-MTDATA | 4.8 | 4.3 | 70 |
| Comparative Example 2-3 | D-2 | MADN | NPB | 4.7 | 4.4 | 75 |

TABLE 3

| | Dopant | Host | Hole transport material | Driving voltage (V) | Current efficiency (cd/A) | Lifespan [h] |
|---|---|---|---|---|---|---|
| Example 3-1 | D-3 | MADN | HT-1 | 5.1 | 4.3 | 85 |
| Example 3-2 | D-3 | MADN | HT-2 | 5.0 | 4.4 | 90 |
| Example 3-3 | D-3 | MADN | HT-3 | 5.1 | 4.3 | 90 |
| Example 3-4 | D-3 | MADN | HT-4 | 5.1 | 4.2 | 80 |
| Example 3-5 | D-3 | MADN | HT-5 | 4.9 | 4.2 | 95 |
| Example 3-6 | D-3 | MADN | HT-6 | 5.1 | 4.4 | 90 |
| Example 3-7 | D-3 | MADN | HT-7 | 5.1 | 4.3 | 75 |
| Example 3-8 | D-3 | MADN | HT-8 | 5.1 | 4.4 | 95 |
| Example 3-9 | D-3 | MADN | HT-9 | 4.9 | 4.3 | 85 |
| Example 3-10 | D-3 | MADN | HT-10 | 5.0 | 4.2 | 85 |
| Example 3-11 | D-3 | MADN | HT-11 | 5.1 | 4.4 | 80 |
| Example 3-12 | D-3 | MADN | HT-12 | 5.2 | 4.3 | 95 |
| Example 3-13 | D-3 | MADN | HT-13 | 5.1 | 4.2 | 90 |
| Example 3-14 | D-3 | MADN | HT-14 | 5.1 | 4.3 | 85 |
| Comparative Example 3-1 | D-3 | MADN | — | 5.1 | 4.3 | 60 |
| Comparative Example 3-2 | D-3 | MADN | m-MTDATA | 5.4 | 4.0 | 60 |
| Comparative Example 3-3 | D-3 | MADN | NPB | 5.3 | 4.1 | 65 |

TABLE 4

| | Dopant | Host | Hole transport material | Driving voltage (V) | Current efficiency (cd/A) | Lifespan [h] |
|---|---|---|---|---|---|---|
| Example 4-1 | D-4 | MADN | HT-1 | 4.9 | 4.6 | 85 |
| Example 4-2 | D-4 | MADN | HT-2 | 4.8 | 4.7 | 90 |
| Example 4-3 | D-4 | MADN | HT-3 | 4.9 | 4.6 | 95 |
| Example 4-4 | D-4 | MADN | HT-4 | 4.9 | 4.5 | 85 |
| Example 4-5 | D-4 | MADN | HT-5 | 4.7 | 4.5 | 100 |
| Example 4-6 | D-4 | MADN | HT-6 | 4.8 | 4.7 | 90 |
| Example 4-7 | D-4 | MADN | HT-7 | 4.9 | 4.6 | 95 |
| Example 4-8 | D-4 | MADN | HT-8 | 4.8 | 4.6 | 90 |
| Example 4-9 | D-4 | MADN | HT-9 | 4.7 | 4.6 | 85 |
| Example 4-10 | D-4 | MADN | HT-10 | 4.8 | 4.5 | 90 |
| Example 4-11 | D-4 | MADN | HT-11 | 4.9 | 4.7 | 80 |
| Example 4-12 | D-4 | MADN | HT-12 | 4.9 | 4.7 | 95 |
| Example 4-13 | D-4 | MADN | HT-13 | 4.9 | 4.5 | 90 |
| Example 4-14 | D-4 | MADN | HT-14 | 4.8 | 4.6 | 95 |

TABLE 4-continued

| | Dopant | Host | Hole transport material | Driving voltage (V) | Current efficiency (cd/A) | Lifespan [h] |
|---|---|---|---|---|---|---|
| Comparative Example 4-1 | D-4 | MADN | — | 4.9 | 4.6 | 70 |
| Comparative Example 4-2 | D-4 | MADN | m-MTDATA | 5.1 | 4.3 | 70 |
| Comparative Example 4-3 | D-4 | MADN | NPB | 5.0 | 4.3 | 65 |

TABLE 5

| | Dopant | Host | Hole transport material | Driving voltage (V) | Current efficiency (cd/A) | Lifespan [h] |
|---|---|---|---|---|---|---|
| Example 5-1 | D-5 | MADN | HT-1 | 5.0 | 4.4 | 80 |
| Example 5-2 | D-5 | MADN | HT-2 | 4.9 | 4.5 | 85 |
| Example 5-3 | D-5 | MADN | HT-3 | 4.9 | 4.4 | 85 |
| Example 5-4 | D-5 | MADN | HT-4 | 5.0 | 4.4 | 75 |
| Example 5-5 | D-5 | MADN | HT-5 | 4.8 | 4.4 | 90 |
| Example 5-6 | D-5 | MADN | HT-6 | 4.9 | 4.5 | 85 |
| Example 5-7 | D-5 | MADN | HT-7 | 5.0 | 4.4 | 80 |
| Example 5-8 | D-5 | MADN | HT-8 | 4.9 | 4.4 | 80 |
| Example 5-9 | D-5 | MADN | HT-9 | 4.8 | 4.4 | 80 |
| Example 5-10 | D-5 | MADN | HT-10 | 4.9 | 4.4 | 85 |
| Example 5-11 | D-5 | MADN | HT-11 | 5.0 | 4.5 | 70 |
| Example 5-12 | D-5 | MADN | HT-12 | 4.9 | 4.6 | 90 |
| Example 5-13 | D-5 | MADN | HT-13 | 5.0 | 4.4 | 85 |
| Example 5-14 | D-5 | MADN | HT-14 | 5.0 | 4.4 | 80 |
| Comparative Example 5-1 | D-5 | MADN | — | 5.0 | 4.4 | 60 |
| Comparative Example 5-2 | D-5 | MADN | m-MTDATA | 5.2 | 4.1 | 65 |
| Comparative Example 5-3 | D-5 | MADN | NPB | 5.1 | 4.1 | 60 |

TABLE 6

| | Dopant | Host | Hole transport material | Driving voltage (V) | Current efficiency (cd/A) | Lifespan [h] |
|---|---|---|---|---|---|---|
| Example 6-1 | D-6 | MADN | HT-1 | 4.9 | 4.6 | 95 |
| Example 6-2 | D-6 | MADN | HT-2 | 4.8 | 4.7 | 100 |
| Example 6-3 | D-6 | MADN | HT-3 | 4.9 | 4.6 | 105 |
| Example 6-4 | D-6 | MADN | HT-4 | 4.9 | 4.5 | 90 |
| Example 6-5 | D-6 | MADN | HT-5 | 4.7 | 4.5 | 110 |
| Example 6-6 | D-6 | MADN | HT-6 | 4.8 | 4.7 | 100 |
| Example 6-7 | D-6 | MADN | HT-7 | 4.9 | 4.6 | 90 |
| Example 6-8 | D-6 | MADN | HT-8 | 4.9 | 4.6 | 100 |
| Example 6-9 | D-6 | MADN | HT-9 | 4.7 | 4.6 | 95 |
| Example 6-10 | D-6 | MADN | HT-10 | 4.8 | 4.5 | 100 |
| Example 6-11 | D-6 | MADN | HT-11 | 4.9 | 4.7 | 85 |
| Example 6-12 | D-6 | MADN | HT-12 | 4.9 | 4.7 | 105 |
| Example 6-13 | D-6 | MADN | HT-13 | 4.9 | 4.5 | 100 |
| Example 6-14 | D-6 | MADN | HT-14 | 4.8 | 4.6 | 95 |
| Comparative Example 6-1 | D-6 | MADN | — | 4.9 | 4.6 | 70 |
| Comparative Example 6-2 | D-6 | MADN | m-MTDATA | 5.1 | 4.2 | 65 |
| Comparative Example 6-3 | D-6 | MADN | NPB | 5.0 | 4.3 | 70 |

Referring to Tables 1 to 6, it can be seen that the organic light-emitting devices according to Examples had higher efficiency and a longer lifespan than the organic light-emitting devices according to Comparative Examples.

When an emission layer includes a host represented by Formula 1-1 or Formula 1-2, a dopant represented by Formula 2, and a carbazole compound represented by Formula 3, an organic light-emitting device including the emission layer may have high efficiency and a long lifespan.

By way of summation and review, embodiments provide an organic light-emitting device having improved efficiency and lifespan characteristics.

Example embodiments have been disclosed herein, and although specific terms are employed, they are used and are to be interpreted in a generic and descriptive sense only and not for purpose of limitation. Accordingly, it will be understood by those of skill in the art that various changes in form and details may be made without departing from the spirit and scope thereof as set forth in the following claims.

What is claimed is:

1. An organic light-emitting device, comprising:
   a first electrode;
   a second electrode facing the first electrode; and
   an organic layer between the first electrode and the second electrode, the organic layer including an emission layer,
   wherein the emission layer includes a first compound represented by Formula 1-1 or Formula 1-2 below, a second compound represented by Formula 2 below, and a third compound represented by Formula 3 below:

<Formula 1-1>

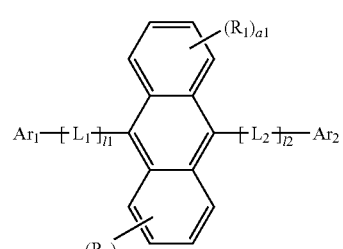

<Formula 1-2>

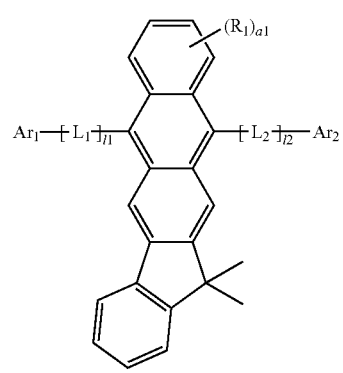

<Formula 2-1>

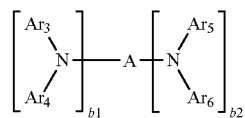

<Formula 3>

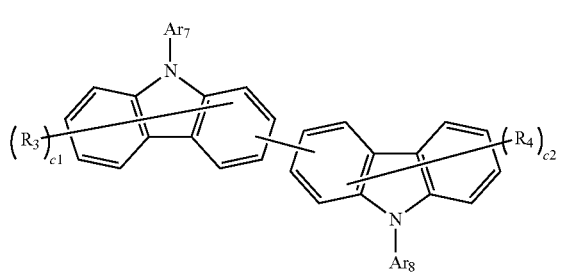

wherein in Formulae 1-1 to 3,
$L_1$ and $L_2$ are each independently a substituted or unsubstituted $C_6$-$C_{40}$ arylene group, A is a substituted or unsubstituted $C_6$-$C_{40}$ arylene group, a substituted or unsubstituted divalent $C_6$-$C_{40}$ non-aromatic hetero condensed polycyclic group, or group made up of a substituted or unsubstituted $C_6$-$C_{40}$ arylene group, or a substituted or unsubstituted divalent $C_6$-$C_{40}$ non-aromatic hetero condensed polycyclic group combined with a styrylene group, $Ar_1$ to $Ar_8$ are each independently a substituted or unsubstituted $C_6$-$C_{40}$ aryl group, $R_1$ to $R_4$ are each independently selected from a deuterium atom, a halogen atom, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a substituted or unsubstituted $C_1$-$C_{20}$ alkyl group, a substituted or unsubstituted $C_2$-$C_{20}$ alkenyl group, a substituted or unsubstituted $C_2$-$C_{20}$ alkynyl group, a substituted or unsubstituted $C_1$-$C_{20}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{40}$ aryl group, a substituted or unsubstituted $C_1$-$C_{40}$ heteroaryl group, a substituted or unsubstituted $C_5$-$C_{40}$ aryloxy group, a substituted or unsubstituted $C_5$-$C_{40}$ arylthio group, a substituted or unsubstituted monovalent $C_6$-$C_{40}$ non-aromatic condensed polycyclic group (non-aromatic condensed polycyclic group), a substituted or unsubstituted monovalent $C_6$-$C_{40}$ non-aromatic hetero condensed polycyclic group (non-aromatic hetero condensed polycyclic group), $-N(Q_1)(Q_2)$, $-P(=O)(Q_3)(Q_4)$, $-Si(Q_5)(Q_6)(Q_7)$, $-Ge(Q_5)(Q_6)(Q_7)$, and $-B(Q_8)(Q_9)$, wherein $Q_1$ to $Q_9$ are each independently a hydrogen atom, a $C_1$-$C_{20}$ alkyl group, or a $C_6$-$C_{40}$ aryl group;

at least one substituent of the substituted $C_1$-$C_{20}$ alkyl group, substituted $C_2$-$C_{20}$ alkenyl group, substituted $C_2$-$C_{20}$ alkynyl group, substituted $C_1$-$C_{20}$ alkoxy group, substituted $C_3$-$C_{10}$ cycloalkyl group, substituted $C_1$-$C_{10}$ heterocycloalkyl group, substituted $C_3$-$C_{10}$ cycloalkenyl group, substituted $C_1$-$C_{10}$ heterocycloalkenyl group, substituted $C_6$-$C_{40}$ aryl group, substituted $C_1$-$C_{40}$ heteroaryl group, substituted $C_5$-$C_{40}$ aryloxy group, substituted $C_5$-$C_{40}$ arylthio group, substituted monovalent $C_6$-$C_{40}$ non-aromatic condensed polycyclic group, substituted monovalent $C_6$-$C_{40}$ non-aromatic hetero condensed polycyclic group, and substituted $C_6$-$C_{40}$ arylene group is selected from:

a deuterium atom, a halogen atom, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_2$-$C_{20}$ alkenyl group, a $C_2$-$C_{20}$ alkynyl group, a $C_1$-$C_{20}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{40}$ aryl group, a $C_1$-$C_{40}$ heteroaryl group, a $C_5$-$C_{40}$ aryloxy group, a $C_5$-$C_{40}$ arylthio group, monovalent $C_6$-$C_{40}$ non-aromatic condensed polycyclic group, monovalent $C_6$-$C_{40}$ non-aromatic hetero condensed polycyclic group, $-N(Q_{11})(Q_{12})$, $-Si(Q_{13})(Q_{14})(Q_{15})$, $-Ge(Q_{13})(Q_{14})(Q_{15})$, and $B(Q_{16})(Q_{17})$, wherein $Q_{11}$ to $Q_{17}$ are each independently selected from a hydrogen atom, a $C_1$-$C_{20}$ alkyl group, and a $C_6$-$C_{40}$ aryl group, a1 and a2 are each independently an integer from 0 to 4;

b1 and b2 are each independently 1 or 2;

c1 and c2 are each independently an integer from 0 to 7; and l1 and l2 are each independently an integer from 0 to 3.

2. The organic light-emitting device as claimed in claim 1, wherein A is selected from the following substituents:

(1) a chrysenylene group, a pyrenylene group, a perylenylene group, a fluorenylene group, and a spiro-fluorenylene group;

(2) a chrysenylene group, a pyrenylene group, a perylenylene group, and a fluorenylene group, each substituted with at least one selected from a deuterium atom, a halogen atom, a hydroxyl group, a cyano group, a nitro group, an amino group, an amidino group, a hydrazine group, a hydrazone group, a styryl group, a carboxylic acid or a salt thereof, a sulfonic acid or a salt thereof, a phosphoric acid or a salt thereof, a $C_1$-$C_{20}$ alkyl group, a $C_2$-$C_{20}$ alkenyl group, a $C_2$-$C_{20}$ alkynyl group, a $C_1$-$C_{20}$ alkoxy group, a $C_6$-$C_{40}$ aryl group, a $C_1$-$C_{40}$ heteroaryl group, a $C_5$-$C_{40}$ aryloxy group, a $C_5$-$C_{40}$ arylthio group, a monovalent $C_6$-$C_{40}$ non-aromatic condensed polycyclic group, a monovalent $C_6$-$C_{40}$ non-aromatic hetero condensed polycyclic group, $-N(Q_{11})(Q_{12})$, $-Si(Q_{13})(Q_{14})(Q_{15})$, $-Ge(Q_{13})(Q_{14})(Q_{15})$, and $-B(Q_{16})(Q_{17})$, wherein $Q_{11}$ to $Q_{17}$ are each independently selected from a hydrogen atom, a $C_1$-$C_{20}$ alkyl group, and a $C_6$-$C_{40}$ aryl group; and (3) a group made up of at least one styryl group combined with at least one substituent of the substituents (1) and (2).

3. The organic light-emitting device as claimed in claim 1, wherein A is represented by any one of Formulae 4A to 4F below:

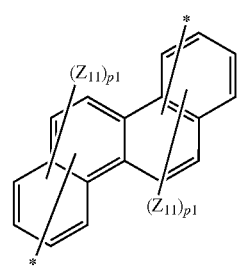

4A

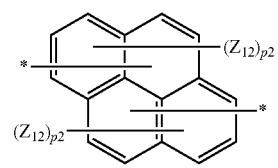

4B

-continued

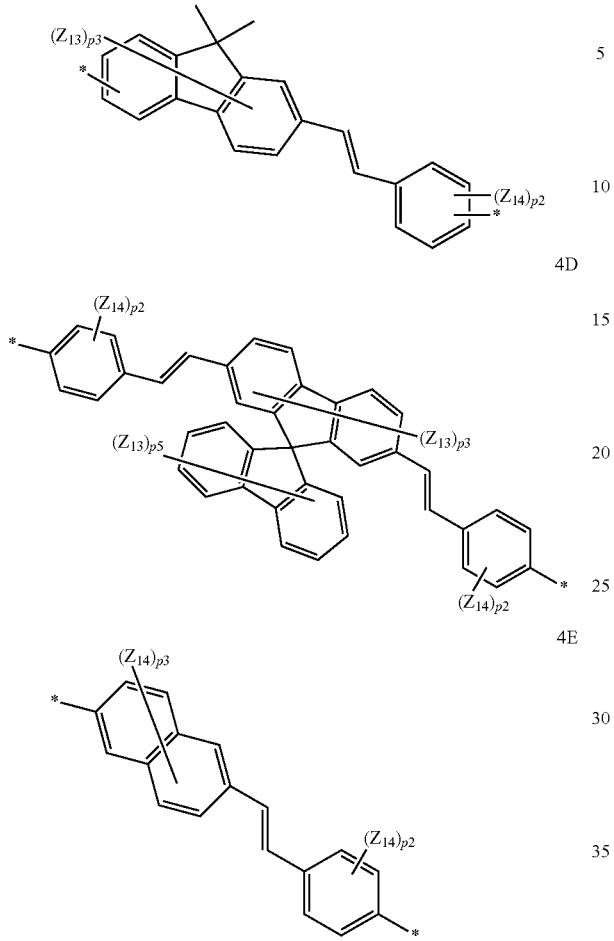

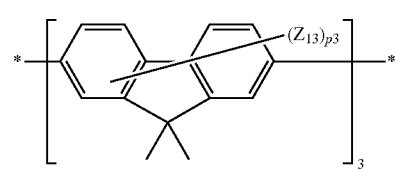

wherein Formulae 4A to 4F,

Z$_{11}$ to Z$_{14}$ are each independently selected from a deuterium atom, a halogen atom, a C$_1$-C$_{20}$ alkyl group, a C$_6$-C$_{40}$ aryl group, a monovalent C$_6$-C$_{40}$ non-aromatic condensed polycyclic group, —Si(Q$_{13}$)(Q$_{14}$)(Q$_{15}$), and —Ge(Q$_{13}$)(Q$_{14}$)(Q$_{15}$), wherein Q$_{13}$ to Q$_{15}$ are each independently selected from a hydrogen atom, a C$_1$-C$_{20}$ alkyl group, and a C$_6$-C$_{40}$ aryl group;

a C$_1$-C$_{20}$ alkyl group, substituted with at least one selected from a deuterium atom and a halogen atom; and a C$_6$-C$_{40}$ aryl group and a monovalent C$_6$-C$_{40}$ non-aromatic condensed polycyclic group, each substituted with at least one selected from a deuterium atom, a halogen atom, a C$_1$-C$_{20}$ alkyl group, and a C$_6$-C$_{20}$ aryl group;

p1 is an integer from 0 to 5;
p2 is an integer from 0 to 4;
p3 is an integer from 0 to 6;
p4 is an integer from 0 to 3;
p5 is an integer from 0 to 8; and
* indicates a binding site to a neighboring atom.

4. The organic light-emitting device as claimed in claim 1, wherein A is represented by any one of Formulae 5A to 5F below:

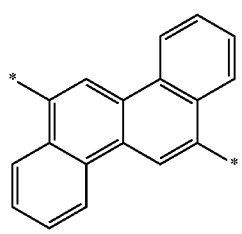

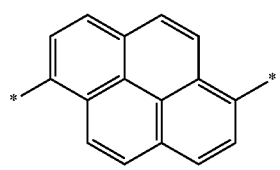

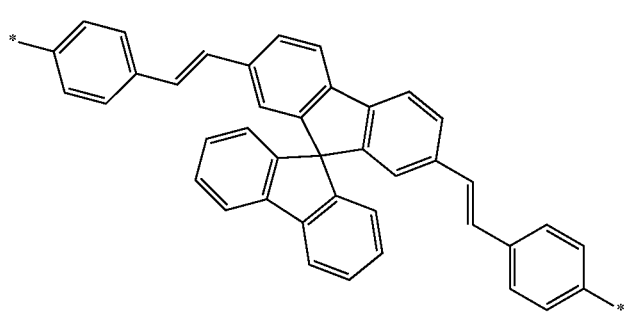

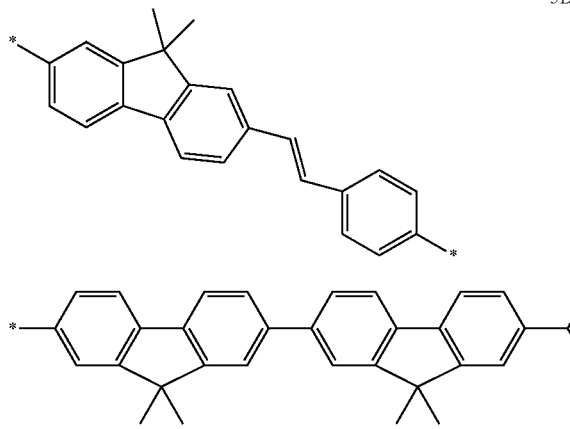

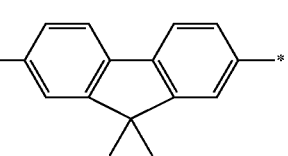

wherein in formulae 5A to 5F, * indicates a binding site to a neighboring atom.

5. The organic light-emitting device as claimed in claim 1, wherein:
$L_1$ and $L_2$ are each independently selected from:
a phenylene group, a naphthylene group, a phenanthrenylene group, and an anthrylene group; and
a phenylene group, a naphthylene group, a phenanthrenylene group and an anthrylene group, each substituted with at least one selected from a deuterium atom, a halogen atom, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{10}$ alkyl group, a $C_1$-$C_{10}$ alkoxy group, a phenyl group, a naphthyl group, a phenanthrenyl group, an anthryl group, and —Si($Q_{13}$)($Q_{14}$)($Q_{15}$), wherein $Q_{13}$ to $Q_{15}$ are each independently selected from a hydrogen atom, a $C_1$-$C_{20}$ alkyl group, and a $C_6$-$C_{40}$ aryl group.

6. The organic light-emitting device as claimed in claim 1, wherein:
$Ar_1$ to $Ar_8$ are each independently selected from:
a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentacenyl group, a hexacenyl group, a rubicenyl group, a coronenyl group, and an ovalenyl group; and
a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, and an ovalenyl group, each substituted with at least one selected from:
a deuterium atom, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, and —Si($Q_{13}$)($Q_{14}$)($Q_{15}$),
wherein $Q_{13}$ to $Q_{15}$ are each independently selected from a hydrogen atom, a $C_1$-$C_{10}$ alkyl group, a $C_1$-$C_{10}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, a quinolinyl group, an isoquinolinyl group, a benzoquinolinyl group, a quinoxalinyl group, a quinazolinyl group, a carbazolyl group, a phenanthrolinyl group, a benzoimidazolyl group, a benzofuranyl group, a benzothiophenyl group, an isobenzothiazolyl group, a benzoxazolyl group, an isobenzoxazolyl group, a triazolyl group, an oxadiazolyl group, a triazinyl group, a dibenzofuranyl group, a dibenzothiophenyl group, a benzocarbazolyl group, a dibenzocarbazolyl group, a dibenzosilolyl group, a thiadiazolyl group, an imidazopyridinyl group, and an imidazopyrimidinyl group.

7. The organic light-emitting device as claimed in claim 1, wherein:
$R_1$ to $R_4$ are each independently selected from:
a deuterium atom, a halogen atom, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a methyl group, an ethyl group, an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a methoxy group, an ethoxy group, a propoxy group, a butoxy group, a pentoxy group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentacenyl group, a hexacenyl group, a rubicenyl group, a coronenyl group, an ovalenyl group; and a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, and an ovalenyl group, each substituted with at least one selected from a deuterium atom, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridyl group, a pyrazinyl group, a pyrimidinyl group, a pyridazinyl group, an isoindolyl group, an indolyl group, an indazolyl group, a purinyl group, a quinolyl group, an isoquinolyl group, benzoa quinolyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzofluorenyl group, a benzimidazolyl group, a benzofuranyl group, a benzothiophenyl group, a benzothiazolyl group, a benzoxazolyl group, an isobenzoxazolyl group, a triazolyl group, a tetrazolyl group, an oxadiazolyl group, a triazinyl group, a dibenzofluorenyl group, a dibenzofuranyl group, a dibenzothiophenyl group, a benzocarbazolyl group, a dibenzocarbazolyl group, a thiadiazolyl group, an imidazopyridyl group, an imidazopyrimidinyl group, —N($Q_{11}$)($Q_{12}$), and —Si($Q_{13}$)($Q_{14}$)($Q_{15}$), wherein $Q_{11}$ to $Q_{15}$ are each independently selected from a hydrogen atom, a $C_1$-$C_{10}$ alkyl group, a $C_1$-$C_{10}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, a quinolinyl group, an isoquinolinyl group, a benzoquinolinyl group, a quinoxalinyl group, a quinazolinyl group, a carbazolyl group, a phenanthrolinyl group, a benzoimidazolyl group, a benzofuranyl group, a benzothiophenyl group, an isobenzothiazolyl group, a benzoxazolyl group, an isobenzoxazolyl group, a triazolyl group, an oxadiazolyl group, a triazinyl group, a dibenzofuranyl group, a dibenzothiophenyl group, a benzocarbazolyl group, a dibenzocarbazolyl group, a dibenzosilolyl group, a thiadiazolyl group, an imidazopyridinyl group, and an imidazopyrimidinyl group.

8. The organic light-emitting device as claimed in claim 1, wherein:

$R_1$ to $R_4$ are each independently selected from:

a $C_1$-$C_{20}$ alkyl group, and a group represented by one of Formulae 6A to Formula 6G:

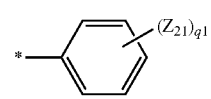

6A

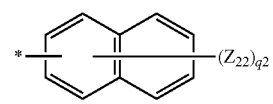

6B

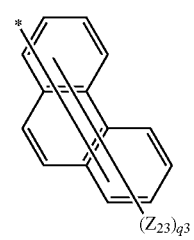

6C

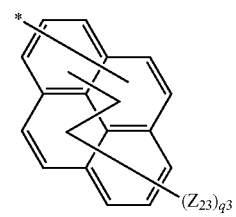

6D

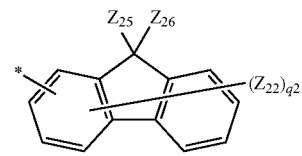

6E

-continued

6F

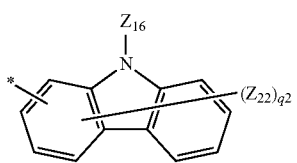

6G

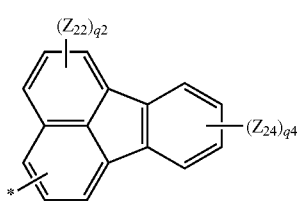

wherein, Formulae 6A to 6G,
$Z_{21}$ to $Z_{26}$ are each independently selected from a deuterium atom, a halogen atom, a $C_1$-$C_{20}$ alkyl group, a $C_6$-$C_{40}$ aryl group, a monovalent $C_6$-$C_{40}$ non-aromatic condensed polycyclic group, —N($Q_{11}$)($Q_{12}$), —Si($Q_{13}$)($Q_{14}$)($Q_{15}$), Ge($Q_{13}$)($Q_{14}$)($Q_{15}$), wherein $Q_{11}$ to $Q_{15}$ are each independently a hydrogen atom, a $C_1$-$C_{20}$ alkyl group, or a $C_6$-$C_{40}$ aryl group;
a $C_1$-$C_{20}$ alkyl group, substituted with at least one selected from a deuterium atom and a halogen atom; and
a $C_6$-$C_{40}$ aryl group and a monovalent $C_6$-$C_{40}$ non-aromatic condensed polycyclic group, each substituted with at least one selected from a deuterium atom, a halogen atom, a $C_1$-$C_{20}$ alkyl group, and a $C_6$-$C_{20}$ aryl group;
q1 is an integer from 0 to 5;
q2 is an integer from 0 to 7;
q3 is an integer from 0 to 9;
q4 is an integer from 0 to 3;
when q2 in Formula 6E is 2 or more, a plurality of $Z_{22}$ are optionally connected to be condensed to the fluorenyl group, thereby forming a condensed ring; and
* indicates a binding site to a neighboring atom.

9. The organic light-emitting device as claimed in claim 1, wherein $R_1$ to $R_4$ are each independently selected from a methyl group, an ethyl group, an n-propyl group, an iso-propyl group, an n-butyl group, an iso-butyl group, a sec-butyl group, a tert-butyl group, and a group represented by one of Formulae 7A to 7L:

7A

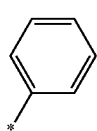

7B

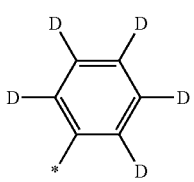

7C

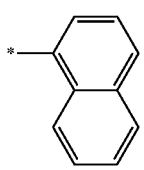

7D

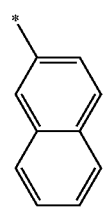

7E

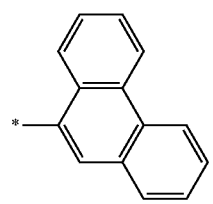

7F

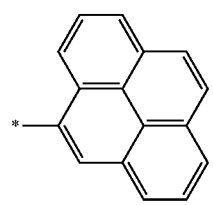

7G

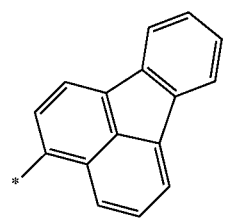

7H

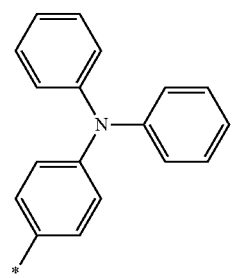

7I

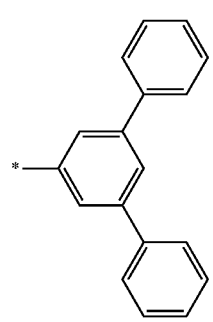

7J

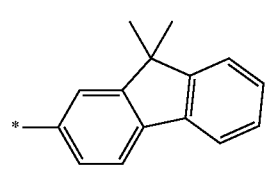

-continued

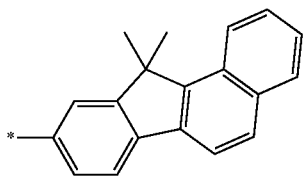
7K

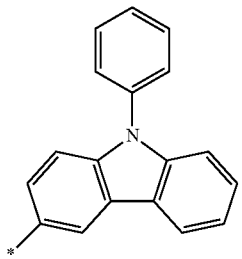
7L wherein in Formulae 7A to 7L, * indicates a binding site to a neighboring atom.

10. The organic light-emitting device as claimed in claim 1, wherein:
L$_1$ and L$_2$ are each independently selected from a phenylene group and a naphthylene group,
Ar$_1$ and Ar$_2$ are each independently selected from a naphthyl group, a phenanthrenyl group, and a pyrenyl group,
R$_1$ and R$_2$ are each independently selected from a phenyl group, a naphthyl group, a fluorenyl group, and a benzofluorenyl group; and a phenyl group, a naphthyl group, a fluorenyl group, and a benzofluorenyl group, each substituted with at least one selected from a deuterium atom, a halogen atom, a phenyl group, and a naphthyl group,
a1 and a2 are each independently 0 or 1, and
l1 and l2 are each independently an integer from 0 to 2.

11. The organic light-emitting device as claimed in claim 1, wherein:
A is selected from a chrysenylene group, a pyrenylene group, a perylenylene group, and a fluorenylene group; and
a chrysenylene group, a pyrenylene group, a perylenylene group, and a fluorenylene group, each substituted with at least one selected from:
a deuterium atom, a halogen atom, a methyl group, an ethyl group, an n-propyl group, an iso-propyl group, an n-butyl group, an iso-butyl group, a sec-butyl group, a tert-butyl group, and a styryl group,
Ar$_3$ to Ar$_6$ are each independently selected from a phenyl group and a naphthyl group; and
a phenyl group and a naphthyl group, each substituted with at least one selected from a deuterium atom, a halogen atom, a methyl group, an n-propyl group, and an iso-propyl group, and
b1 and b2 are each independently 0 or 1.

12. The organic light-emitting device as claimed in claim 1, wherein, when A is a perylenylene group, b1 and b2 are 0.

13. The organic light-emitting device as claimed in claim 1, wherein:
R$_3$ and R$_4$ are each independently selected from:
a phenyl group, a naphthyl group, a fluorenyl group, a carbazolyl group, and a fluoranthenyl group; and a phenyl group, a naphthyl group, a fluorenyl group, a carbazolyl group, and a fluoranthenyl group, each substituted with at least one selected from a methyl group, a phenyl group, a pyridyl group, a pyrimidyl group, and —N(Q$_{11}$)(Q$_{12}$), wherein Q$_{11}$ and Q$_{12}$ are each independently a phenyl group or a naphthyl group,
Ar$_7$ and Ar$_8$ are each independently selected from:
a phenyl group and a fluorenyl group; and
a phenyl group and a fluorenyl group, each substituted with at least one selected from a methyl group and a phenyl group, and
c1 and c2 are each independently 0 or 1.

14. The organic light-emitting device as claimed in claim 1, wherein the first compound is one of Compounds H-1 to H-43 below:

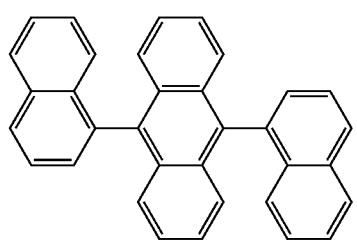
H1

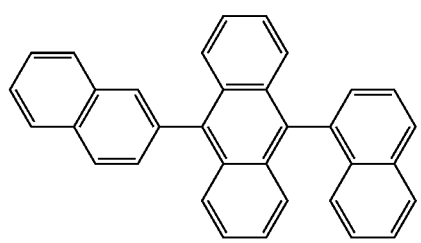
H2

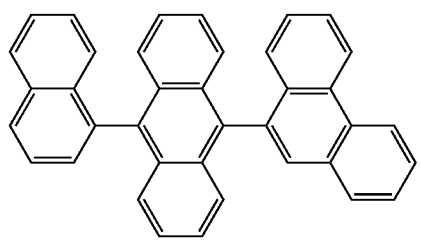
H3

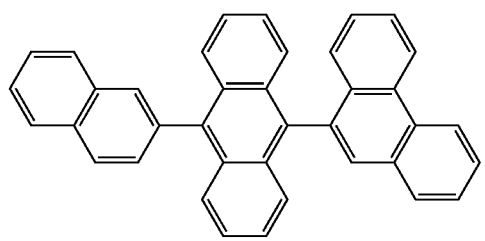
H4

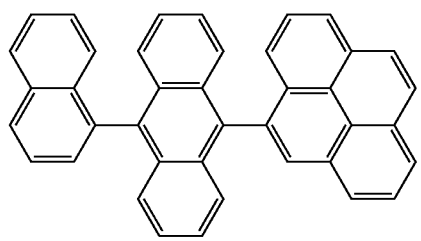
H5

-continued
H6
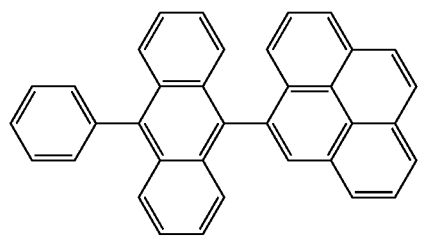
H7
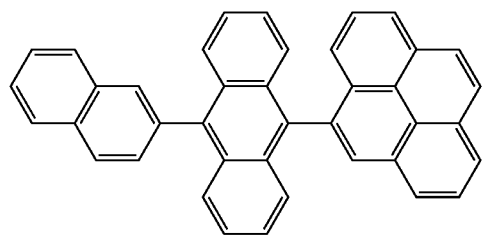
H8
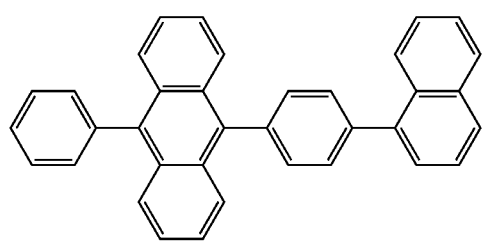
H9
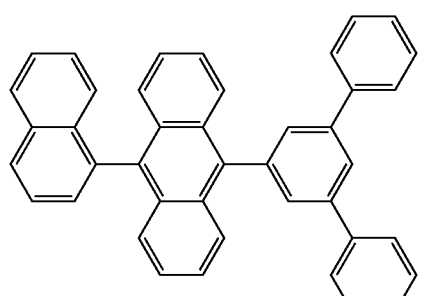
H10
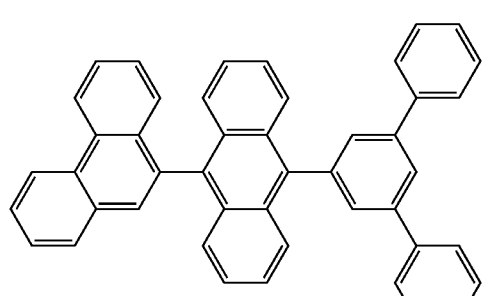
H11
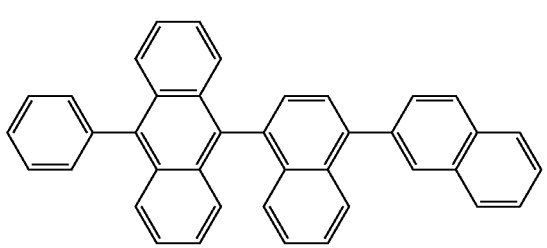
-continued
H12
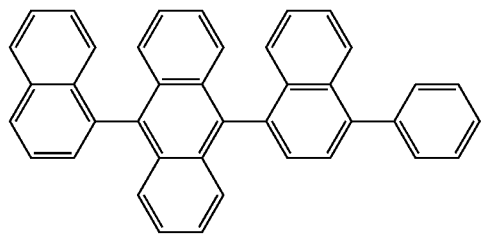
H13
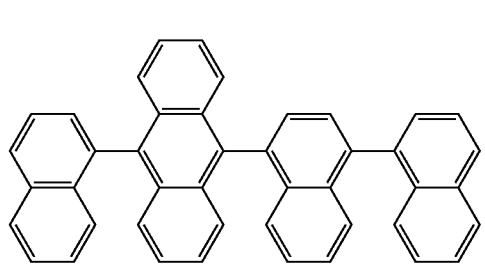
H14
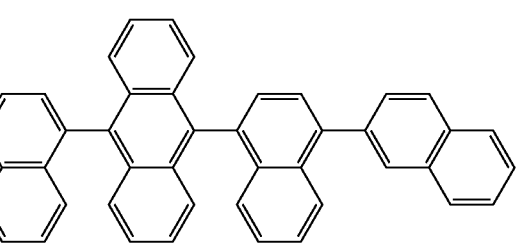
H15
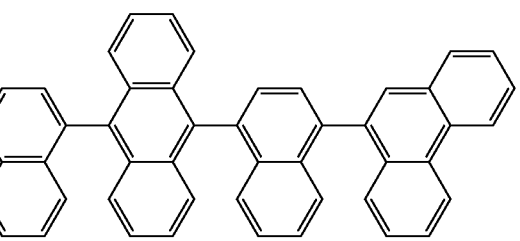
H16
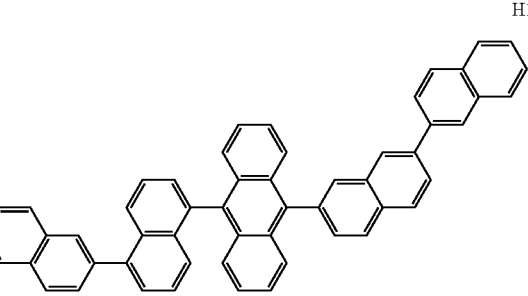

H17

H18

H19

H20

H21

H22

H23

H24

H25

H26
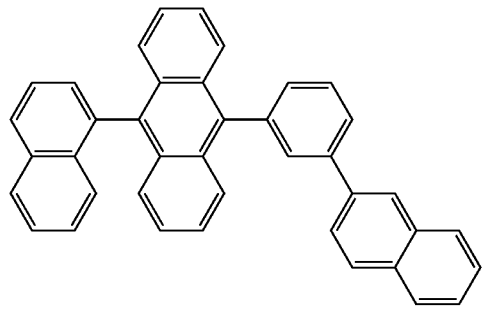
H27
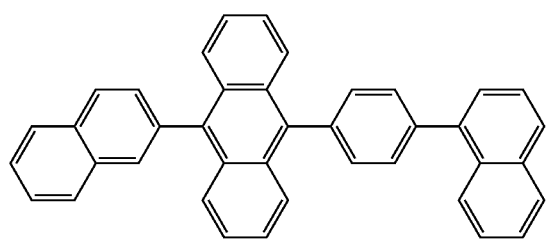
H28
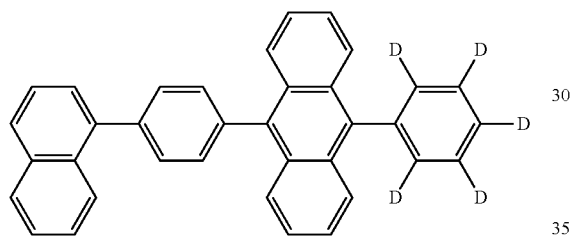
H29
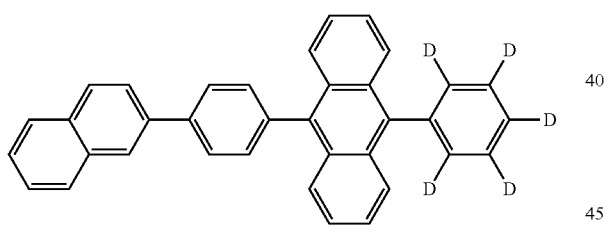
H30
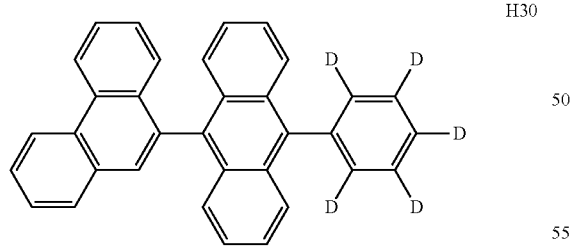
H31
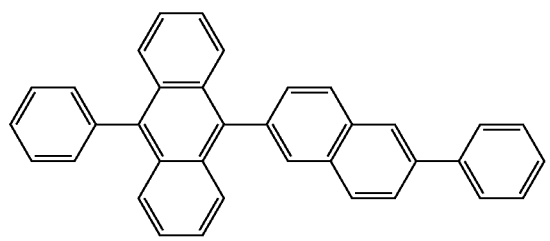
H32
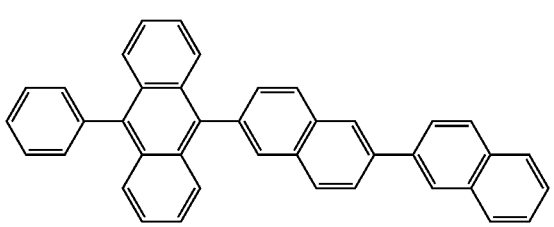
H33
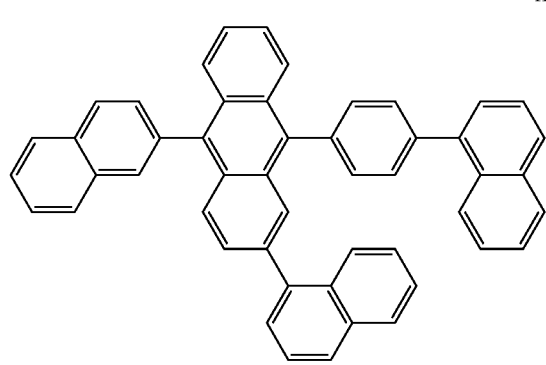
H34
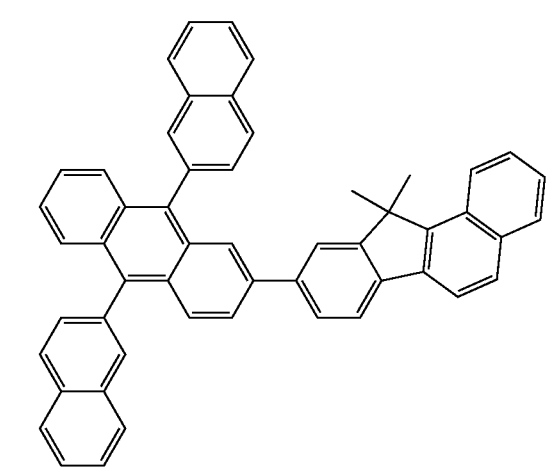
H35
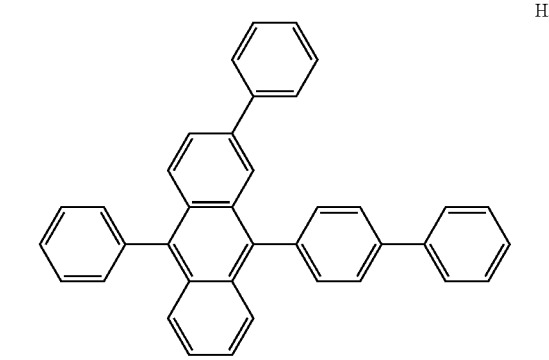

-continued
H36
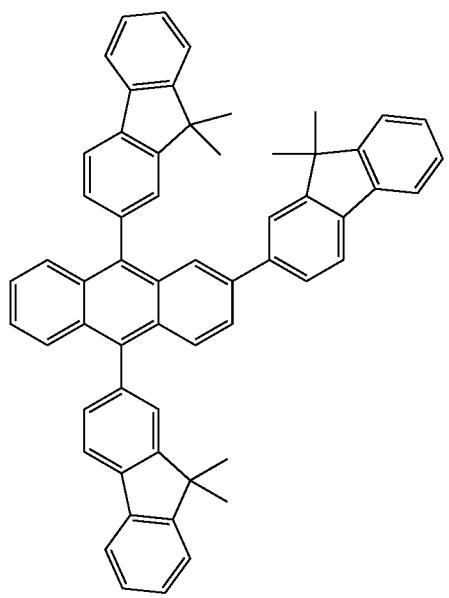
H37
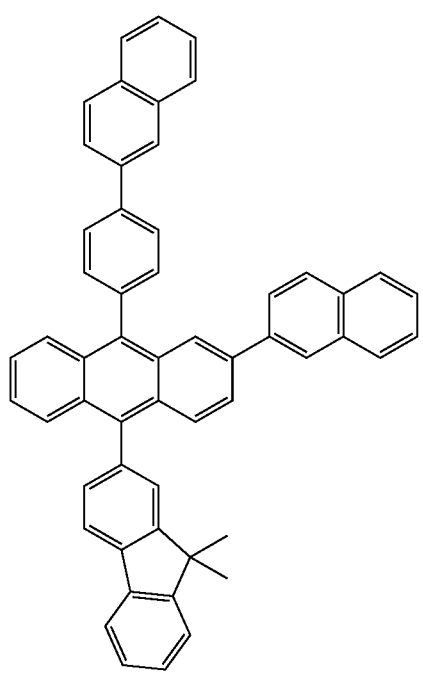
H38
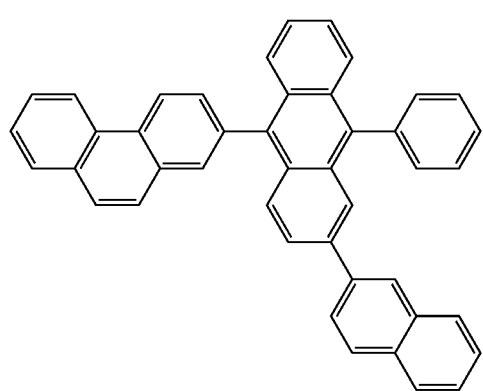
-continued
H39
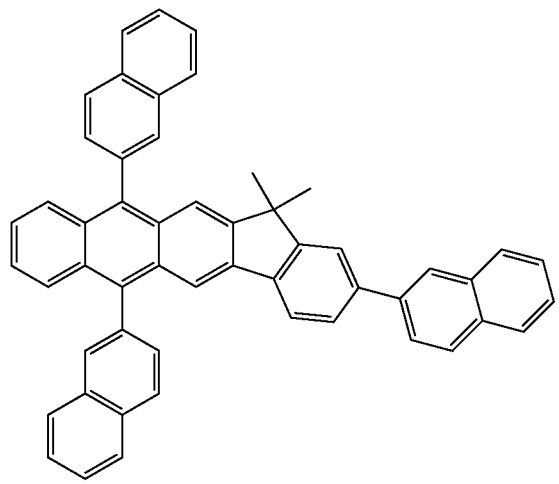
H40
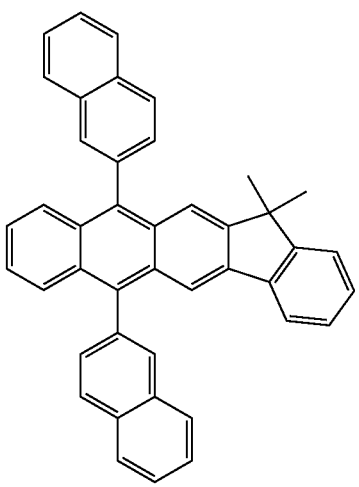
H41
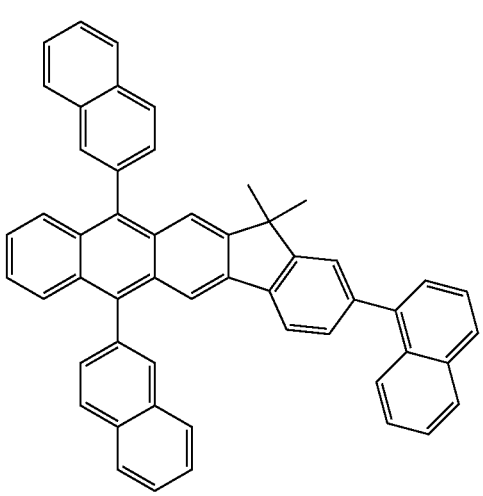

H42
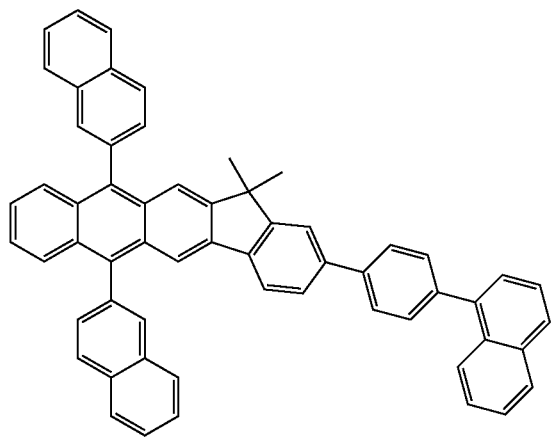
H43
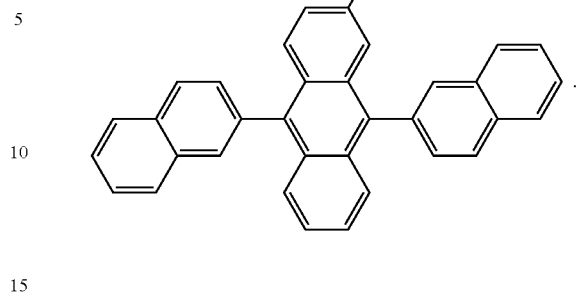
15. The organic light-emitting device as claimed in claim 1, wherein the second compound is one of Compounds D-1 to D-6 below:
D-1
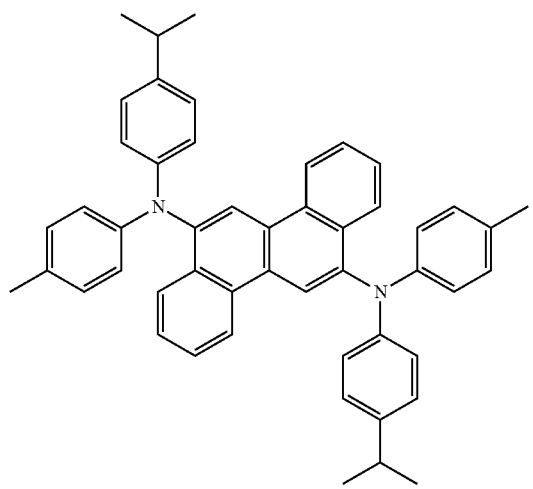
D-2
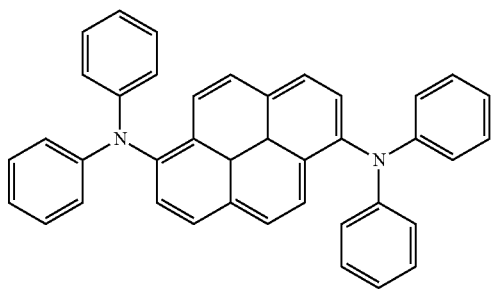
D-3
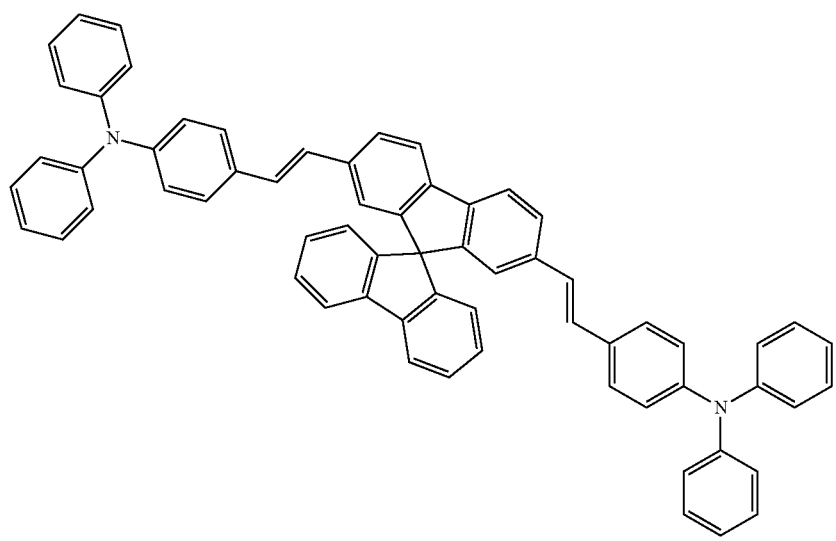

-continued
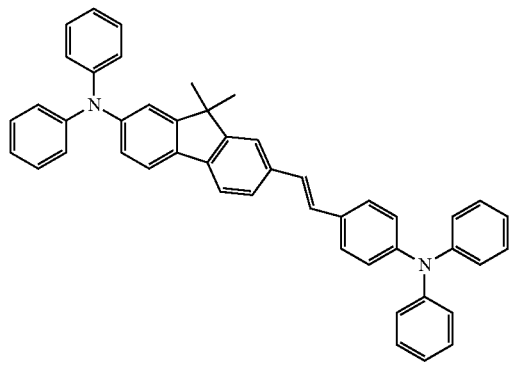
D-4
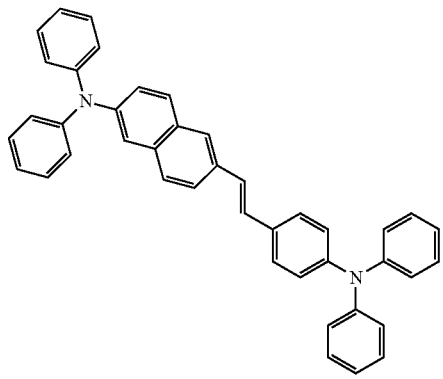
D-5
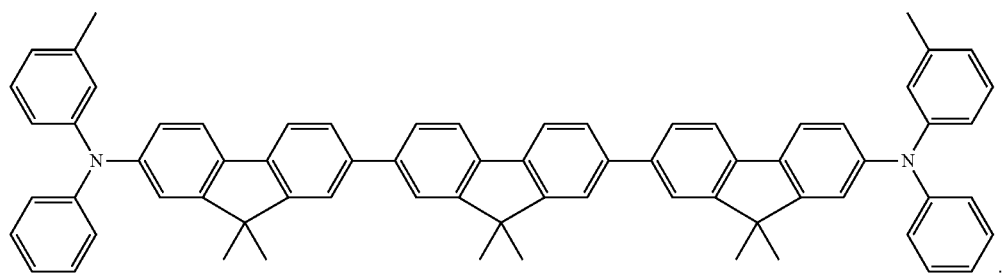
D-6
16. The organic light-emitting device as claimed in claim 1, wherein the third compound is one of Compounds HT-1 to HT-14 below:
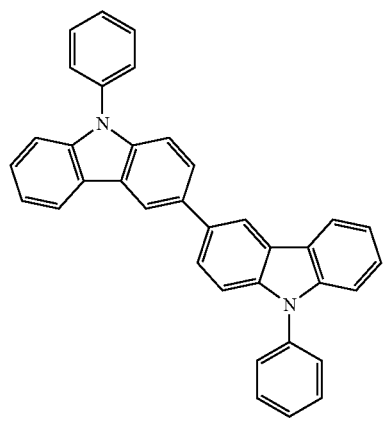
HT-1
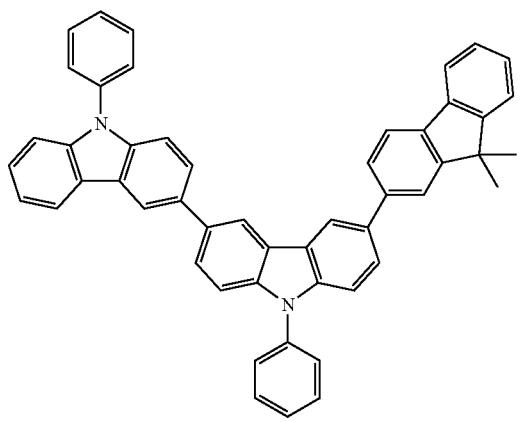
HT-2
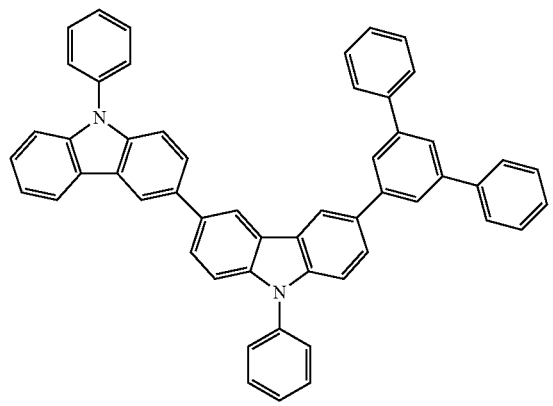
HT-3
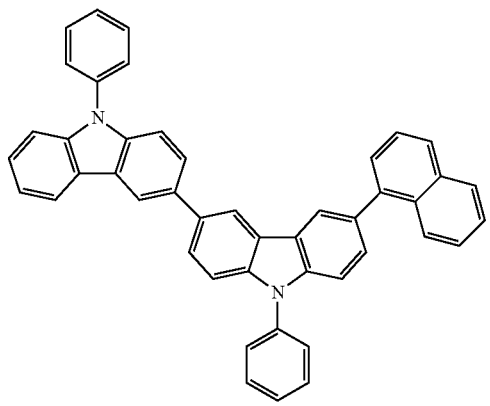
HT-4

-continued
HT-5
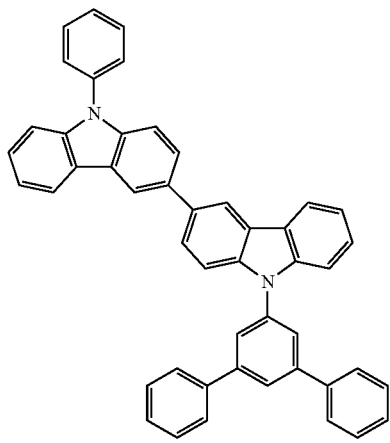
HT-6
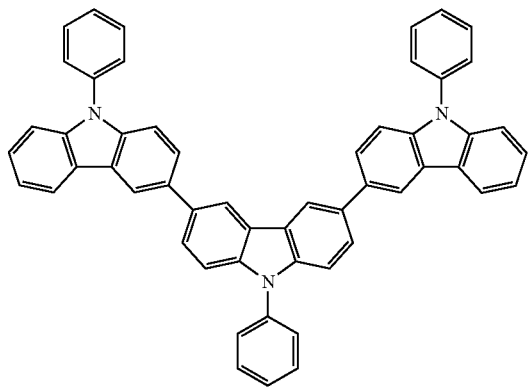
HT-7
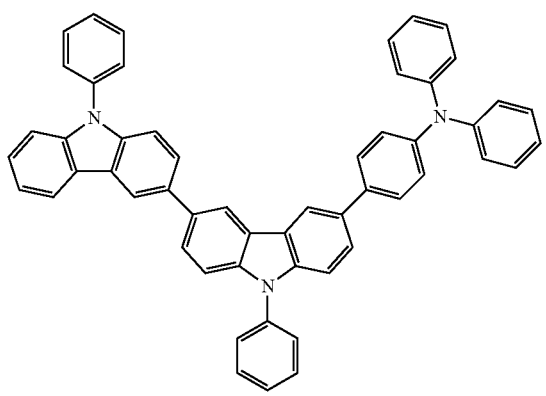
HT-8
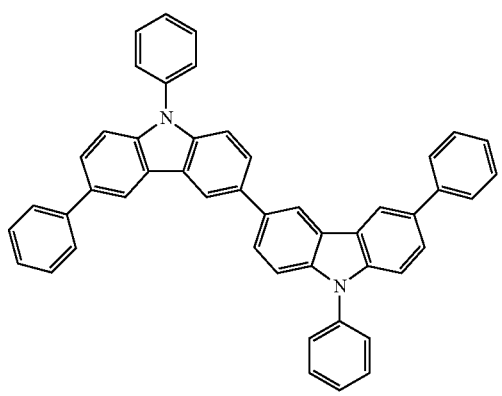
HT-9
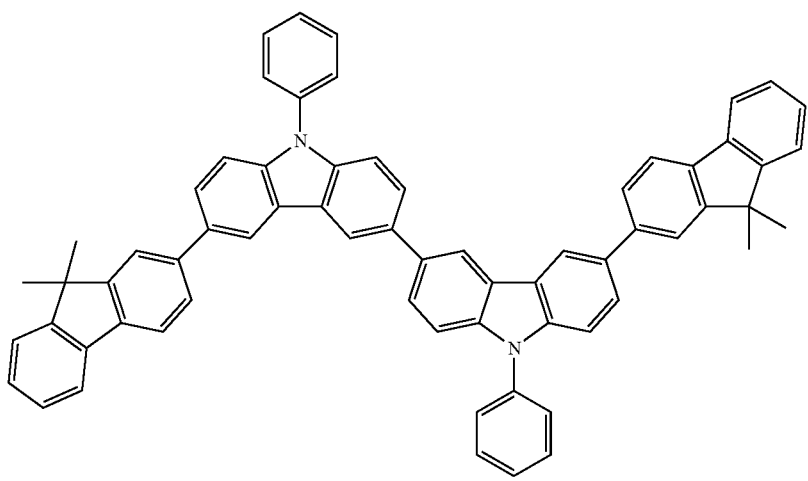

-continued

HT-10
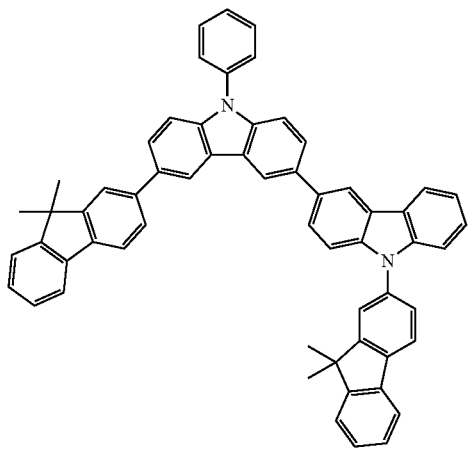

HT-11
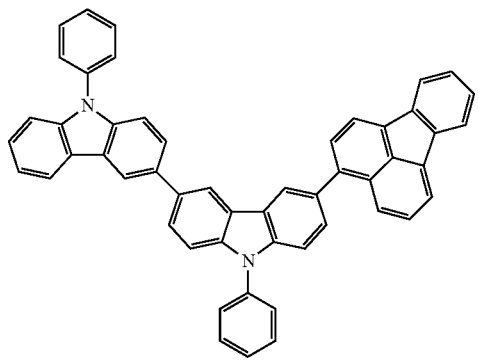

HT-12
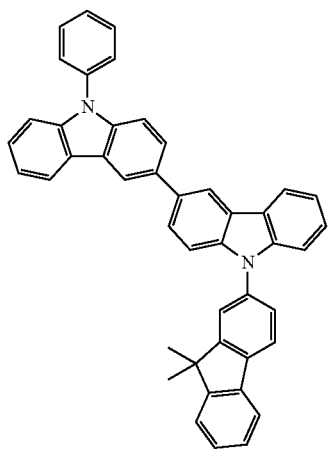

HT-13
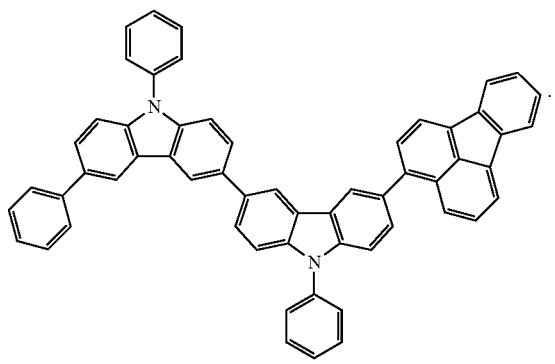

HT-14
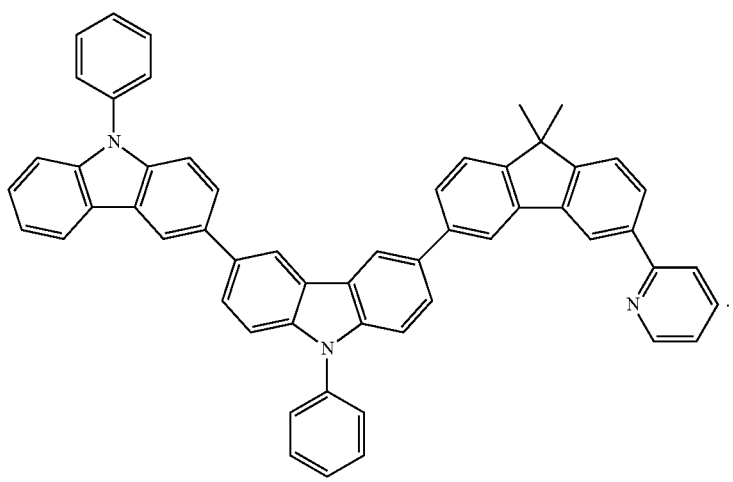

17. The organic light-emitting device as claimed in claim 1, wherein an amount of the second compound is in a range of about 0.01 to about 15 vol % based on a total volume of the emission layer.

18. The organic light-emitting device as claimed in claim 1, wherein an amount of the third compound is in a range of about 0.01 to about 15 vol % based on a total volume of the emission layer.

19. The organic light-emitting device as claimed in claim 1, wherein the emission layer emits blue light.

20. The organic light-emitting device as claimed in claim 1, further comprising an electron transport region between the second electrode and the emission layer.

* * * * *